(12) United States Patent
Shikama et al.

(10) Patent No.: US 9,964,601 B2
(45) Date of Patent: May 8, 2018

(54) MAGNETIC SENSOR

(71) Applicant: ASAHI KASEI MICRODEVICES CORPORATION, Tokyo (JP)

(72) Inventors: Takahisa Shikama, Tokyo (JP); Yoshinobu Fujimoto, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 22 days.

(21) Appl. No.: 15/025,688

(22) PCT Filed: Sep. 29, 2014

(86) PCT No.: PCT/JP2014/004974
§ 371 (c)(1),
(2) Date: Mar. 29, 2016

(87) PCT Pub. No.: WO2015/052891
PCT Pub. Date: Apr. 16, 2015

(65) Prior Publication Data
US 2016/0238670 A1 Aug. 18, 2016

(30) Foreign Application Priority Data

Oct. 8, 2013 (JP) .................................. 2013-211092
Oct. 8, 2013 (JP) .................................. 2013-211093
(Continued)

(51) Int. Cl.
*G01R 33/00* (2006.01)
*H01L 43/08* (2006.01)
(Continued)

(52) U.S. Cl.
CPC ...... *G01R 33/0011* (2013.01); *G01R 33/0206* (2013.01); *G01R 33/09* (2013.01);
(Continued)

(58) Field of Classification Search
CPC .. G01R 1/07314; G01R 3/00; G01R 1/07378; G01R 1/07342; G01R 31/2889
(Continued)

(56) References Cited

U.S. PATENT DOCUMENTS 5,126,667 A * 6/1992 Kataoka ............. G01R 33/0352
324/248
2003/0071616 A1 * 4/2003 Hauenstein ............ G01R 33/06
324/252
(Continued)

FOREIGN PATENT DOCUMENTS

JP 2011-007673 A 1/2011
JP 2012-127788 A 7/2012
(Continued)

OTHER PUBLICATIONS

Marinho, Z., et al. "Three dimensional magnetic flux concentrators with improved efficiency for magnetoresistive sensors." Journal of Applied Physics 109.7 (2011): 07E521.*
(Continued)

*Primary Examiner* — Jermele M Hollington
*Assistant Examiner* — Christopher McAndrew
(74) *Attorney, Agent, or Firm* — Morgan, Lewis & Bockius LLP

(57) ABSTRACT

The magnetic sensor includes a magnetic flux concentrator member having a length in a direction of a second axis, a first magnetic detector arranged on a negative side of a first axis from the magnetic flux concentrator member and on a positive side of the second axis from a midpoint of the magnetic flux concentrator member in a length direction, a second magnetic detector arranged on a positive side of the first axis from the magnetic flux concentrator member and on the positive side of the second axis from the midpoint of the magnetic flux concentrator member in the length direc-
(Continued)

tion, and a third magnetic detector arranged on the negative side of the first axis from the magnetic flux concentrator member and on a negative side of the second axis from the midpoint of the magnetic flux concentrator member in the length direction.

15 Claims, 31 Drawing Sheets

(30) Foreign Application Priority Data

Nov. 11, 2013 (JP) ................................. 2013-233063
Aug. 22, 2014 (JP) ................................. 2014-169216
Aug. 22, 2014 (JP) ................................. 2014-169217

(51) Int. Cl.
*H01L 43/02* (2006.01)
*H01L 27/22* (2006.01)
*G01R 33/09* (2006.01)
*G01R 33/02* (2006.01)

(52) U.S. Cl.
CPC ......... *G01R 33/091* (2013.01); *G01R 33/093* (2013.01); *H01L 27/22* (2013.01); *H01L 43/02* (2013.01); *H01L 43/08* (2013.01)

(58) Field of Classification Search
USPC ....................................................... 324/252
See application file for complete search history.

(56) References Cited

U.S. PATENT DOCUMENTS

| | | | |
|---|---|---|---|
| 2003/0183890 A1* | 10/2003 | Hauenstein | G01R 15/20 257/427 |
| 2004/0095125 A1* | 5/2004 | Jones | G01R 15/185 324/117 R |
| 2004/0137275 A1* | 7/2004 | Jander | B82Y 25/00 428/811.5 |
| 2009/0237074 A1* | 9/2009 | Kou | B82Y 25/00 324/247 |
| 2009/0309590 A1 | 12/2009 | Kataoka et al. | |
| 2011/0074406 A1 | 3/2011 | Mather et al. | |
| 2011/0089978 A1* | 4/2011 | Maes | G01R 19/2509 327/91 |
| 2013/0221949 A1* | 8/2013 | Liu | G01R 33/0011 324/202 |
| 2014/0375311 A1 | 12/2014 | Ishii et al. | |

FOREIGN PATENT DOCUMENTS

| | | |
|---|---|---|
| JP | 2013-506141 A | 2/2013 |
| WO | 2007/119569 A1 | 10/2007 |
| WO | 2013/118498 A1 | 8/2013 |

OTHER PUBLICATIONS

Nagaishi, T., K. Minamimura, and H. Itozaki. "HTS SQUID microscope head with permalloy flux guide." IEEE transactions on applied superconductivity 13.2 (2003): 227-230.*

Daughton, J., et al. "Magnetic field sensors using GMR multilayer." IEEE Transactions on magnetics 30.6 (1994): 4608-4610.*

International Search Report for International application No. PCT/JP2014/004974, dated Dec. 16, 2014.

International Preliminary Report on Patentability dated Apr. 21, 2016, for the corresponding International Application No. PCT/JP2014/004974.

* cited by examiner

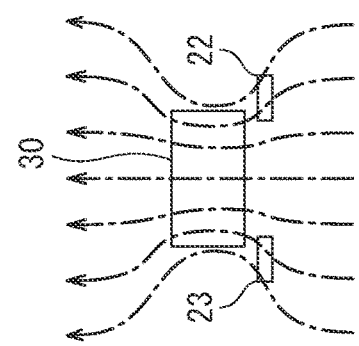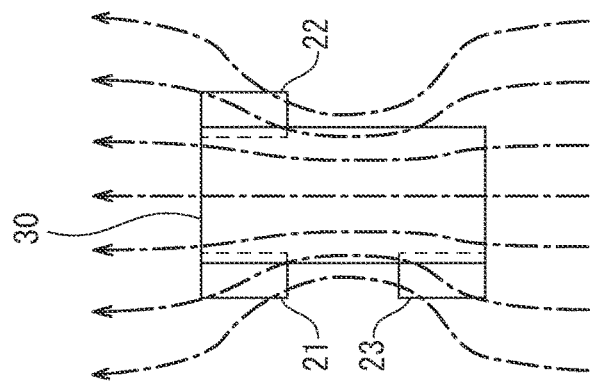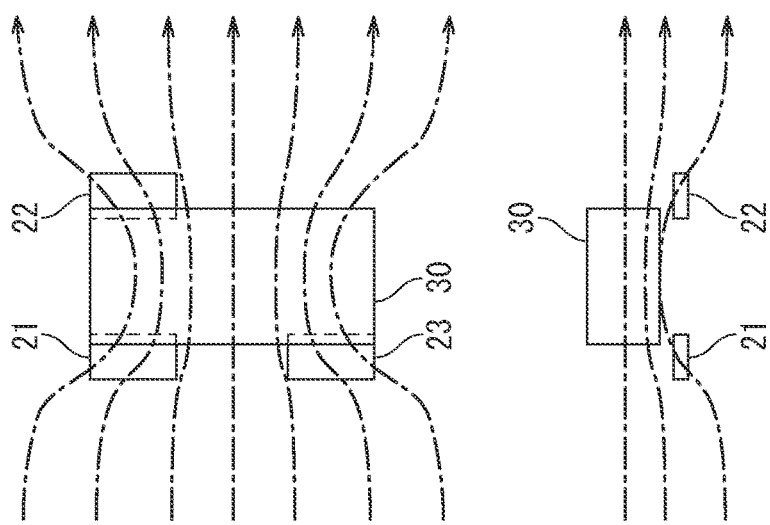

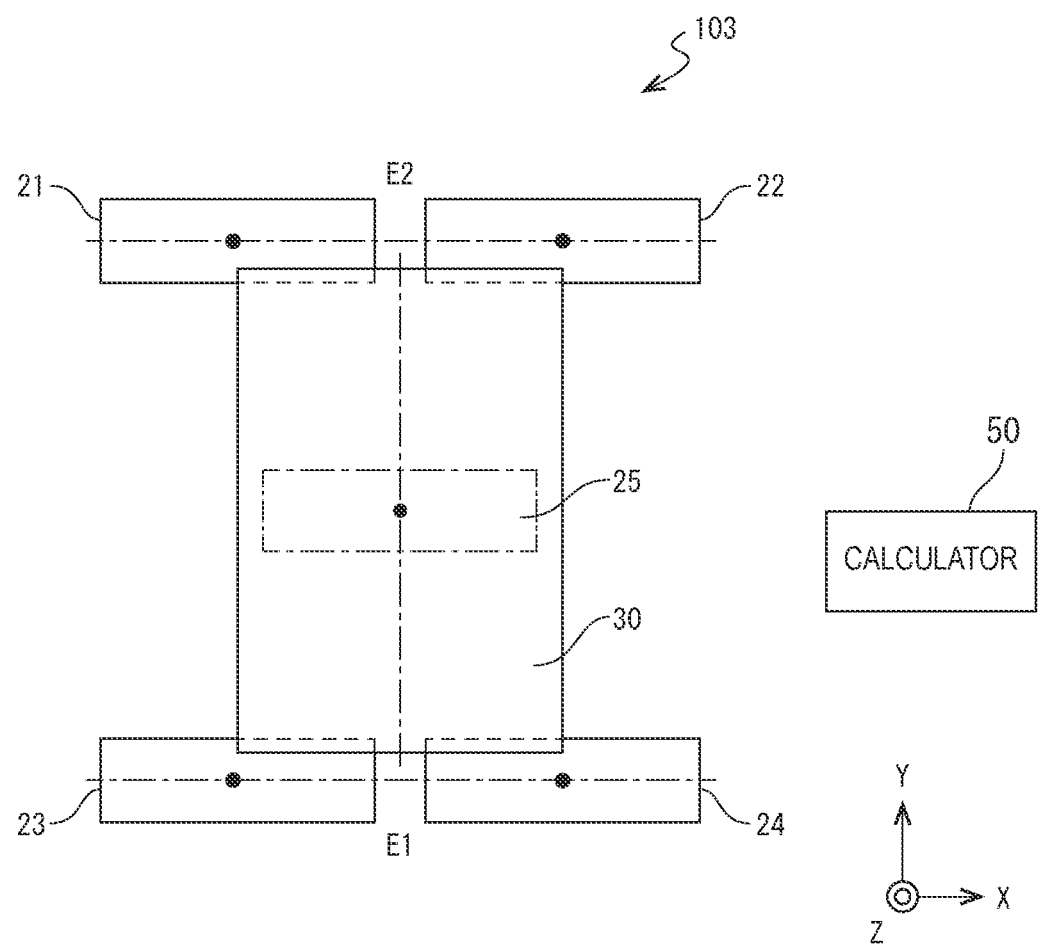

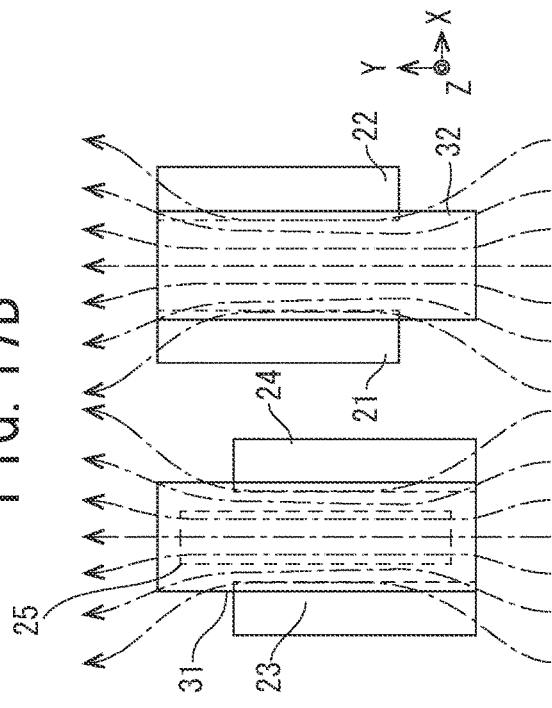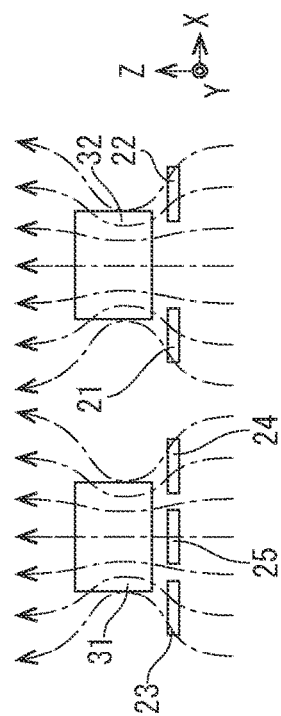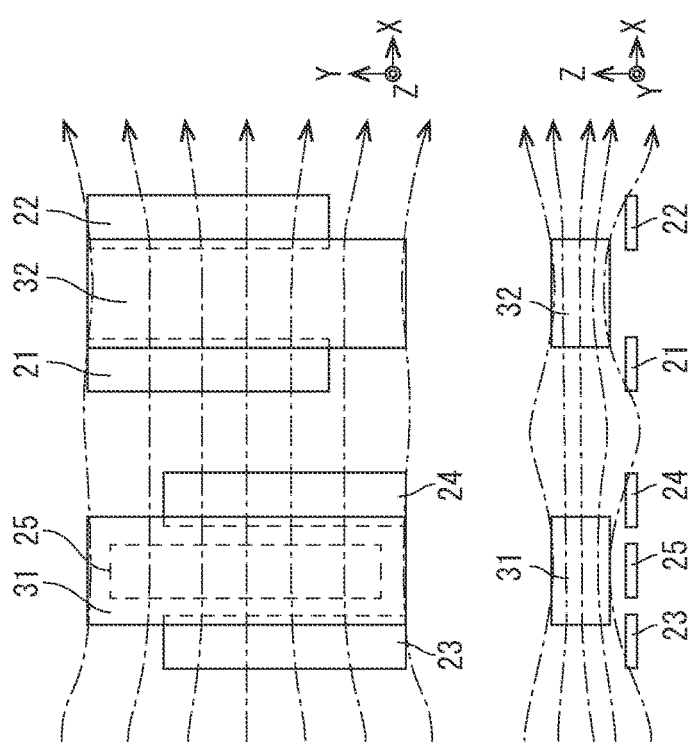

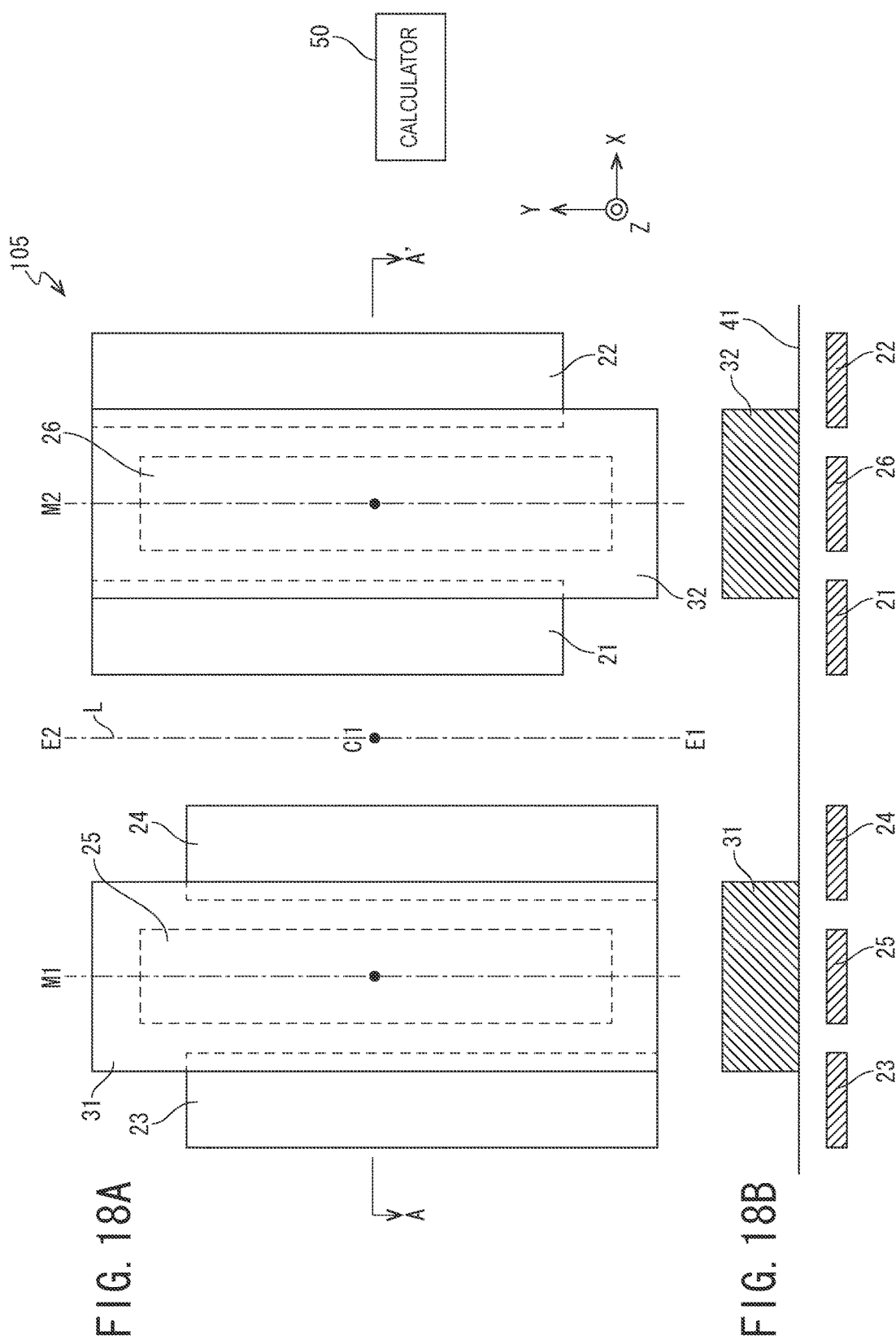

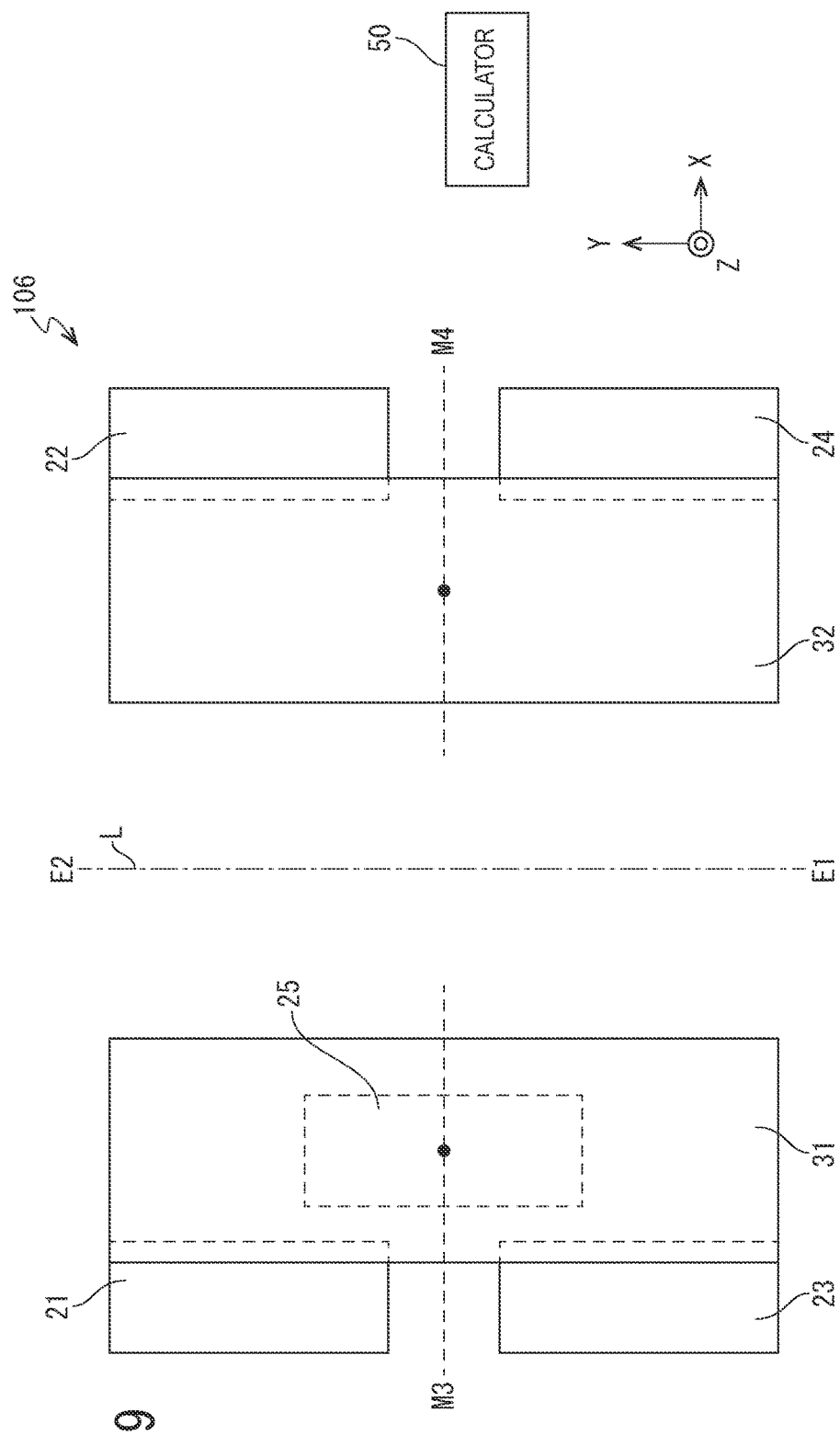

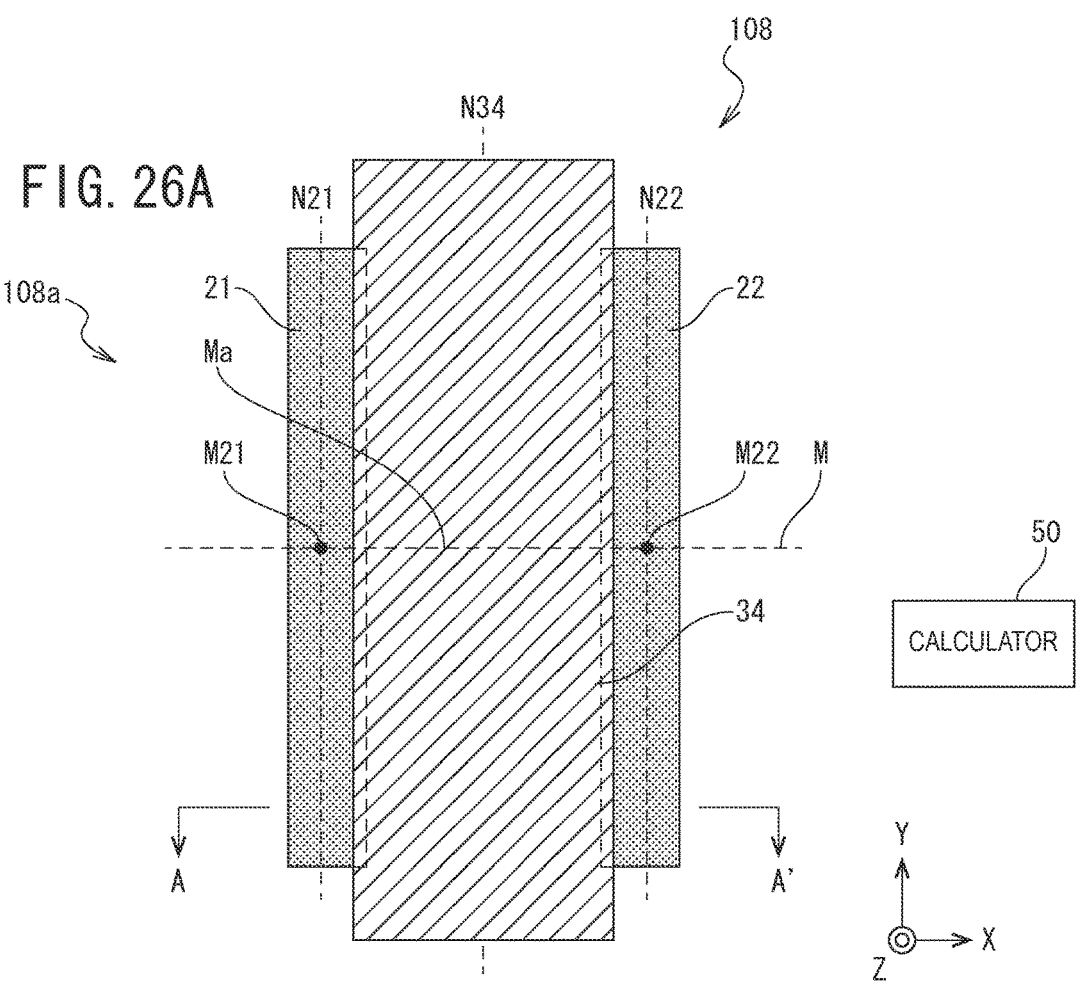
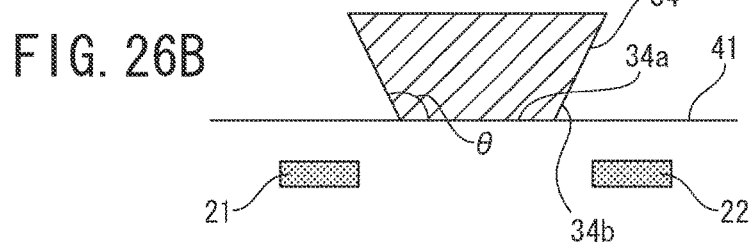

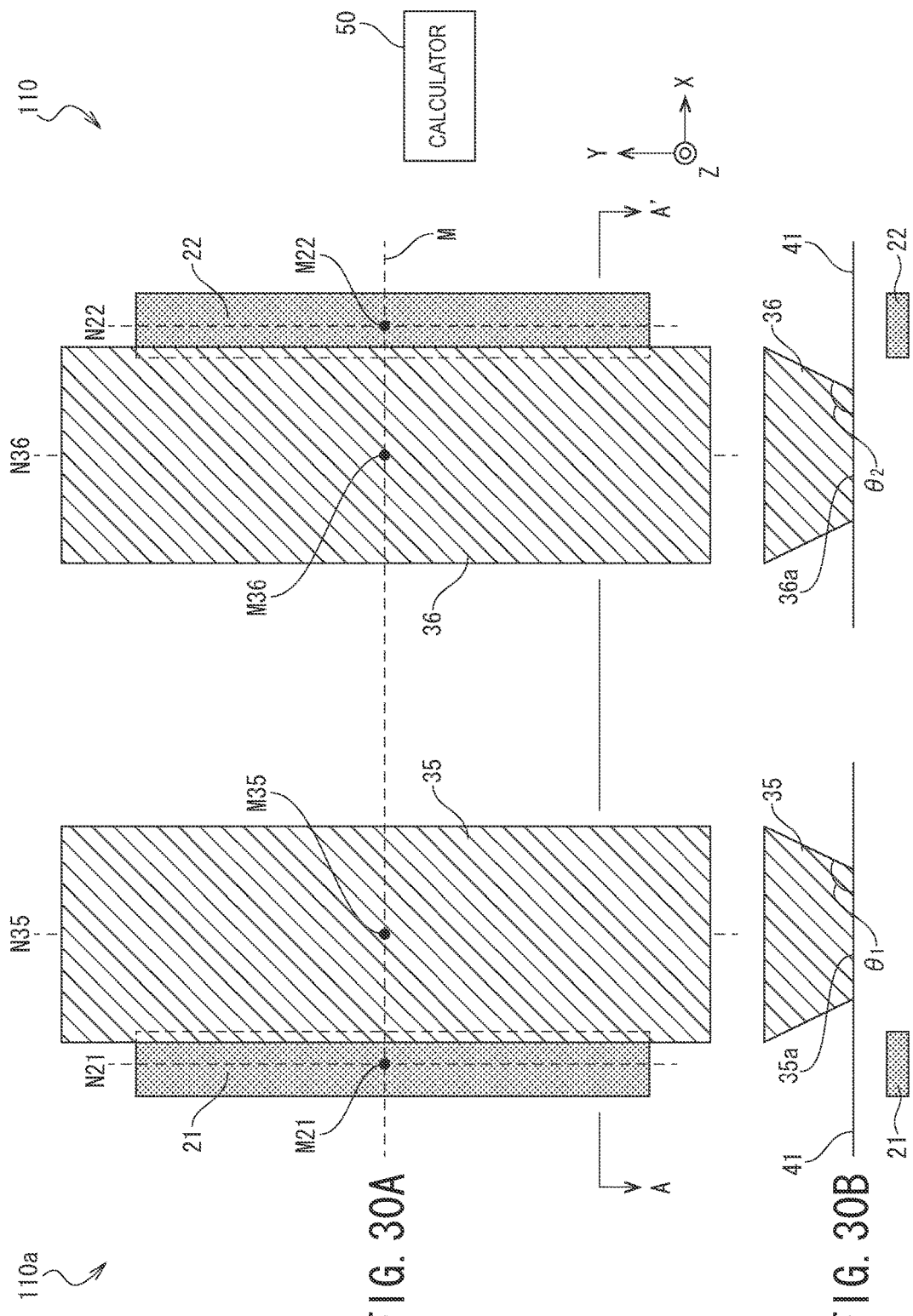

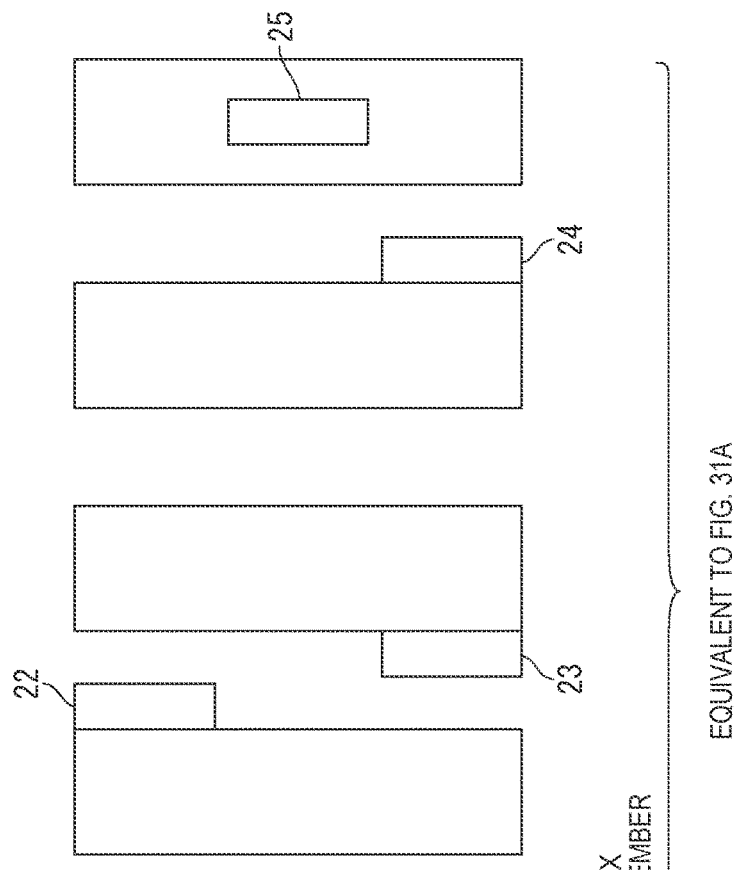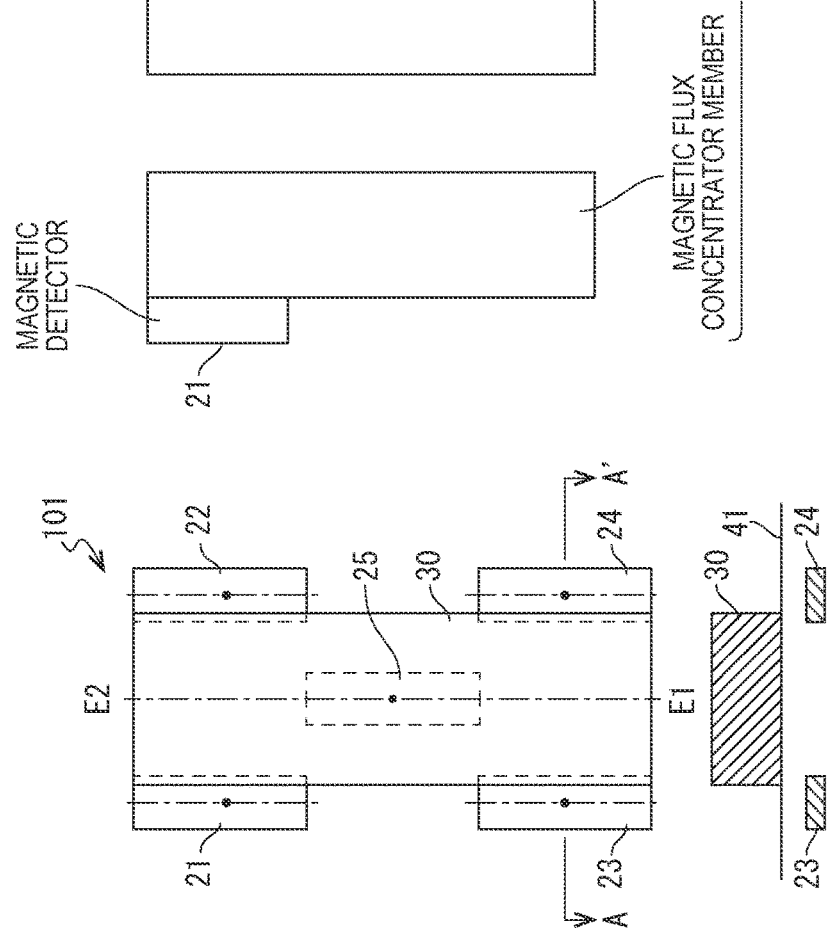

MAGNETIC SENSOR

TECHNICAL FIELD

The present invention relates to a magnetic sensor.

BACKGROUND ART

Generally, giant magneto-resistance (GMR) elements for detecting presence or absence of a magnetic field are widely known. The phenomenon that an electric resistance changes when a magnetic field is applied, is called magnetoresistance effect. Although the resistance change of a common substance would be several percent, the resistance change of such GMR elements reaches several tens of percent. For this reason, the GMR elements are widely used for recording heads of hard disks.

FIG. 1 is a perspective view illustrating the operation principle of the conventional GMR element, and FIG. 2 is a partial cross-sectional view of FIG. 1. In the drawings, reference numeral 1 denotes an antiferromagnetic layer, reference numeral 2 denotes a pinned layer (fixed layer), reference numeral 3 denotes a Cu layer (spacer layer), and reference numeral 4 denotes a free layer (free rotation layer). A magnetization direction of a magnetic material changes electronic spin scattering, and changes a resistance. In other words, the change of the resistance is represented by $\Delta R = (RAP-RP) \times RP$ (where RAP is a resistance when magnetization directions on upper and lower sides are not parallel, and RP is a resistance when the magnetization directions on upper and lower sides are parallel).

As for the magnetic moment of the pinned layer 2, the direction is fixed by magnetic coupling with the antiferromagnetic layer 1. When the direction of the magnetic moment of the free rotation layer 4 changes due to leakage field, a resistance applied on the current flowing through the Cu layer 3 changes, and a change of the leakage field can be detected.

FIG. 3 is a configuration diagram illustrating a stack structure of the conventional GMR element. In the drawing, reference numeral 11 denotes an insulating film, reference numeral 12 denotes a free layer (free rotation layer), reference numeral 13 denotes a conductive layer, reference numeral 14 denotes a pinned layer (fixed layer), reference numeral 15 denotes an antiferromagnetic layer, and reference numeral 16 denotes an insulating film. The free layer (free rotation layer) 12 is a layer in which a magnetization direction rotates freely, and is made of NiFe or CoFe/NiFe. The conductive layer 13 is a layer in which a current flows and the electrons are scattered dependent on their spin, and is made of Cu. The pinned layer (fixed layer) 14 is a layer in which a magnetization direction is fixed in a specific direction, and is made of CoFe or CoFe/Ru/CoFe. The antiferromagnetic layer 15 is a layer for fixing the magnetization direction of the pinned layer 14, and is made of PtMn or IrMn. The insulating films 11 and 16 are made of Ta, Cr, NiFeCr, or AlO. It is to be noted that the pinned layer 14 may use a self-bias structure instead of the antiferromagnetic layer.

PTL 1, for example, describes a magnetic sensor including magnetoresistance effect elements and a soft magnetic material provided at a position where it does not come into contact with each of the magnetoresistance effect elements through an insulating layer. In the magnetic sensor, the magnetoresistance effect elements are arranged at both sides of the soft magnetic material in a first horizontal direction in plan view such that fixed magnetization directions of fixed magnetic layers thereof are directed in the first horizontal direction. And the fixed magnetization directions of the magnetoresistance effect elements arranged at both sides of the soft magnetic material are set to be opposite to each other, or the fixed magnetization directions of the magnetoresistance effect elements arranged at the same side of the soft magnetic material are set to be opposite to each other.

CITATION LIST

Patent Literature

PTL1: JP 2012-127788 A

SUMMARY OF INVENTION

According to an aspect of an embodiment, there is provided a magnetic sensor comprising: a magnetic flux concentrator unit including one or more magnetic flux concentrator members provided on or in a substrate; a first magnetic detector, a second magnetic detector, and a third magnetic detector, each of which is arranged adjacent to the one or more magnetic flux concentrator members and has a sensitivity axis in a direction of a first axis parallel to a plane of the substrate; and a calculator configured to calculate a magnetic field in a direction of a second axis parallel to the plane of the substrate and perpendicular to the first axis and a magnetic field in a direction of a third axis perpendicular to the plane of the substrate based on an output of the first magnetic detector, an output of the second magnetic detector, and an output of the third magnetic detector. A shape of each of the one or more magnetic flux concentrator members has a width in the direction of the first axis and a length in the direction of the second axis in plan view. One of directions along the first axis is a positive direction of the first axis and the other direction is a negative direction of the first axis, and one of directions along the second axis is a positive direction of the second axis and the other direction is a negative direction of the second axis. The first magnetic detector is arranged on a negative side of the first axis with respect to a closest magnetic flux concentrator member to the first magnetic detector out of the one or more magnetic flux concentrator members and on a positive side of the second axis with respect to a midpoint of the closest magnetic flux concentrator member to the first magnetic detector in a length direction, in plan view. The second magnetic detector is arranged on a positive side of the first axis with respect to a closest magnetic flux concentrator member to the second magnetic detector out of the one or more magnetic flux concentrator members and on the positive side of the second axis with respect to a midpoint of the closest magnetic flux concentrator member to the second magnetic detector in the length direction, in plan view. The third magnetic detector is arranged on the negative side of the first axis with respect to a closest magnetic flux concentrator member to the third magnetic detector out of the one or more magnetic flux concentrator members and on a negative side of the second axis with respect to a midpoint of the closest magnetic flux concentrator member to the third magnetic detector in the length direction, in plan view. The calculator is configured to calculate the magnetic field in the direction of the second axis based on the output of the first magnetic detector and the output of the third magnetic detector, and to calculate the magnetic field in the direction of the third axis based on the output of the second magnetic detector and the output of the third magnetic detector.

BRIEF DESCRIPTION OF DRAWINGS

FIGS. 6A to 6C are schematic views illustrating magnetic fluxes of magnetic fields in the respective axes in the first embodiment;

FIG. 9 is a configuration diagram illustrating an example of a third embodiment of the present invention;

FIGS. 17A to 17C are schematic views illustrating magnetic fluxes of magnetic fields in the respective axes in the fourth embodiment;

FIGS. 18A and 18B are configuration diagrams illustrating an example of a fifth embodiment of the present invention;

FIG. 19 is a configuration diagram illustrating an example of a sixth embodiment of the present invention;

FIGS. 26A and 26B are configuration diagrams illustrating an example of the eight embodiment of the present invention;

FIGS. 30A and 30B are configuration diagrams illustrating an example of a tenth embodiment of the present invention;

FIGS. 31A and 31B are configuration diagrams illustrating a modification of the present embodiment.

DESCRIPTION OF EMBODIMENTS

Figure 1:
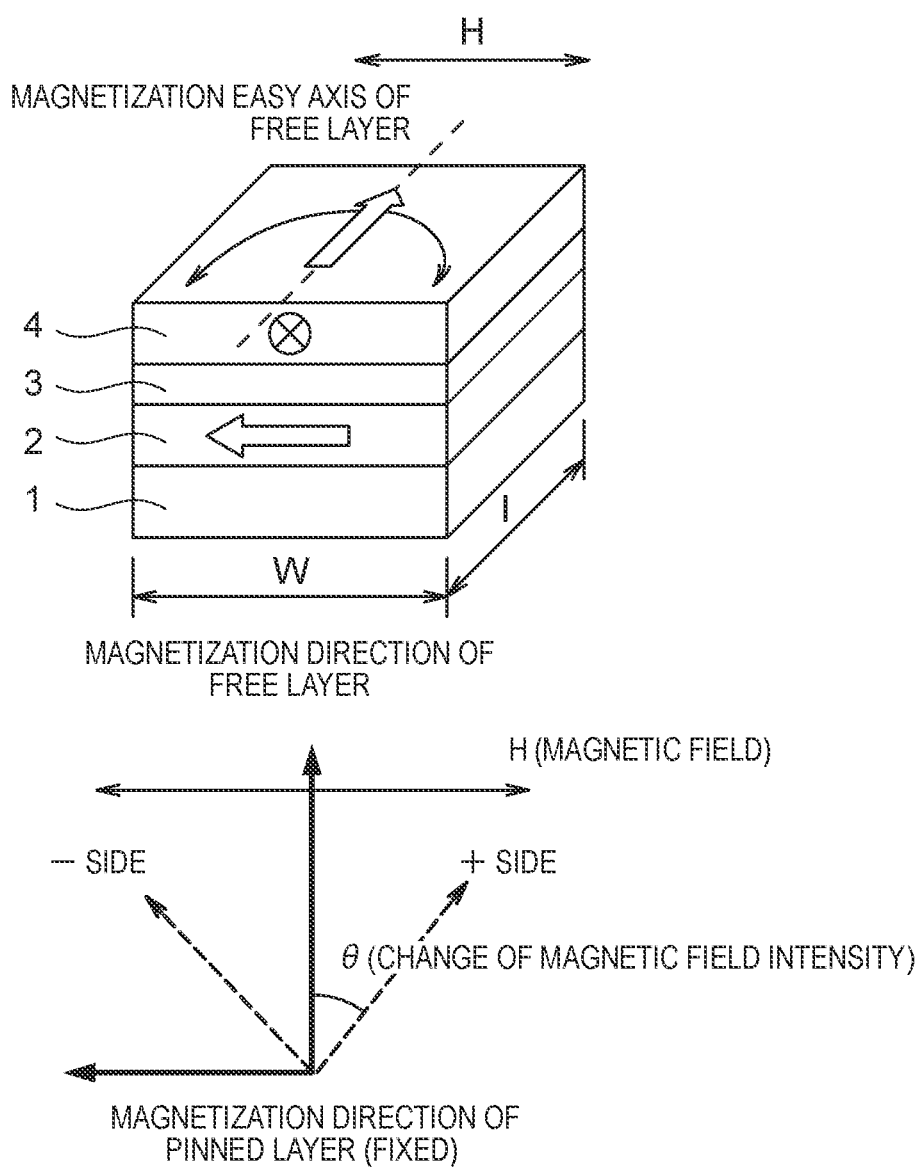
FIG. 1 is a perspective view illustrating an operation principle of a conventional GMR element.
Figure 2:
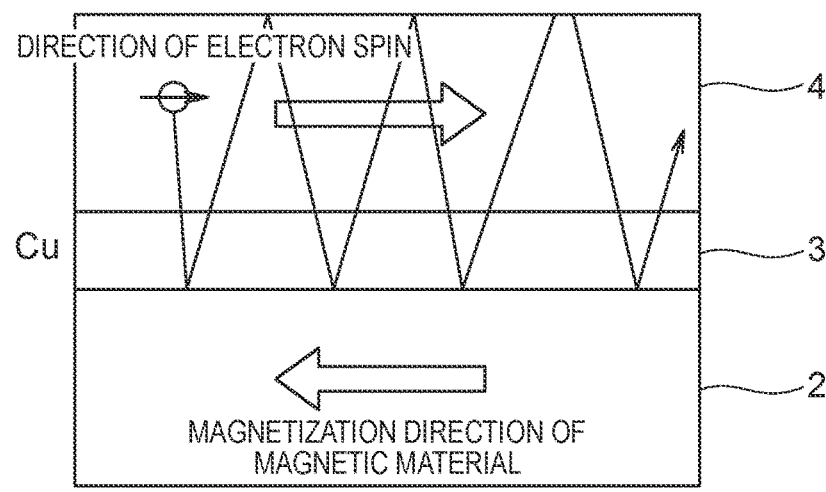
FIG. 2 is a partial cross-sectional view of FIG. 1.
Figure 3:
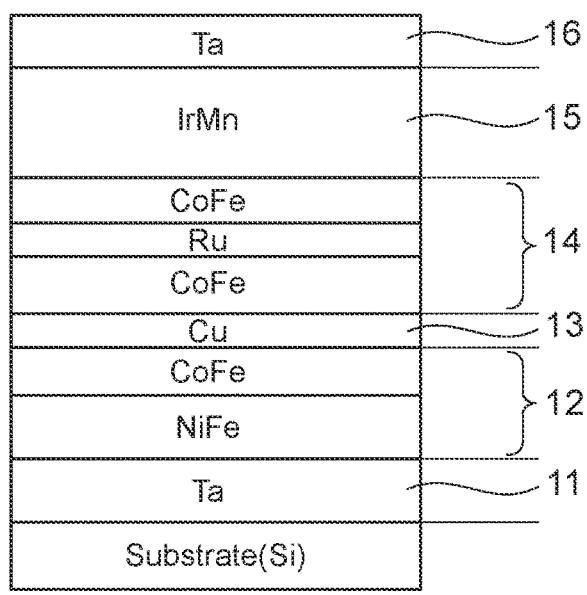
FIG. 3 is a configuration diagram illustrating a stack structure of the conventional GMR element.

The magnetic sensor described in PTL 1 includes separate units as a Y-axis magnetic field detection unit computing a magnetic field in Y axis perpendicular to a sensitive axis (X axis) of the magnetoresistance effect element and a Z-axis magnetic field detection unit computing a magnetic field in Z axis perpendicular to the sensitive axis (X axis) of the magnetoresistance effect element and the Y axis, and thus has a problem that its mounting area becomes large.

The present invention has been made in view of such a problem, and an object thereof is to provide a small magnetic sensor capable of calculating a magnetic field in a direction of a second axis perpendicular to a first axis and a magnetic field in a direction of a third axis perpendicular to the first axis and the second axis, when a direction of a sensitive axis of a magnetic detector is a direction of the first axis.

Hereinafter, embodiments (present embodiments) of the present invention will be described below with reference to the drawings.

(Configuration of Magnetic Sensor)

A magnetic sensor in the present embodiment includes plural magnetic detectors formed in a substrate and a magnetic flux concentrator member formed on the substrate.

(Substrate)

The substrate in which the magnetic detectors are formed is not particularly limited, but may be a silicon substrate, a compound semiconductor substrate, a ceramic substrate, or the like. The substrate on which a circuit is formed can be used.

(Magnetic Detector)

In the magnetic sensor in the present embodiment, the magnetic detector is not particularly limited, as long as it is configured to output a signal depending on an input magnetic flux. In the light of easy detection of a magnetic field component of each axis, the magnetic detector is preferably a magnetoresistance effect element, and is more preferably a giant magnetoresistance effect element (hereinafter referred to as GMR element) or a tunneling magnetoresistance effect element (hereinafter referred to as TMR element) in the light of obtaining a high MR ratio. A known magnetoresistance effect element, a known GMR element, or a known TMR element can be used as the magnetic detector.

The magnetic detector may be formed as a single element of any type of the magnetoresistance effect element, the GMR element, and the TMR element described above, or may be formed as plural elements of any type of them connected in series with each other. In the light of a consumption current and an output signal noise, the magnetic detector may be formed as plural elements connected in series with each other. In addition, each magnetic detector may be magnetically independent such that each magnetic detector is configured to output the signal depending on the input magnetic flux. In order to make each magnetic detector magnetically independent, a metal pattern for extracting a signal may be formed between end portions of the signal of the single element or the series connection of the plural elements, or each magnetic detector may be physically and electrically separated. In order to make certain of magnetic independence, it is preferable that each magnetic detector be physically and electrically separated.

(Magnetic Flux Concentrator Member)

In the magnetic sensor in the present embodiment, the magnetic flux concentrator member may have a rectangular shape in plan view of the substrate. In order to obtain a magnetic flux concentration effect, it is preferable that the magnetic flux concentrator member be made of magnetic material having soft magnetic characteristics. An example of material used for the magnetic flux concentrator member may be NiFe, NiFeB, NiFeCo, CoFe, or the like, without being limited thereto. Other suitable materials may be used depending on requested characteristics.

Hereinafter, embodiments of the present invention will be described below in detail with reference to the drawings.

First Embodiment

Figure 4A:
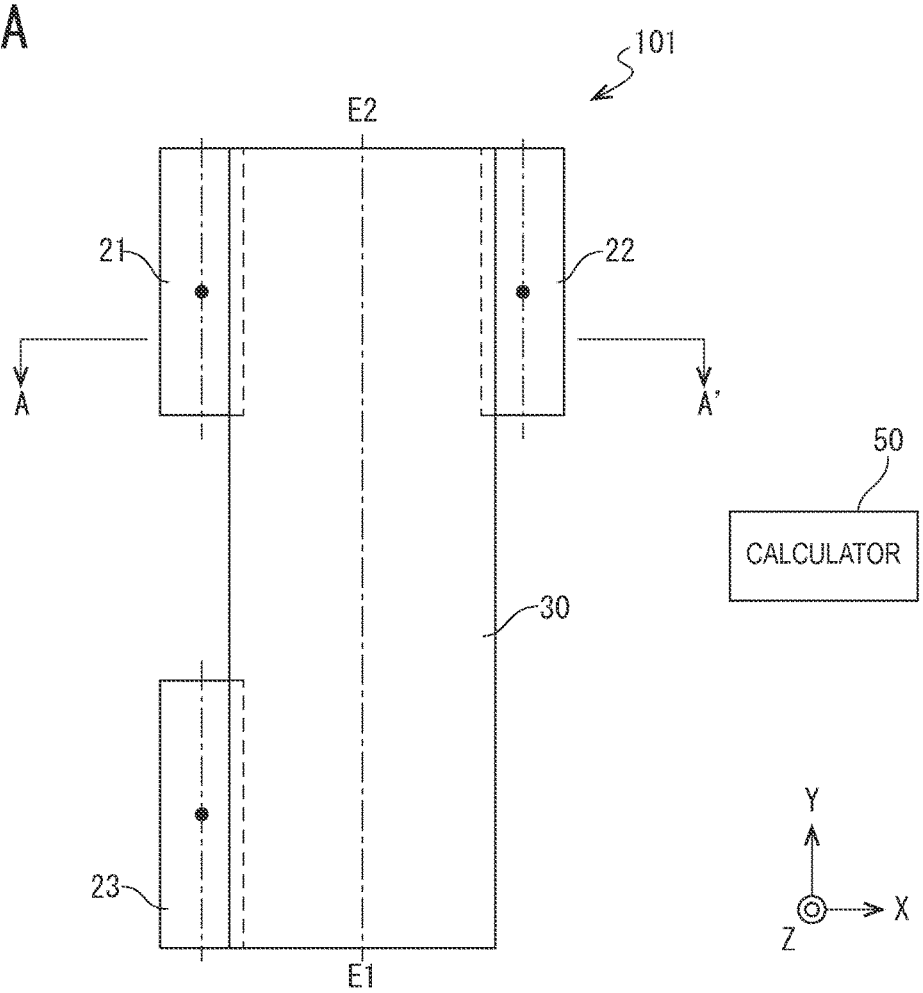
FIGS. 4A and 4B are configuration diagrams illustrating an example of a first embodiment of the present invention.
Figure 4B:
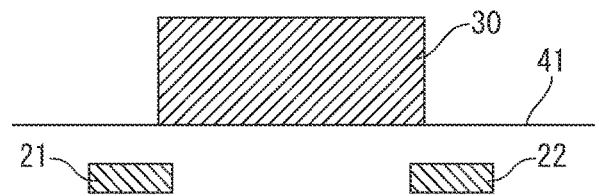

FIGS. 4A and 4B are configuration diagrams illustrating an example of a magnetic sensor 101 in a first embodiment of the present invention. FIG. 4A is a schematic plan view (the substrate is not illustrated), and FIG. 4B is a schematic sectional view taken along line A-A' of FIG. 4A.

In the drawings, reference numerals 21 to 23 denote a first to third magnetic detectors, reference numeral 30 denotes a magnetic flux concentrator member, and reference numeral 41 denotes a substrate surface. In FIGS. 4A and 4B, the first to third magnetic detectors 21 to 23 are formed in the substrate such as a semiconductor substrate, for example, in parallel to the substrate surface 41. The magnetic flux concentrator member 30 is formed on the semiconductor substrate. That is to say, as illustrated in FIGS. 4A and 4B, the first to third magnetic detectors 21 to 23 are arranged below the magnetic flux concentrator member 30. These first to third magnetic detectors 21 to 23 and the magnetic flux concentrator member 30 form a detection unit, and output signals of the first to third magnetic detectors 21 to 23 are input to a calculator 50. The calculator 50 is configured to perform a predetermined calculation processing to calculate a magnetic field in a direction of a second axis perpendicular to a first axis that is a direction of sensitivity axis of the magnetic detectors and a magnetic field in a direction of a third axis perpendicular to the first axis and the second axis.

As illustrated in FIGS. 4A and 4B, the magnetic flux concentrator member 30 of the magnetic sensor 101 has a long narrow rectangular plate shape in plan view. In addition, the first to third magnetic detectors 21 to 23 have the same shape that is a long narrow and thin rectangular plate shape in plan view. Thickness, widths, and lengths of the first to third magnetic detectors 21 to 23 are shorter than those of the magnetic flux concentrator member 30, respectively.

Figure 5:
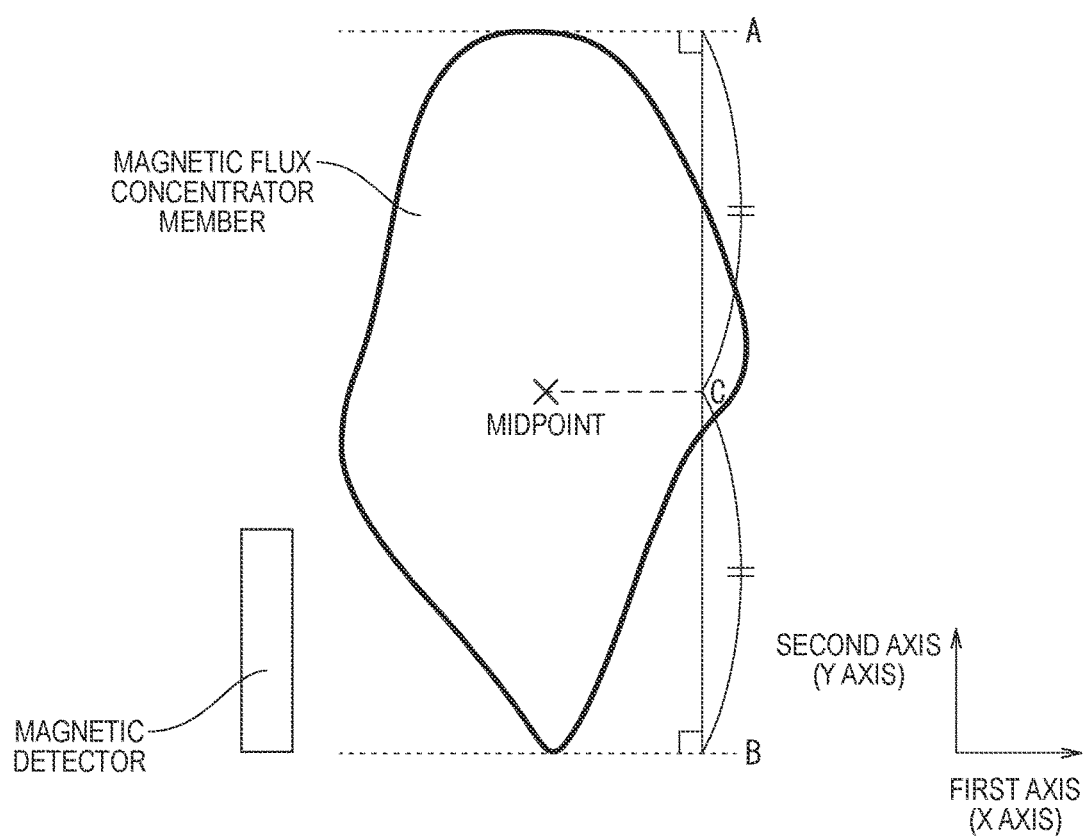
FIG. 5 is a view illustrating another example of the first embodiment.

It is to be noted that the magnetic flux concentrator member 30 has a rectangular shape in FIGS. 4A and 4B, however, the magnetic flux concentrator member 30 is not limited thereto. The magnetic flux concentrator member 30 only has to have a shape having a width in the first axis (X axis) and a length in the second axis (Y axis) in plan view. That is to say, the magnetic flux concentrator member 30 may have the long narrow rectangular plate shape in plan view as illustrated in FIGS. 4A and 4B, or may have a shape of curve as illustrated in FIG. 5. In addition, the first to third magnetic detectors 21 to 23 may not necessarily have the same shape. The first to third magnetic detectors 21 to 23 and the magnetic flux concentrator member 30 do not have to overlap in plan view, and may be separated as illustrated in FIG. 5.

Now, it is assumed that one of directions along the first axis be a positive direction of the first axis and the other direction is a negative direction of the first axis. It is assumed that one of directions along the second axis be a positive direction of the second axis and the other direction is a negative direction of the second axis.

The first magnetic detector 21 is arranged on the negative side of the first axis with respect to the closest magnetic flux concentrator member (i.e. the magnetic flux concentrator member 30) to the first magnetic detector and on the positive side of the second axis with respect to a midpoint of the closest magnetic flux concentrator member 30 in the length direction, in plan view. The second magnetic detector 22 is arranged on the positive side of the first axis with respect to the closest magnetic flux concentrator member (i.e. the magnetic flux concentrator member 30) to the second magnetic detector and on the positive side of the second axis with respect to the midpoint of the closest magnetic flux concentrator member 30 in the length direction, in plan view. The third magnetic detector 23 is arranged on the negative side of the first axis with respect to the closest magnetic flux concentrator member (i.e. the magnetic flux concentrator member 30) to the third magnetic detector and on the negative side of the second axis with respect to the midpoint of the closest magnetic flux concentrator member in the length direction, in plan view.

It is to be noted that the "midpoint of the magnetic flux concentrator member in the length direction" herein means, as illustrated in FIG. 5, a middle point C in the direction of the second axis between a position A at the most positive side of the magnetic flux concentrator member in the direction of the second axis and a position B at the most negative side in the direction of the second axis. In a case of the magnetic flux concentrator member 30 having the rectangular shape in plan view as illustrated in FIGS. 4A and 4B, for example, when reference symbol E1 denotes one end side of the magnetic flux concentrator member 30 in a longitudinal direction thereof and reference symbol E2 denotes the other end side, the midpoint is defined as a middle point between a position of an end portion on the E1 side and a position of an end portion on the E2 side of the magnetic flux concentrator member 30 in the direction of the second axis. In addition, in a case of the magnetic flux concentrator member having a curved outline as illustrated in FIG. 5, the midpoint is defined as a middle point C in the direction of the second axis between a position A at the most positive side in the direction of the second axis and a position B at the most negative side in the direction of the second axis.

In a case of FIGS. 4A and 4B, the first magnetic detector 21 is arranged at a position at the end portion of the magnetic flux concentrator member 30 on the E2 side where the edge portion on the left side of the magnetic flux concentrator member 30 extending in the longitudinal direction thereof overlaps in plan view with only the edge portion on the right side of the first magnetic detector 21 extending in the longitudinal direction thereof, as the position at the negative side of the first axis with respect to the closest magnetic flux concentrator member 30 to the first magnetic detector and at the positive side of the second axis with respect to the midpoint of the closest magnetic flux concentrator member 30 in the length direction, in plan view. "The second magnetic detector 22 is arranged at a position at the end portion of the magnetic flux concentrator member 30 on the E2 side where the edge portion on the right side of the magnetic flux concentrator member 30 extending in the longitudinal direction thereof overlaps in plan view with only the edge portion on the left side of the second magnetic detector 22 extending in the longitudinal direction thereof, as the position at the positive side of the first axis with respect to the closest magnetic flux concentrator member 30 to the second magnetic detector and at the positive side of the second axis with respect to the midpoint of the closest magnetic flux concentrator member 30 in the length direction, in plan view." The third magnetic detector 23 is arranged at a position at the end portion of the magnetic flux concentrator member 30 on the E1 side where the edge portion on the left side of the magnetic flux concentrator member 30 extending in the longitudinal direction thereof overlaps in plan view with only the edge portion on the right side of the third magnetic detector 23 extending in the longitudinal direction thereof, as the position at the negative side of the first axis with respect to the closest magnetic flux concentrator member 30 to the third magnetic detector and at the negative side of the second axis with respect to the midpoint of the closest magnetic flux concentrator member 30 in the length direction, in plan view."

The output signals of the first to third magnetic detectors 21 to 23 are input to the calculator 50.

A magnetic detection method in three-axis directions by using the magnetic sensor 101 of the first embodiment in a case in which a magnetic field B is applied will be described below.

It is to be noted that the first axis is referred to as an X axis, the second axis is referred to as a Y axis, and the third axis is referred to as a Z axis, for convenience' sake.

GMR elements are used as the first to third magnetic detectors 21 to 23. R0 refers to the resistances of the first to third magnetic detectors 21 to 23 when no magnetic field is applied thereto. A magnetization direction of a pinned layer is set to the X-axis direction and a magnetization easy axis of a free layer is set to the Y-axis direction so as to set all of sensitivity axes of the first to third magnetic detectors 21 to 23 to the X-axis direction. That is, the resistances change depending on an X-axis component of the magnetic field applied to each of the first to third magnetic detectors 21 to 23. α refers to a sensitivity of the resistance change when the magnetic field is applied in the direction of the sensitivity axis. That is, the resistance R of each of the first to third magnetic detectors 21 to 23 becomes R=R0+αB1, when the magnetic field B1 is applied in the direction of the sensitivity axis of each of the first to third magnetic detectors 21 to 23. Herein, resistances (R1 to R3) of the respective elements (the first to third magnetic detectors 21 to 23) are calculated based on change amounts of currents by driving the respective elements (the first to third magnetic detectors 21 to 23) at a constant voltage or a constant current. For the purpose of simplifying the description, a calculation principle based on the resistance will be described below, however, the magnetic field of each of the three axes can be calculated based on the output signal (current or voltage) itself in an actual magnetic sensor.

By resolving the magnetic field B into components of the X axis, the Y axis and the Z axis, B=Bx+By+Bz is obtained.

As illustrated in FIG. 6A, the magnetic field Bx of the X-axis component is concentrated by the magnetic flux concentrator member 30 at a conversion coefficient a, and is input to all of the first to third magnetic detectors 21 to 23 as aBx in the positive direction. It is to be noted that an upper portion of FIG. 6A is a schematic plan view (the substrate is not illustrated) and a lower portion is a schematic sectional view including the first magnetic detector 21.

As illustrated in a schematic plan view (the substrate is not illustrated) in FIG. 6B, the magnetic field By of the Y-axis component is concentrated by the magnetic flux concentrator member 30. Since the magnetic field acts on the first to third magnetic detectors 21 to 23 obliquely with respect to the Y axis, the magnetic field is converted at a conversion coefficient b to the X-axis direction, and then is input to the first to third magnetic detectors 21 to 23. Since the sensitivity axis of each of the first to third magnetic detectors 21 to 23 is set to the X-axis direction, bBy is input to the second and third magnetic detectors 22 and 23 in the positive direction and bBy is input to the first magnetic detector 21 in the negative direction.

As illustrated in a schematic sectional view in FIG. 6C, the magnetic field Bz of the Z-axis component is concentrated by the magnetic flux concentrator member 30. Since the magnetic field acts on the first to third magnetic detectors 21 to 23 obliquely with respect to the Z axis, the magnetic field is converted at a conversion coefficient c to the X-axis direction, and then is input to the first to third magnetic detectors 21 to 23. cBz is input to the first and third magnetic detectors 21 and 23 in the positive direction and cBz is input to the second magnetic detector 22 in the negative direction.

Based on the above, the resistances R1 to R3 of the first to third magnetic detectors 21 to 23 when the magnetic field B is applied are represented by following expressions (1-1) to (3-1).

$$R1 = \alpha \times (aBx - bBy + cBz) + R0 \tag{1-1}$$

$$R2 = \alpha \times (aBx + bBy - cBz) + R0 \tag{2-1}$$

$$R3 = \alpha \times (aBx + bBy + cBz) + R0 \tag{3-1}$$

Herein, as represented by expression (6-1), a resistance depending on only the magnetic field Bz of the Z-axis component is calculated from "expression (3-1)−expression (2-1)".

$$R3 - R2 = 2\alpha c Bz \tag{6-1}$$

Furthermore, as represented by expression (7-1), a resistance depending on only the magnetic field By of the Y-axis component is calculated from "expression (3-1)−expression (1-1)".

$$R3 - R1 = 2\alpha b By \tag{7-1}$$

Based on expressions (6-1) and (7-1), it turns out that the resistance depending on only each of the Y-axis component and the Z-axis component of the magnetic field B can be calculated by using the magnetic sensor 101 of the first embodiment. Therefore, the magnetic field in each axis direction of the X-axis, Y-axis, and Z-axis components can be independently detected based on these values.

Then, as understood from the above calculation, it is possible to achieve the detection with a simple circuit configuration. This configuration eliminates the need for signal amplification processing for detecting the magnetic field with high accuracy and complicated signal processing. Thus, it is possible to obtain a small magnetic sensor capable of detecting the magnetic fields in the directions of the three orthogonal axes on an identical substrate without causing an increase in consumption current or upsizing.

Second Embodiment

Next, a second embodiment of the present invention will be described below. A magnetic sensor 102 of the second embodiment includes five magnetic detectors, while the magnetic sensor 101 of the first embodiment includes the three magnetic detectors.

Figure 7A:
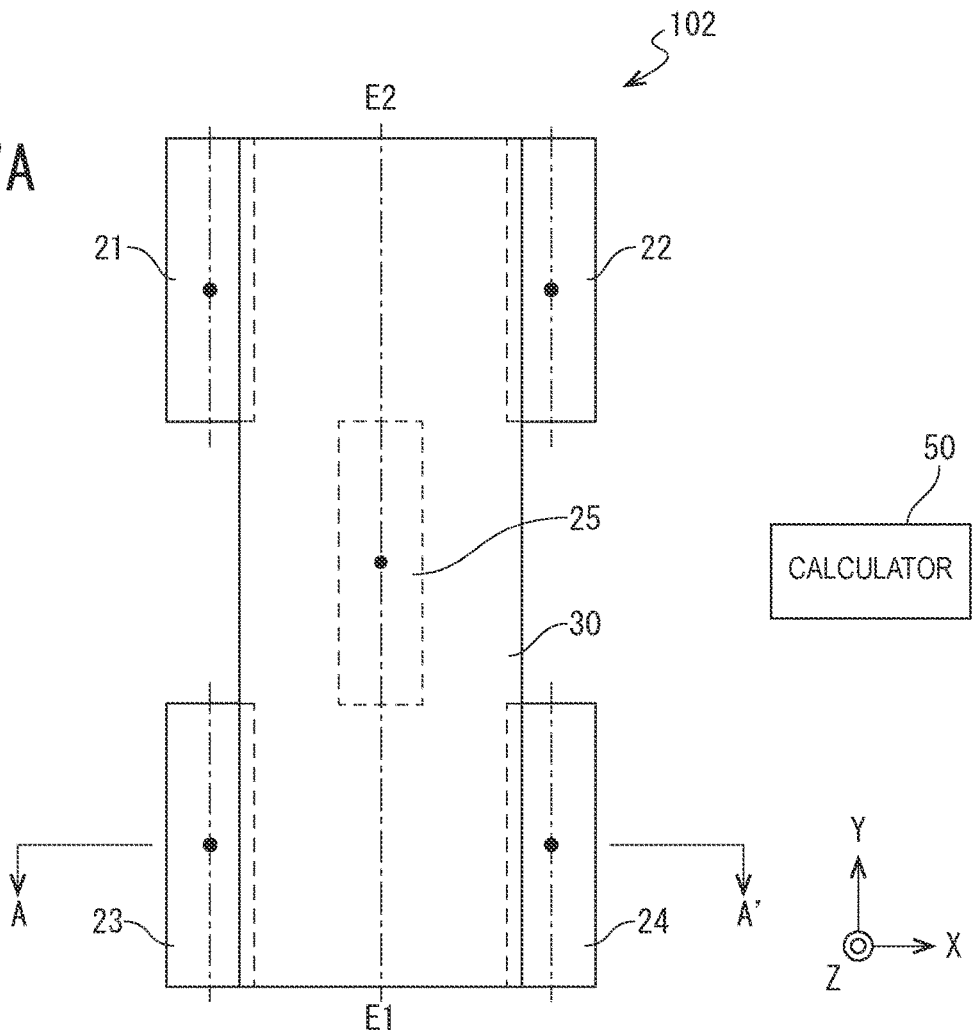
FIGS. 7A and 7B are configuration diagrams illustrating an example of a second embodiment of the present invention.
Figure 7B:
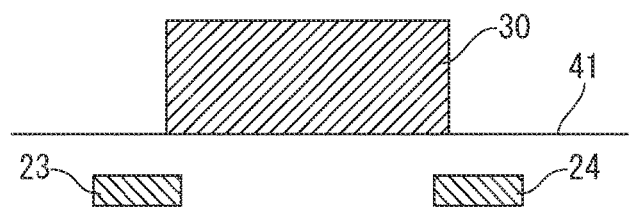

FIGS. 7A and 7B are configuration diagrams illustrating an example of the magnetic sensor 102 of the second embodiment of the present invention. FIG. 7A is a schematic plan view (the substrate is not illustrated), and FIG. 7B is a schematic sectional view taken along line A-A' of FIG. 7A.

In the drawings, reference numerals 21 to 25 denote a first to fifth magnetic detectors, reference numeral 30 denotes the magnetic flux concentrator member, and reference numeral 41 denotes the substrate surface. In FIGS. 7A and 7B, the first to fifth magnetic detectors 21 to 25 are formed in the substrate such as a semiconductor substrate, for example, in parallel to the substrate surface 41. The magnetic flux concentrator member 30 is formed on the semiconductor substrate. That is to say, as illustrated in FIGS. 7A and 7B, the first to fifth magnetic detectors 21 to 25 are arranged below the magnetic flux concentrator member 30. These first to fifth magnetic detectors 21 to 25 and the magnetic flux concentrator member 30 form a detection unit, and output signals of the first to fifth magnetic detectors 21 to 25 are input to the calculator 50. The calculator 50 is configured to perform a predetermined calculation processing based on the output signals to calculate the magnetic field in the direction of the second axis perpendicular to the first axis that is the direction of the sensitivity axes of the magnetic detectors, and the magnetic field in the direction of the third axis perpendicular to the first axis and the second axis.

In the magnetic sensor 102 of the second embodiment, as illustrated in FIGS. 7A and 7B, the magnetic flux concentrator member 30 has a long narrow rectangular plate shape in plan view.

The first to fifth magnetic detectors 21 to 25 have the same shape that is a long narrow and thin rectangular plate shape in plan view. The thicknesses, widths, and lengths of the first to fifth magnetic detectors 21 to 25 are shorter than those of the magnetic flux concentrator member 30, respectively.

The lengths of the first to fifth magnetic detectors 21 to 25 in the longitudinal directions thereof are shorter than the half of the length of the magnetic flux concentrator member 30 in the longitudinal direction thereof. Then, when one end side of the magnetic flux concentrator member 30 in the longitudinal direction thereof is referred to as E1 and the other end side is referred to as E2, the first and second magnetic detectors 21 and 22 are provided at end portions of the magnetic flux concentrator member 30 at the E2 side in the longitudinal direction thereof. The first magnetic detector 21 is arranged such that the edge portion on the left side of the magnetic flux concentrator member 30 extending in the longitudinal direction thereof overlaps in plan view with only the edge portion on the right side of the first magnetic detector 21 extending in the longitudinal direction thereof. The second magnetic detector 22 is arranged such that the edge portion on the right side of the magnetic flux concentrator member 30 extending in the longitudinal direction thereof overlaps in plan view with only the edge portion on the left side of the second magnetic detector 22 extending in the longitudinal direction thereof. Furthermore, the first and second magnetic detectors 21 and 22 are arranged such that their end portions at the E2 side coincide with the end portion of the magnetic flux concentrator member 30 at the E2 side in plan view.

Similarly, the third and fourth magnetic detectors 23 and 24 are provided at end portions of the magnetic flux concentrator member 30 at the E1 side in the longitudinal direction thereof. The third magnetic detector 23 is arranged such that the edge portion on the left side of the magnetic flux concentrator member 30 extending in the longitudinal direction thereof overlaps in plan view with only the edge portion on the right side of the third magnetic detector 23 extending in the longitudinal direction thereof. The fourth magnetic detector 24 is arranged such that the edge portion on the right side of the magnetic flux concentrator member 30 extending in the longitudinal direction thereof overlaps in plan view with only the edge portion on the left side of the fourth magnetic detector 24 extending in the longitudinal direction thereof. Furthermore, the third and fourth magnetic detectors 23 and 24 are arranged such that their end portions at the E1 side coincide with the end portion of the magnetic flux concentrator member 30 at the E1 side in plan view. That is to say, as illustrated in FIGS. 7A and 7B, the first magnetic detector 21 and the third magnetic detector 23 are arranged at a predetermined interval, and the second magnetic detector 22 and the fourth magnetic detector 24 are arranged at the predetermined interval.

The fifth magnetic detector 25 is formed on the same plane as a plane on which the first to fourth magnetic detectors 21 to 24 are formed, and is arranged such that a center point of the fifth magnetic detector 25 coincides with a center point of the magnetic flux concentrator member 30 in plan view. That is to say, the fifth magnetic detector 25 is completely covered (overlapped) with the magnetic flux concentrator member 30 in plan view.

Furthermore, center lines of the first to fifth magnetic detectors 21 to 25 in the longitudinal directions thereof are parallel to a center line of the magnetic flux concentrator member 30 in the longitudinal direction thereof, and the first to fourth magnetic detectors 21 to 24 are arranged to be axisymmetric with respect to center lines of the magnetic flux concentrator member 30 in a lateral direction and the longitudinal direction thereof. It is to be noted that the center line herein, in a case of the magnetic flux concentrator member 30 for example, means a line passing through the center point of the magnetic flux concentrator member 30 (a center both of in length and in width in plan view) and extending in the longitudinal direction or the lateral direction thereof. The center line in the longitudinal direction means a center line passing through the center point and extending in the longitudinal direction. The center line in the lateral direction means a center line passing through the center point and extending in the lateral direction.

A magnetic detection method in three-axis directions by using the magnetic sensor 102 of the second embodiment in a case in which the magnetic field B is applied will be described below.

It is to be noted that the first axis is referred to as the X axis, the second axis is referred to as the Y axis, and the third axis is referred to as the Z axis, for convenience' sake.

GMR elements are used as the first to fifth magnetic detectors 21 to 25. R0 refers to the resistances of the first to fifth magnetic detectors 21 to 25 when no magnetic field is applied thereto. The magnetization direction of the pinned layer is set to the X-axis direction and the magnetization easy axis of the free layer is set to the Y-axis direction so as to set all of the sensitivity axes of the first to fifth magnetic detectors 21 to 25 to the X-axis direction. That is, the resistances change depending on the X-axis component of the magnetic field applied to each of the first to fifth magnetic detectors 21 to 25. α refers to the sensitivity of the resistance change when the magnetic field is applied in the direction of the sensitivity axis. That is, the resistance R of each of the first to fifth magnetic detectors 21 to 25 becomes R=R0+αB1, when the magnetic field B1 is applied in the direction of the sensitivity axis of each of the first to fifth magnetic detectors 21 to 25. Herein, resistances (R1 to R5) of the respective elements (the magnetic detectors 21 to 25) are calculated based on change amounts of currents by driving the respective elements (the first to fifth magnetic detectors 21 to 25) at the constant voltage or the constant current. For the purpose of simplifying the description, a calculation principle based on the resistance will be described below, however, the magnetic field of each of the three axes can be calculated based on the output signal (current or voltage) itself in an actual magnetic sensor.

By resolving the magnetic field B into components of the X axis, the Y axis and the Z axis, B=Bx+By+Bz is obtained.

Figure 8C:
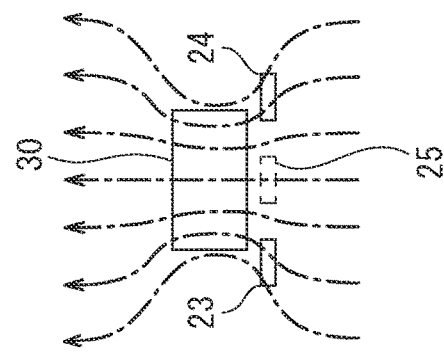
FIGS. 8A to 8C are schematic views illustrating magnetic fluxes of magnetic fields in the respective axes in the second embodiment.
Figure 8B:
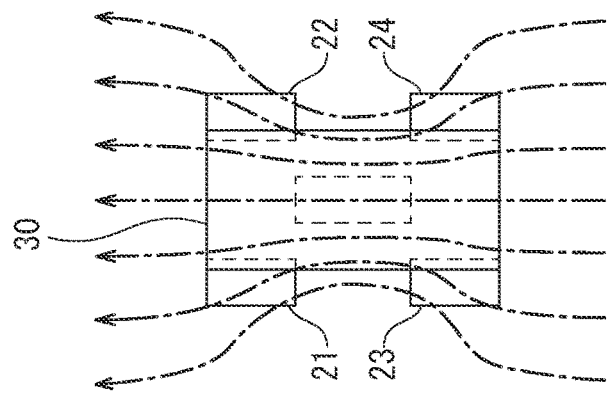
Figure 8A:
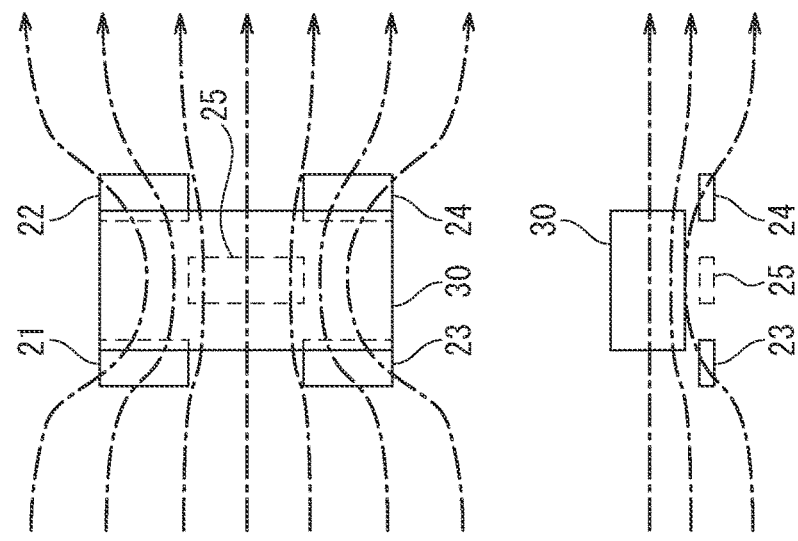

As illustrated in FIG. 8A, the magnetic field Bx of the X-axis component is concentrated by the magnetic flux concentrator member 30 at the conversion coefficient a, and is input to all of the first to fourth magnetic detectors 21 to 24 as aBx in the positive direction. On the other hand, since the fifth magnetic detector 25 is completely covered (overlapped) with the magnetic flux concentrator member 30 in plan view, the magnetic field in the X-axis direction is not input thereto. It is to be noted that an upper portion of FIG. 8A is a schematic plan view (the substrate is not illustrated) and a lower portion is a schematic sectional view including the third and fourth magnetic detectors 23 and 24.

As illustrated in a schematic plan view (the substrate is not illustrated) in FIG. 8B, the magnetic field By of the Y-axis component is concentrated by the magnetic flux concentrator member 30. Since the magnetic field acts on the first to fourth magnetic detectors 21 to 24 obliquely with respect to the Y axis, the magnetic field is converted at the conversion coefficient b to the X-axis direction, and then is input to the first to fourth magnetic detectors 21 to 24. Since the sensitivity axis of each of the first to fourth magnetic detectors 21 to 24 is set to the X-axis direction, bBy is input to the second and third magnetic detectors 22 and 23 in the positive direction and bBy is input to the first and fourth magnetic detectors 21 and 24 in the negative direction. On the other hand, since the fifth magnetic detector 25 is completely covered (overlapped) with the magnetic flux concentrator member 30 in plan view, the converted magnetic field in the X-axis direction is not input thereto.

As illustrated in a schematic sectional view in FIG. 8C, the magnetic field Bz of the Z-axis component is concentrated by the magnetic flux concentrator member 30. Since the magnetic field acts on the first to fourth magnetic detectors 21 to 24 obliquely with respect to the Z axis, the magnetic field is converted at the conversion coefficient c to the X-axis direction, and then is input to the first to fourth magnetic detectors 21 to 24. cBz is input to the first and third magnetic detectors 21 and 23 in the positive direction and cBz is input to the second and fourth magnetic detectors 22 and 24 in the negative direction. On the other hand, since the fifth magnetic detector 25 is completely covered (overlapped) with the magnetic flux concentrator member 30 in plan view, the converted magnetic field in the X-axis direction is not input thereto.

Based on the above, the resistances R1 to R5 of the first to fifth magnetic detectors 21 to 25 when the magnetic field B is applied are represented by following expressions (1-2) to (5-2).

$$R1 = \Delta \times (aBx - bBy + cBz) + R0 \tag{1-2}$$

$$R2 = \Delta \times (aBx + bBy - cBz) + R0 \tag{2-2}$$

$$R3 = \Delta \times (aBx + bBy + cBz) + R0 \tag{3-2}$$

$$R4 = \Delta \times (aBx - bBy - cBz) + R0 \tag{4-2}$$

$$R5 = R0 \tag{5-2}$$

Herein, as represented by expression (6-2), the resistance depending on only the magnetic field Bz of the Z-axis component is calculated from "expression (3-2)–expression (2-2)".

$$R3 - R2 = 2\alpha c Bz \tag{6-2}$$

The same applies to "expression (1-2)–expression (4-2)".

Furthermore, as represented by expression (7-2), the resistance depending on only the magnetic field By of the Y-axis component is calculated from "expression (3-2)–expression (1-2)".

$$R3 - R1 = 2\alpha b By \tag{7-2}$$

The same applies to "expression (2-2)–expression (4-2)".

Furthermore, the resistance depending on only the magnetic field Bx of the X-axis component is calculated from "expression (1-2)+expression (2-2)–2×expression (5-2)".

$$R1 + R2 - 2 \times R5 = 2\alpha a Bx \tag{8-2}$$

The same applies to "expression (3-2)+expression (4-2)–2×expression (5-2)".

Based on expressions (6-2) to (8-2), it turns out that the resistance depending on only each of the X-axis component, the Y-axis component and the Z-axis component can be calculated by using the magnetic sensor 102 of the second embodiment. Therefore, the magnetic field in each axis direction of the X-axis, Y-axis, and Z-axis components can be independently detected based on these values.

Then, as understood from the above calculation, it is possible to achieve the detection with a simple circuit configuration. This configuration eliminates the need for signal amplification processing for detecting the magnetic field with high accuracy and complicated signal processing. Thus, it is possible to obtain a small magnetic sensor capable of detecting the magnetic fields in the directions of the three orthogonal axes on an identical substrate without causing an increase in consumption current or upsizing. It is to be noted that the resistance depending on only each of the X-axis component, the Y-axis component and the Z-axis component may be calculated from expression (6-2), expression (7-2) and expression (8-2). The resistance depending on only the magnetic field Bz of the Z-axis component, for example, may be calculated from both of a value calculated from a resistance "R3–R2" in accordance with expression (6-2) and a value calculated from "R1–R4" in accordance with "expression (1-2)–expression (4-2), by calculating an average of both of these values, for example. The same applies to the magnetic field Bx of the X-axis component and the magnetic field By of the Y-axis component.

In the second embodiment described above, there is described a case where the end portions of the first and second magnetic detectors 21 and 22 at the E2 side coincide with the end portion of the magnetic flux concentrator member 30 at the E2 side in plan view, and the end portions of the third and fourth magnetic detectors 23 and 24 at the E1 side coincide with the end portion of the magnetic flux concentrator member 30 at the E1 side in plan view, however the present invention is not limited thereto.

For example, the first and second magnetic detectors 21 and 22 may be located outside in some degree with respect to the magnetic flux concentrator member 30 in the longitudinal direction thereof, or conversely, may be located inside in some degree with respect to the magnetic flux concentrator member 30 in the longitudinal direction thereof. The same applies to the relative relationship between the magnetic flux concentrator member 30 and the third and fourth magnetic detectors 23 and 24.

In addition, the lengths of the first to fifth magnetic detectors 21 to 25 in the longitudinal directions thereof do not have to be shorter than a half of the length of the magnetic flux concentrator member 30 in the longitudinal direction thereof. The point is that the two out of the first to fourth magnetic detectors 21 to 24 provided at each of both edge portions of the magnetic flux concentrator member 30 in the longitudinal direction thereof only have to be arranged at an interval. In a case where the lengths of the first to fifth magnetic detectors 21 to 25 in the longitudinal directions thereof are longer than the half of the length of the magnetic flux concentrator member 30 in the longitudinal direction thereof, for example, two magnetic detectors arranged at each of the left and right edge portions of the magnetic flux concentrator member 30 extending in the longitudinal direction thereof, may be arranged at an interval, such that the end portions of the magnetic detectors are located outside from the end portions of the magnetic flux concentrator member 30 accordingly.

In addition, the edge portions of the first to fourth magnetic detectors 21 to 24 do not have to overlap with the edge portions of the magnetic flux concentrator member 30 in plan view, or conversely, may overlap more widely than the area illustrated in FIGS. 7A and 7B, for example. The point is a positional relationship capable of detecting the magnetic field in the Y-axis direction and the magnetic field in the Z-axis direction converted to the X-axis direction. By arranging the first to fourth magnetic detectors 21 to 24 so as to overlap with the magnetic flux concentrator member 30 in plan view, the detection sensitivity can be improved.

In addition, the first to fifth magnetic detectors 21 to 25 do may not necessarily have a rectangular shape in plan view, and the center lines of the first to fifth magnetic detectors 21 to 25 in the longitudinal directions thereof do not have to be parallel to the center line of the magnetic flux concentrator member 30 in the longitudinal direction thereof, in plan view. In the light of improvement of the detection accuracy, it is preferable that the first to fifth magnetic detectors 21 to 25 have a rectangular shape in plan view of the substrate, and the center lines of the first to fifth magnetic detectors 21 to 25 in the longitudinal directions thereof be parallel to the center line of the magnetic flux concentrator member 30 in the longitudinal direction thereof.

That is, the first to fourth magnetic detectors 21 to 24 may be arranged so as to be close to the four corners of the magnetic flux concentrator member 30, respectively, such the each of these magnetic detectors is close to only each one of these four corners and be point-symmetrical in plan view. For example, the first to fifth magnetic detectors 21 to 25 may have the same rectangular shape in plan view of the substrate, and the direction in which one side of each of the first to fifth magnetic detectors 21 to 25 extends may be parallel to the direction in which one side of the magnetic flux concentrator member 30 extends. Furthermore, the first to fourth magnetic detectors 21 to 24 may be rectangular in plan view, and their longitudinal directions may be arranged along any of the above mentioned one side of the magnetic flux concentrator member 30 and an opposite side of the above mentioned one side.

Third Embodiment

Next, a third embodiment of the present invention will be described below.

FIG. 9 is a configuration diagram illustrating an example of a magnetic sensor 103 of the third embodiment. The magnetic sensor 103 of the third embodiment is different from the magnetic sensor 102 of the second embodiment illustrated in FIGS. 7A and 7B, in that the center lines of the first to fifth magnetic detectors 21 to 25 in the longitudinal directions thereof are parallel to a center line of the magnetic flux concentrator member 30 in the lateral direction thereof, and the sensitivity axes of the first to fifth magnetic detectors 21 to 25 are the Y-axis direction.

That is, as illustrated in FIG. 9, the first and second magnetic detectors 21 and 22 are located adjacent to two corners of the magnetic flux concentrator member 30 on the E2 side in the longitudinal direction thereof, respectively, such that each of these magnetic detectors is close to only each one of these two corners. The first magnetic detector 21 is arranged such that only the edge portion on one side of the first magnetic detector 21 extending in the longitudinal direction thereof overlaps in plan view with the end portion of the magnetic flux concentrator member 30 on the E2 side. Similarly, the second magnetic detector 22 is arranged such that only the edge portion on one side of the second magnetic detector 22 extending in the longitudinal direction thereof overlaps in plan view with the end portion of the magnetic flux concentrator member 30 on the E2 side. Furthermore, the first magnetic detector 21 and the second magnetic detector 22 are arranged at a predetermined interval.

Similarly, the third and fourth magnetic detectors 23 and 24 are located adjacent to two corners of the magnetic flux concentrator member 30 on the E1 side in the longitudinal direction thereof, respectively, such that each of these magnetic detectors is close to only each one of these two corners. The third magnetic detector 23 is arranged such that only the edge portion one side of the third magnetic detector 23 extending in the longitudinal direction thereof overlaps in plan view with the end portion of the magnetic flux concentrator member 30 on the E1 side. Similarly, the fourth magnetic detector 24 is arranged such that only the edge portion on one side of the fourth magnetic detector 24 extending in the longitudinal direction thereof overlaps in plan view with the end portion of the magnetic flux concentrator member 30 on the E1 side. Furthermore, the third magnetic detector 23 and the fourth magnetic detector 24 are arranged at a predetermined interval.

Then, the fifth magnetic detector 25 is arranged below the magnetic flux concentrator member 30, such that the center point of the fifth magnetic detector 25 coincides with the center point of the magnetic flux concentrator member 30 in plan view.

It is to be noted that, in the third embodiment, the width of the magnetic flux concentrator member 30 in the lateral direction thereof is longer than the length of the fifth magnetic detector 25 in the longitudinal direction thereof, and the fifth magnetic detector 25 is formed such that the whole thereof overlaps with the magnetic flux concentrator member 30 in plan view.

The magnetic sensor 103 in the third embodiment having such a configuration may be preferable in higher freedom degree of a layout with other elements.

That is, when the magnetic field B is applied to the magnetic sensor 103, since the magnetic field Bx of the X-axis component is concentrated by the magnetic flux concentrator member 30, the magnetic field Bx is converted to the Y-axis direction as the sensitivity axis at a conversion coefficient d, and then is input to the first to fourth magnetic detectors 21 to 24.

Since the sensitivity axis of each of the first to fourth magnetic detectors 21 to 24 is the Y-axis direction, dBx is input to the second and third magnetic detectors 22 and 23 in the positive direction and dBx is input to the first and fourth magnetic detectors 21 and 24 in the negative direction.

On the other hand, since the fifth magnetic detector 25 is completely covered with the magnetic flux concentrator member 30 in plan view, the converted magnetic field in the Y-axis direction is not input thereto.

The magnetic field By of the Y-axis component is concentrated by the magnetic flux concentrator member 30 at a coefficient e, and then is input to all of the first to fourth magnetic detectors 21 to 24 in the positive direction as eBy. Since the fifth magnetic detector 25 is completely covered with the magnetic flux concentrator member 30 in plan view, the converted magnetic field in the Y-axis direction is not input thereto.

Since the magnetic field Bz of the Z-axis component is concentrated by the magnetic flux concentrator member 30, the magnetic field Bz is converted to the Y-axis direction at a coefficient f, and then is input to the first to fourth magnetic detectors 21 to 24. fBz is input to the third and fourth magnetic detectors 23 and 24 in the positive direction and fBz is input to the first and second magnetic detectors 21 and 22 in the negative direction. On the other hand, since the fifth magnetic detector 25 is completely covered with the magnetic flux concentrator member 30 in plan view, the converted magnetic field in the Y-axis direction is not input thereto.

Based on the above, the resistances R1 to R5 of the first to fifth magnetic detectors 21 to 25 when the magnetic field B is applied to the magnetic sensor 103 are represented by following expressions (1-3) to (5-3).

$$R1 = \Delta \times (-dBx + eBy - fBz) + R0 \quad (1\text{-}3)$$

$$R2 = \Delta \times (dBx + eBy - fBz) + R0 \quad (2\text{-}3)$$

$$R3 = \Delta \times (dBx + eBy + fBz) + R0 \quad (3\text{-}3)$$

$$R4 = \Delta \times (-dBx + eBy + fBz) + R0 \quad (4\text{-}3)$$

$$R5 = R0 \quad (5\text{-}3)$$

Herein, as represented by expression (6-3), the resistance depending on only the magnetic field Bz of the Z-axis component is calculated from "expression (3-3)−expression (2-3)".

$$R3 - R2 = 2\alpha f Bz \quad (6\text{-}3)$$

The same applies to "expression (4-3)−expression (1-3)".

Furthermore, as represented by expression (7-3), the resistance depending on only the magnetic field Bx of the X-axis component is calculated from "expression (3-3)−expression (4-3)".

$$R3 - R1 = 2\alpha d Bx \quad (7\text{-}3)$$

The same applies to "expression (2-3)−expression (1-3)".

Furthermore, the resistance depending on only the magnetic field By of the Y-axis component is calculated from "expression (1-3)+expression (3-3)−2×expression (5-3)".

$$R1 + R2 - 2 \times R5 = 2\alpha e By \quad (8\text{-}3)$$

The same applies to "expression (2-3)+expression (4-3)−2×expression (5-3)".

Based on expressions (6-3) to (8-3), it turns out that the resistance depending on only each of the X-axis component, the Y-axis component and the Z-axis component can be calculated by using the magnetic sensor 103 of the third embodiment. Therefore, the magnetic field in each axis direction of the X-axis, Y-axis, and Z-axis components can be independently detected based on the resistances each of which depends on only each of the X-axis component, the Y-axis component and the Z-axis component.

In this way, also in the third embodiment, it is possible to achieve the detection with a simple circuit configuration. This configuration eliminates the need for signal amplification processing for detecting the magnetic field with high accuracy and complicated signal processing. Thus, it is possible to obtain a small magnetic sensor capable of detecting the magnetic fields in the directions of the three orthogonal axes on an identical substrate without causing an increase in consumption current or upsizing.

In addition, as illustrated in FIG. 9, an operation and effect equivalent to those of the magnetic sensor in the first embodiment even in a case the first to fifth magnetic detectors 21 to 25 are arranged such that the center lines thereof in the longitudinal direction are parallel to the center line of the magnetic flux concentrator member 30 in the lateral direction thereof in plan view. Therefore, the freedom degree of the layout can be improved.

It is to be noted that, also in the third embodiment, the resistance depending on only each of the X-axis component, the Y-axis component and the Z-axis component may be calculated from expression (6-3), expression (7-3) and expression (8-3). The resistance depending on only the magnetic field Bz of the Z-axis component, for example, may be calculated from both of a value calculated from a resistance "R3−R2" in accordance with expression (6-3) and a value calculated from "R4−R1" in accordance with "expression (4-3)−expression (1-3), by calculating an average of both of these values, for example. The same applies to the magnetic field Bx of the X-axis component and the magnetic field By of the Y-axis component.

In addition, in the third embodiment described above, there is described a case where a portion of the edge portion on one side of each of the first to fourth magnetic detectors 21 to 24 extending in the longitudinal direction thereof overlaps in plan view with any of the end portions of the magnetic flux concentrator member 30 in the longitudinal direction thereof, however the present invention is not limited thereto. The end portion of the magnetic flux concentrator member 30, for example, does not have to overlap with the first to fourth magnetic detectors 21 to 24 in plan view, or, conversely, may overlap more widely than the area illustrated in FIG. 9. By arranging the first to fourth magnetic detectors 21 to 24 to overlap with the magnetic flux concentrator member 30 in plan view, the detection accuracy can be improved.

In addition, as illustrated in FIG. 9, the first to fourth magnetic detectors 21 to 24 are arranged such that the neighborhoods of centers of the first to fourth magnetic detectors in the longitudinal directions thereof are located at the four corners of the magnetic flux concentrator member 30, respectively, in plan view, however the present invention is not limited thereto. The first to fourth magnetic detectors 21 to 24, for example, may be arranged such that the corners of the magnetic flux concentrator member 30 is deviated from the center portion of the first to fourth magnetic detectors toward the end portions thereof, and an interval between the first magnetic detector 21 and the second magnetic detector 22 and an interval between the third magnetic detector 23 and the fourth magnetic detector 24 may be larger or smaller.

In addition, the first to fifth magnetic detectors 21 to 25 may not necessarily have a rectangular shape in plan view, and the center lines of the first to fifth magnetic detectors 21 to 25 in the longitudinal directions thereof do not have to be parallel in plan view to the center line of the magnetic flux concentrator member 30 in the lateral direction thereof. In the light of improvement of the detection accuracy, however, it is preferable that the first to fifth magnetic detectors 21 to 25 have a rectangular shape in plan view of the substrate, and the center lines of the first to fifth magnetic detectors 21 to 25 in the longitudinal directions thereof be parallel to the center line of the magnetic flux concentrator member 30 in the lateral direction thereof.

That is, the first to fourth magnetic detectors 21 to 24 may be arranged so as to be close to the four corners of the magnetic flux concentrator member 30, respectively, such that each of these magnetic detectors is close to only each one of these four corners, and be point-symmetric and axisymmetric in plan view. For example, the first to fifth magnetic detectors 21 to 25 may have the same rectangular shape in plan view of the substrate, and the direction in which one side of each of the first to fifth magnetic detectors 21 to 25 extends may be parallel to the direction in which one side of the magnetic flux concentrator member 30 extends. Furthermore, the first to fourth magnetic detectors 21 to 24 may be rectangular in plan view, and their longitudinal directions may be arranged along any of two side intersecting with the above mentioned one side of the magnetic flux concentrator member 30 in plan view.

In addition, in the first to third embodiments described above, in the light of easy detection of the magnetic field of each axis, it is preferable that the lines in the lateral directions of the first to fifth magnetic detectors 21 to 25 passing through the centers thereof be the first axis, without being limited thereto. In this case, the centerlines of the first to fifth magnetic detectors 21 to 25 in the lateral direction thereof are the second axis, and the direction perpendicular to the first to fifth magnetic detectors 21 to 25 is the third axis.

In addition, in the first to third embodiments described above, the lengths, the widths, and the thicknesses of the magnetic flux concentrator member 30 and the first to fifth magnetic detectors 21 to 25 and a relative location theareamong may be set to values at which sufficient three-axis components can be obtained, depending on the characteristics of the magnetic flux concentrator member and the magnetic detectors, and a desired accuracy of the magnetic sensor.

In addition, in the first to third embodiments described above, the first to fifth magnetic detectors 21 to 25 may be arranged above the magnetic flux concentrator member 30.

In addition, in the first to third embodiments described above, the fifth magnetic detector 25 may not necessarily be arranged such that the center point of the magnetic flux concentrator member 30 and the center point of the fifth magnetic detector 25 coincide with each other in plan view, and they may be deviated from each other in some degree.

Next, first to third modifications of the first to third embodiments will be described.

It is to be noted that a case where TMR elements are used as magnetic detection elements in magnetic sensors will be described in the modifications, however, magnetoresistance effect elements or GMR elements can be applied as the magnetic detection elements as described above.

Figure 10:
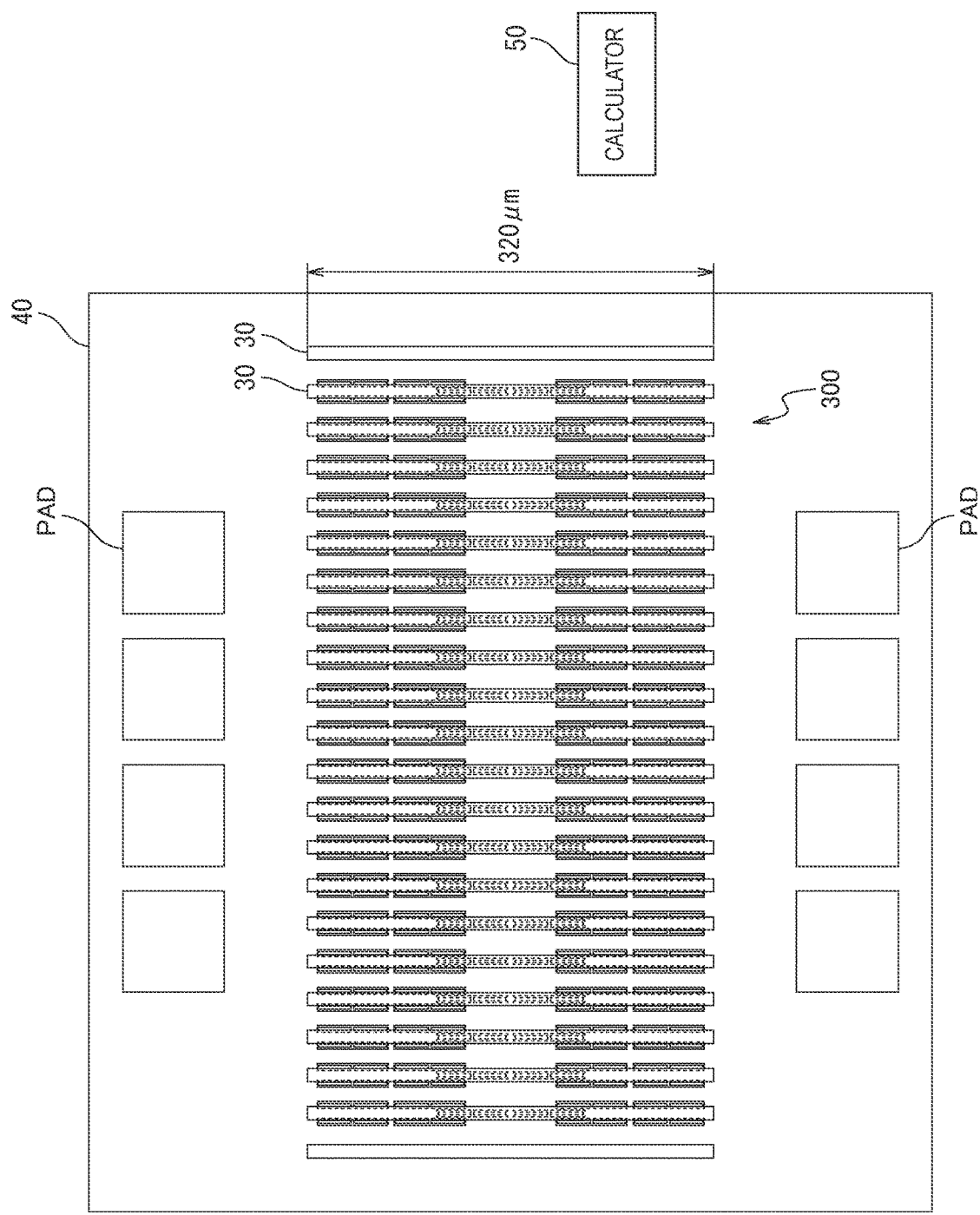
FIG. 10 is a configuration diagram illustrating a first modification.
Figure 11A:
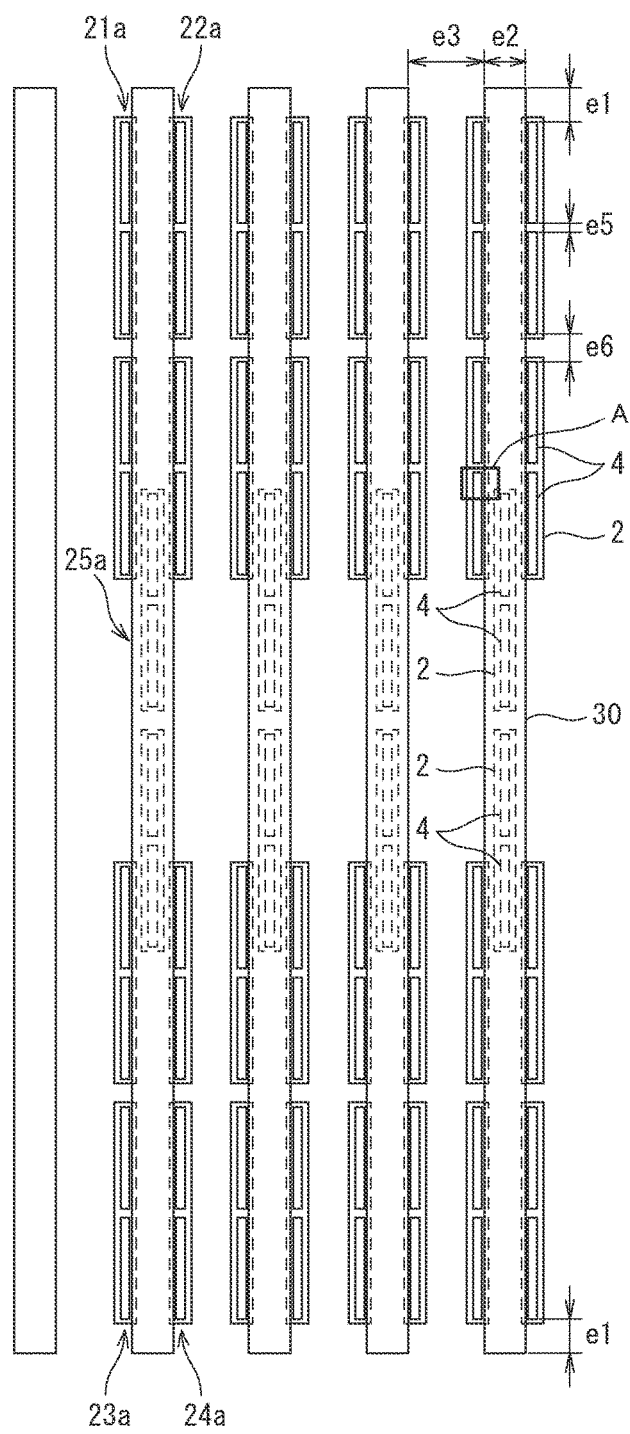
FIGS. 11A and 11B are enlarged views of a portion of FIG. 10.

(First Modification) FIG. 10 is a view illustrating a whole configuration of a magnetic sensor in the first modification. FIG. 11A is an enlarged view of a portion of FIG. 10 and FIG. 11B is an enlarged view of a portion A of FIG. 11A.

Figure 11B:
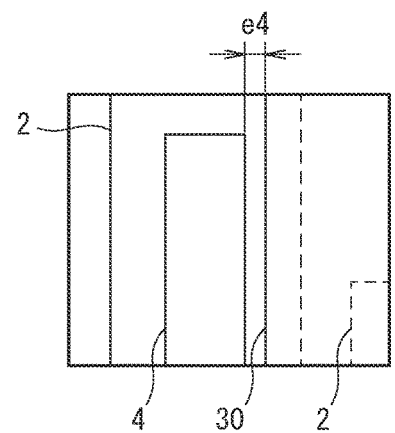

As illustrated in FIG. 10, and FIGS. 11A and 11B, the magnetic sensor in the first modification is obtained by modifying the magnetic sensor 102 in the second embodiment illustrated in FIGS. 7A and 7B such that each of the magnetic detectors 21 to 25 includes plural magnetic detection elements.

That is, as illustrated in FIG. 10, and FIGS. 11A and 11B, the magnetic sensor in the first modification includes a magnetic flux concentrator unit 300 in which plural magnetic flux concentrator members 30 are arranged in parallel to each other. Each of the magnetic flux concentrator members 30 includes magnetic detectors 21a to 25a corresponding to the magnetic detectors 21 to 25 of the magnetic sensor 102 illustrated in FIGS. 7A and 7B.

Each of the magnetic detectors 21a to 25a includes plural (four, for example) TMR elements as the magnetic detection elements. In each of the magnetic detectors 21a to 25a, two pinned layers 2 are arranged in the longitudinal direction of the magnetic flux concentrator member 30 at a predetermined interval and two free layers 4 are arranged in the longitudinal direction of the magnetic flux concentrator member 30 at a predetermined interval in each of the two pinned layers 2, and thus the four TMR elements are arranged in the longitudinal direction of the magnetic flux concentrator member 30 at predetermined intervals.

It is to be noted that, in FIG. 10, reference numeral 40 denotes a substrate on which the magnetic sensor is formed, reference symbols PADs denote pads for extracting output signals of the magnetic detection elements included in each of the magnetic detectors 21a to 25a. Four pads PAD are provided on each of the both end sides in the longitudinal direction of the magnetic flux concentrator member 30. Therefore, eight pads are provided in total. In addition, a magnetic flux concentrator member 30 on which the magnetic detectors 21a to 25a are not provided is arranged on each of both ends of the direction in which a line of the plural magnetic flux concentrator members 30 arranged in parallel to each other extends. Then, the output signal of each of the magnetic detectors 21a to 25a is input to the calculator 50 via the pad. The calculator 50 is configured to perform a predetermined calculation processing based on the output signals to calculate the magnetic field in the direction of the second axis perpendicular to the first axis that is the direction of the sensitivity axes of the magnetic detectors, and the magnetic field in the direction of the third axis perpendicular to the first axis and the second axis.

Each of the magnetic detectors 21a to 25a and the magnetic flux concentrator member 30 are formed so as to satisfy the following conditions in plan view. That is, when e1 refers to a distance between one end of the magnetic flux concentrator member 30 in the longitudinal direction and an end portion of each free layer 4 located adjacent to the one end, and similarly, when e1 refers to a distance between the other end of the magnetic flux concentrator member 30 in the longitudinal direction and an end portion of each free layer 4 located adjacent to the other end, the distance e1 is preferably equal to or larger than 0 μm and equal to or smaller than 30 μm, is more preferably equal to or larger than 5 μm and equal to or smaller than 20 μm, and is further preferably equal to or larger than 10 μm and equal to or smaller than 15 µm. The distance e1, for example, may be 0 µm, 5 µm, 10 µm, 15 µm, 20 µm, 25 µm, or 30 µm.

A length of the magnetic flux concentrator member 30 in the lateral direction, that is, a width e2 is preferably equal to or larger than 5 µm and equal to or smaller than 30 µm, is more preferably equal to or larger than 8 µm and equal to or smaller than 12 µm, and is further preferably 10 µm. The width e2, for example, may be 5 µm, 6 µm, 7 µm, 8 µm, 9 µm, 10 µm, 11 µm, 12 µm, 15 µm, 20 µm, 25 µm, or 30 µm. In addition, the length of the magnetic flux concentrator member 30 in the longitudinal direction may be, for example, 320 µm.

A distance e3 between the magnetic flux concentrator members 30 is preferably equal to or larger than 10 µm and equal to or smaller than 100 µm, is more preferably equal to or larger than 20 µm and equal to or smaller than 50 µm, and is further preferably equal to or larger than 25 µm and equal to or smaller than 32 µm. The distance e3, for example, may be 10 µm, 20 µm, 25 µm, 32 µm, 40 µm, 45 µm, 50 µm, 60 µm, or 100 µm.

As illustrated in FIG. 11B, in the magnetic flux concentrator member 30, a distance e4 between an end portion of each of the magnetic detectors 21a to 24a on a free layer 4 side and an end portion of the free layer 4 on a magnetic flux concentrator member 30 side is preferably equal to or larger than 0 µm and equal to or smaller than 10 µm, and is further preferably equal to or larger than 1 µm and equal to or smaller than 2 µm. The distance e4, for example, may be 0 µm, 0.5 µm, 1 µm, 1.5 µm, 2 µm, or 10 µm.

A distance e5 between the two free layers 4 arranged in the same pinned layer 2 in each of the magnetic detectors 21a to 24a and a distance e6 between the free layers 4 that are arranged in the two pinned layers 2, respectively, are preferably equal to or larger than 2 µm and equal to or smaller than 100 µm, are more preferably equal to or larger than 5 µm and equal to or smaller than 10 µm, and are further preferably 5 µm, 6 µm, or 8 µm. The distances e5 and e6, for example, may be 5 µm, 6 µm, 8 µm, or 10 µm. The distance e5 may be equal to or different from the distance e6.

Regarding the magnetic detector 25a, a distance between the two free layers 4 arranged in the same pinned layer 2 and a distance between the free layers 4 that are arranged in the two pinned layers 2, respectively, may have the similar values to the distances e5 and e6 in the magnetic detectors 21a to 24a, or may have different values therefrom, such as 154 µm, 188 µm, or the like.

When the magnetic flux concentrator member 30 and the magnetic detectors 21a to 25a are formed as one repeated pattern, the magnetic detector 21a included in one repeated pattern is connected to the magnetic detector 21a in another repeated pattern via wiring in series with each other. That is, a magnetic detection element included in the magnetic detector 21a in the one repeated pattern is connected in series to a magnetic detection element included in the magnetic detector 21a in the other repeated pattern. However, all of the magnetic detectors 21a included in the repeated patterns do not have to be connected in series with each other, and some magnetic detectors 21a are not needed to be connected with another magnetic detector 21a.

The number of the magnetic detection elements connected in series is preferably equal to or larger than eight and equal to or smaller than 100, is more preferably equal to or larger than 12 and equal to or smaller than 80, and is further preferably equal to or larger than 24 and equal to or smaller than 56. The number of the magnetic detection elements connected in series, for example, may be 16, 20, 24, 28, 32, 36, 40, 44, 48, 52, or 56. Similarly to the magnetic detector 21a, the magnetic detectors 22a to 25a are connected with the magnetic detectors 22a to 25a included in another repeated pattern in series with each other, respectively.

(Second Modification)

Figure 12:
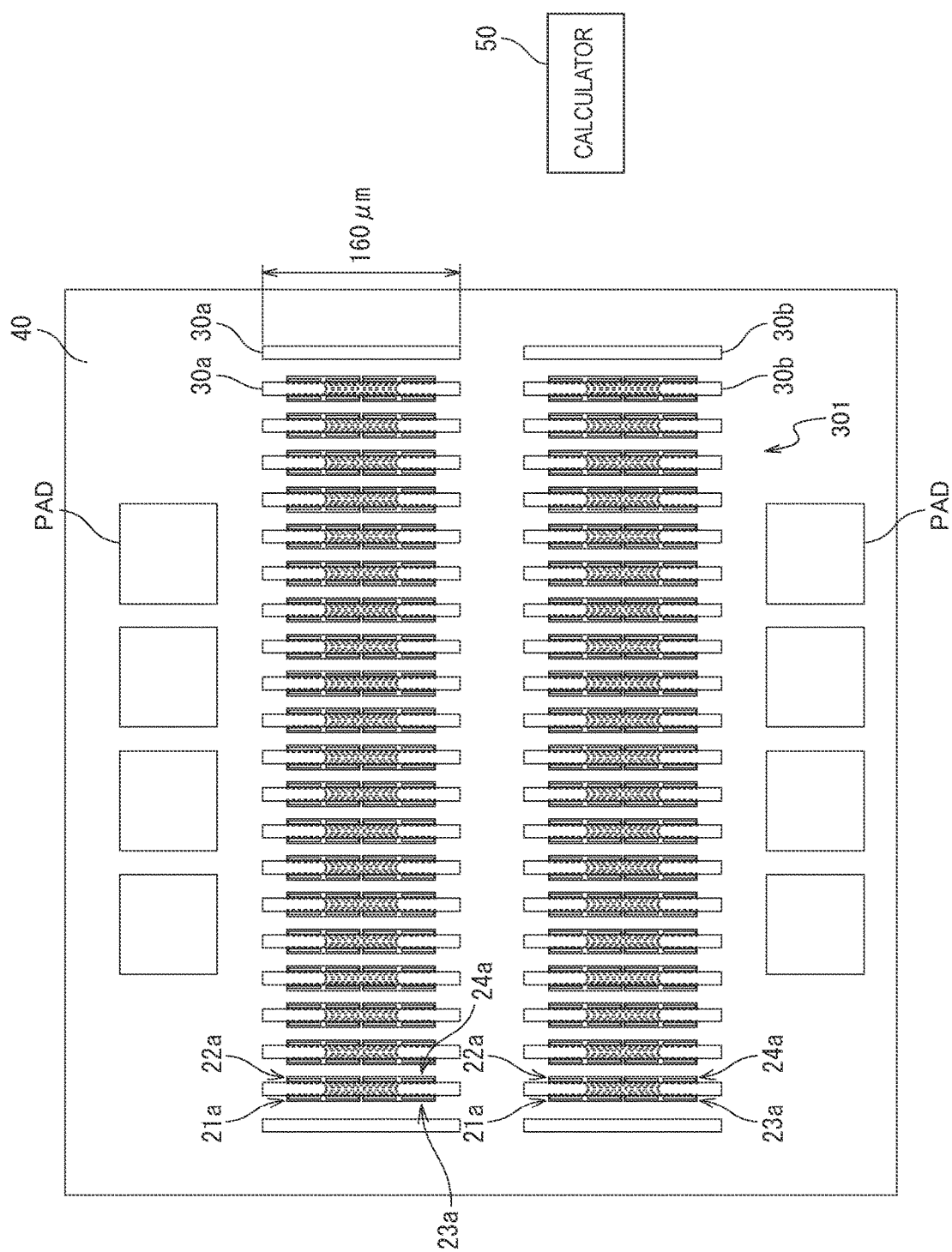
FIG. 12 is a configuration diagram illustrating a second modification.
Figure 13A:
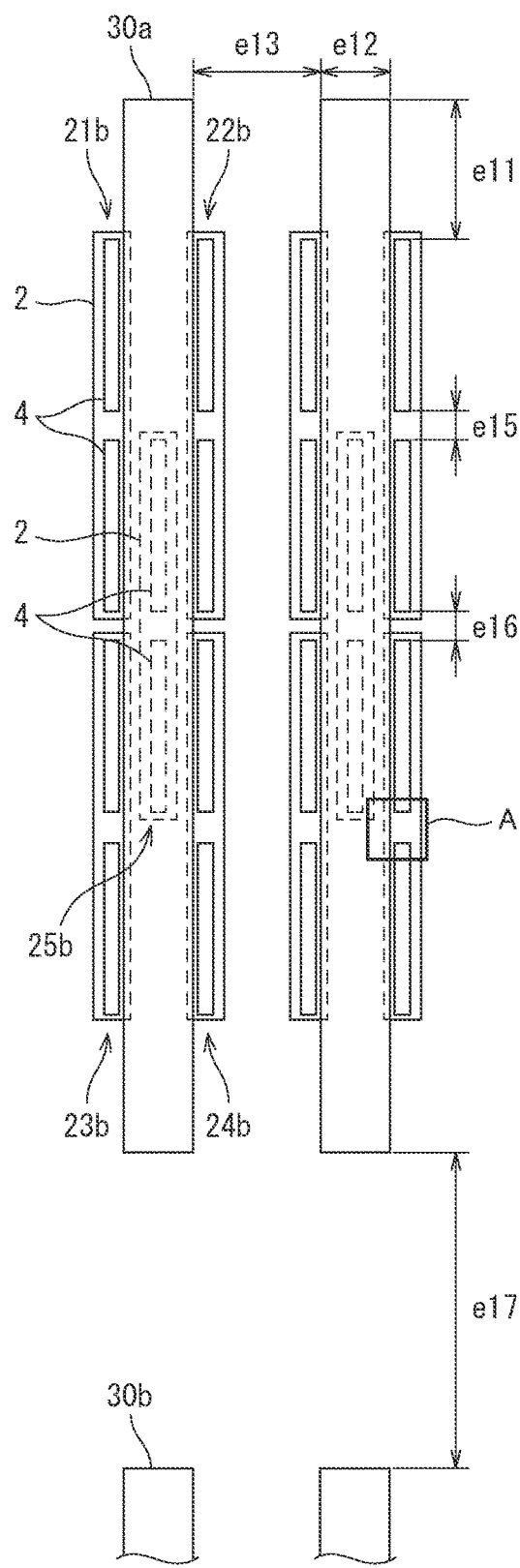
FIGS. 13A and 13B are enlarged views of a portion of FIG. 12.

FIG. 12 is a view illustrating a whole configuration of a magnetic sensor in the second modification. FIG. 13A is an enlarged view of a portion of FIG. 12 and FIG. 13B is an enlarged view of a portion A of FIG. 13A.

Figure 13B:
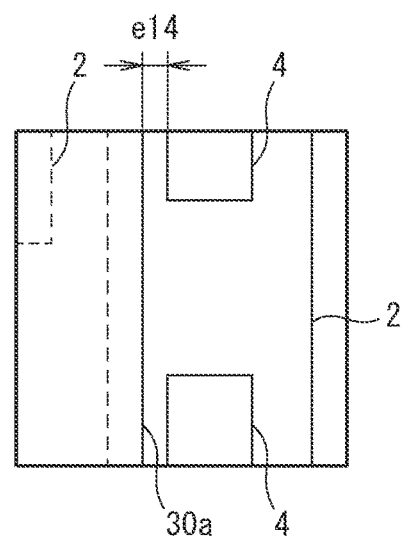

As illustrated in FIG. 12, and FIGS. 13A and 13B, the magnetic sensor in the second modification is obtained by modifying the magnetic sensor in the first modification illustrated in FIG. 10 and FIGS. 11A and 11B to divide each of the magnetic flux concentrator members 30 into two in a direction perpendicular to the longitudinal direction, and includes two magnetic flux concentrator members 30a and 30b.

The magnetic sensor includes a magnetic flux concentrator unit 301 in which plural sets of the magnetic flux concentrator member 30a and the magnetic flux concentrator member 30b arranged in a line extending in the longitudinal direction are further arranged in parallel in the lateral direction.

As illustrated in FIG. 12, and FIGS. 13A and 13B, magnetic detectors 21b to 24b corresponding to the magnetic detectors 21 to 24 of the magnetic sensor 102 in the second embodiment illustrated in FIGS. 7A and 7B are arranged in each of the magnetic flux concentrator members 30a and 30b, and a magnetic detector 25b is arranged at the center of each magnetic flux concentrator member in the longitudinal direction.

Each of the magnetic detectors 21b to 25b includes two TMR elements as a magnetic detection element, two pinned layers 2 are arranged in the longitudinal direction of the magnetic flux concentrator members 30a and 30b at a predetermined interval and two free layers 4 are arranged in the longitudinal direction of the magnetic flux concentrator members 30a and 30b at a predetermined interval in each of the two pinned layers 2, and thus the two TMR elements are arranged in the longitudinal direction of the magnetic flux concentrator members 30a and 30b at predetermined intervals.

It is to be noted that, in FIG. 12, reference numeral 40 denotes the substrate on which the magnetic sensor is formed, reference symbols PADs denote the pads for extracting output signals of the magnetic detection elements included in each of the magnetic detectors 21b to 25b. In addition, magnetic flux concentrator members 30a and 30b at which the magnetic detectors 21b to 25b are not provided are arranged on each of both ends of the direction in which a line of the plural pairs of the magnetic flux concentrator members 30a and 30b arranged in parallel to each other extends. The output signal of each of the magnetic detectors 21b to 25b is input to the calculator 50. The calculator 50 is configured to perform a predetermined calculation processing based on the output signals to calculate the magnetic field in the direction of the second axis perpendicular to the first axis that is the direction of the sensitivity axes of the magnetic detectors, and the magnetic field in the direction of the third axis perpendicular to the first axis and the second axis.

Each of the magnetic detectors 21b to 25b and the magnetic flux concentrator member 30a are formed so as to satisfy the following conditions in plan view. It is to be noted that the same applies to a relationship between each of the magnetic detectors 21b to 25b and the magnetic flux concentrator member 30b.

When e11 refers to a distance between one end of the magnetic flux concentrator member 30a in the longitudinal direction and the end portion of each free layer 4 located adjacent to the one end, and similarly, when e11 refers to a distance between the other end of the magnetic flux concentrator member 30a in the longitudinal direction and the end portion of each free layer 4 located adjacent to the other end, the distance e11 is preferably equal to or larger than 0 μm and equal to or smaller than 30 μm, is more preferably equal to or larger than 5 μm and equal to or smaller than 25 μm, and is further preferably equal to or larger than 5 μm and equal to or smaller than 24 μm. The distance e11, for example, may be 0 μm, 5 μm, 10 μm, 15 μm, 20 μm, 24 μm, 25 μm, 26 μm, 27 μm, 28 μm, 29 μm, or 30 μm.

A length of the magnetic flux concentrator member 30a in the lateral direction, that is, a width e12 is preferably equal to or larger than 5 μm and equal to or smaller than 30 μm, is more preferably equal to or larger than 8 μm and equal to or smaller than 12 μm, and is further preferably 10 μm. The width e12, for example, may be 5 μm, 6 μm, 7 μm, 8 μm, 9 μm, 10 μm, 11 μm, 12 μm, 15 μm, 20 μm, 25 μm, or 30 μm. In addition, the length of the magnetic flux concentrator member 30a in the longitudinal direction may be, for example, 160 μm.

A distance e13 between the magnetic flux concentrator members 30a is preferably equal to or larger than 10 μm and equal to or smaller than 100 μm, is more preferably equal to or larger than 20 μm and equal to or smaller than 50 μm, and is further preferably equal to or larger than 25 μm and equal to or smaller than 32 μm. The distance e13, for example, may be 10 μm, 20 μm, 25 μm, 32 μm, 40 μm, 50 μm, 60 μm, or 100 μm.

As illustrated in FIG. 13B, in the magnetic flux concentrator member 30a, a distance e14 between an end portion of each of the magnetic detectors 21b to 24b on the free layer 4 side and an end portion of the free layer 4 on a magnetic flux concentrator member 30a side is preferably equal to or larger than 0 μm and equal to or smaller than 10 μm, and is further preferably equal to or larger than 1 μm and equal to or smaller than 2 μm. The distance e14, for example, may be 0 μm, 0.5 μm, 1 μm, 1.5 μm, 2 μm, or 10 μm.

A distance e15 between the two free layers 4 arranged in the same pinned layer 2 and a distance e16 between the free layers 4 that are arranged in the two pinned layers 2, respectively, are preferably equal to or larger than 5 μm and equal to or smaller than 10 μm, are more preferably 5 μm, 6 μm, or 8 μm. The distances e15 and e16, for example, may be 5 μm, 6 μm, 8 μm, 10 μm, 154 μm, or 188 μm. The distance e15 may be equal to or different from the distance e16. When the distance e15 equals to the distance e16, the distances e15 and e16 may be set to 8 μm, for example.

A distance e17 between the magnetic flux concentrator member 30a and the magnetic flux concentrator member 30b is preferably equal to or larger than 10 μm and equal to or smaller than 100 μm, and is further preferably equal to or larger than 20 μm and equal to or smaller than 50 μm. The distance e17, for example, may be 10 μm, 20 μm, 25 μm, 30 μm, 32 μm, 35 μm, 40 μm, 45 μm, 50 μm, 80 μm, or 100 μm.

When the magnetic flux concentrator member 30a and the magnetic detectors 21b to 25b arranged around the magnetic flux concentrator member 30a are formed as a first repeated pattern and the magnetic flux concentrator member 30b and the magnetic detectors 21b to 25b arranged around the magnetic flux concentrator member 30b are formed as a second repeated pattern, the magnetic detector 21b included in the first repeated pattern is connected to the magnetic detector 21b in another first repeated pattern and/or the magnetic detector 21b included in the second repeated pattern via wiring in series with each other. That is, a magnetic detection element included in the magnetic detector 21b in the first repeated pattern is connected to a magnetic detection element included in the magnetic detector 21b in the other first repeated pattern and/or a magnetic detection element included in the magnetic detector 21b in the second repeated pattern in series with each other. However, all of the magnetic detectors 21b included in the repeated patterns do not have to be connected in series with each other, and some magnetic detectors 21b are not needed to be connected with another magnetic detector 21b.

The number of the magnetic detection elements connected in series is preferably equal to or larger than eight and equal to or smaller than 100, is more preferably equal to or larger than 12 and equal to or smaller than 80, and is further preferably equal to or larger than 24 and equal to or smaller than 56. The number of the magnetic detection elements connected in series, for example, may be 16, 20, 24, 28, 32, 36, 40, 44, 48, 52, or 56.

Similarly to the magnetic detector 21b, the magnetic detectors 22b to 25b are connected with the magnetic detectors 22b to 25b included in another repeated pattern in series with each other, respectively.

(Third Modification)

Figure 14:
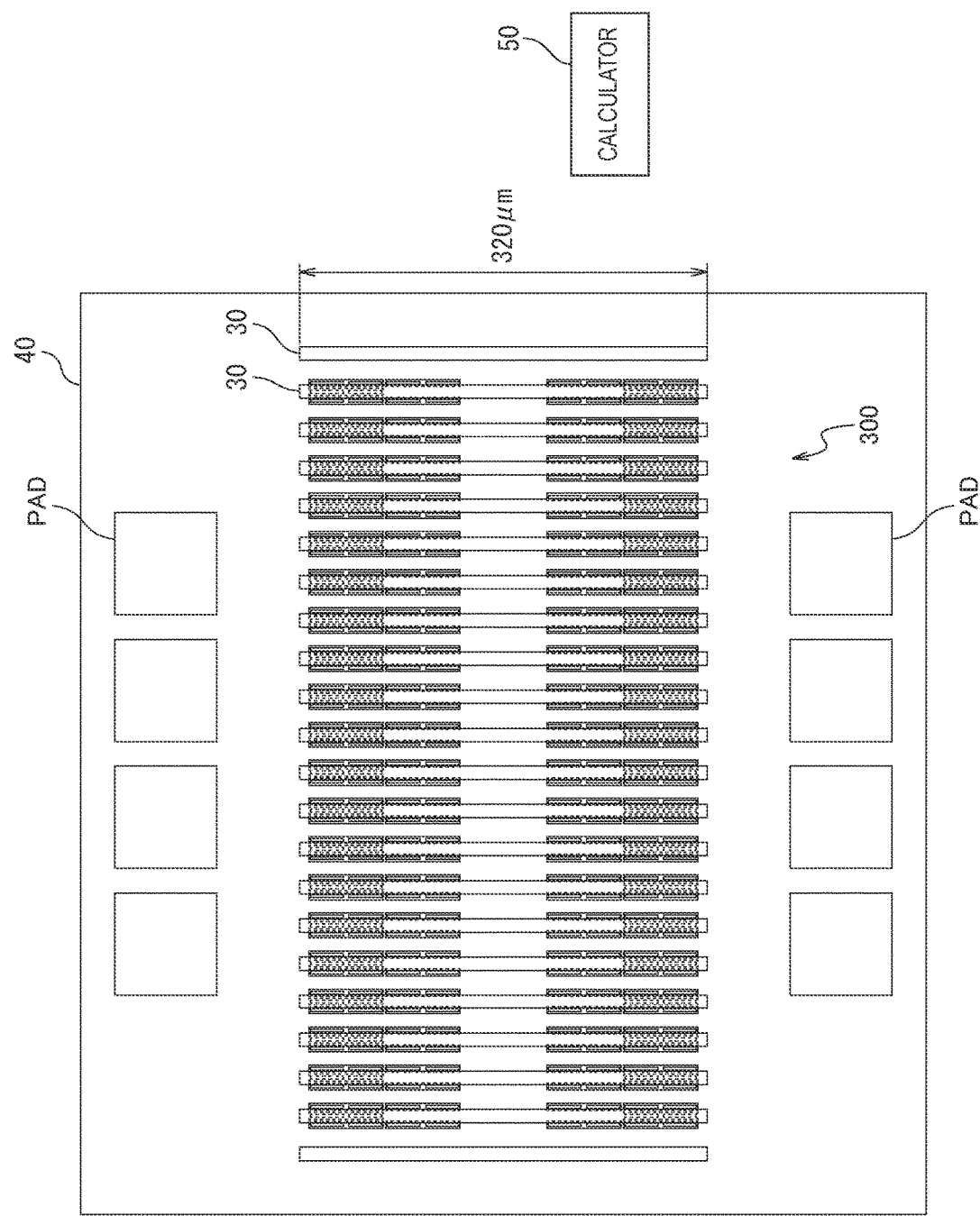
FIG. 14 is a configuration diagram illustrating a third modification.
Figure 15A:
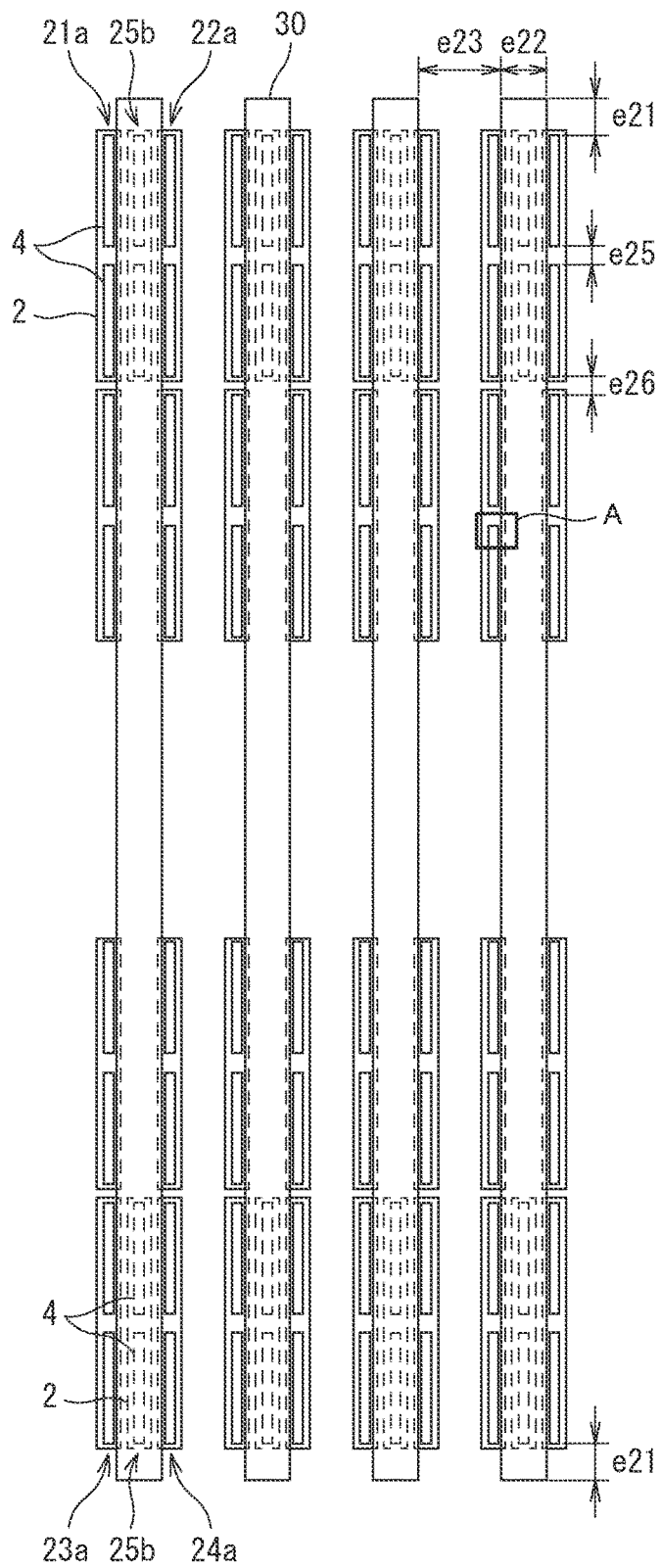
FIGS. 15A and 15B are enlarged views of a portion of FIG. 14.

FIG. 14 is a view illustrating a whole configuration of a magnetic sensor in the third modification. FIG. 15A is an enlarged view of a portion of FIG. 14 and FIG. 15B is an enlarged view of a portion A of FIG. 15A.

Figure 15B:
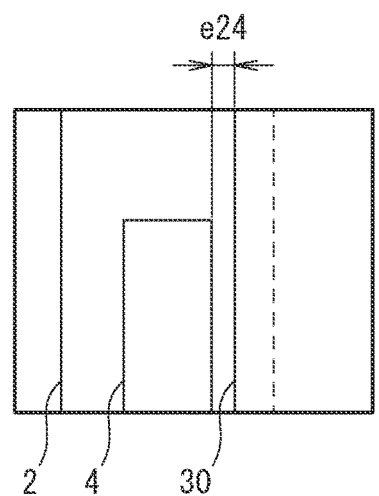

As illustrated in FIG. 14, and FIGS. 15A and 15B, the magnetic sensor in the third modification is obtained by modifying the magnetic sensor in the first modification illustrated in FIG. 10 and FIGS. 11A and 11B to divide the magnetic detector 25a into two magnetic detectors and to make distances between the free layers 4 the same in each of the magnetic detectors 21a to 24a.

That is, as illustrated in FIG. 14, and FIGS. 15A and 15B, the magnetic sensor in the third modification includes two magnetic detector 25b instead of the magnetic detector 25a.

This magnetic detector 25b is similar to the magnetic detector 25b in the second modification. Two free layers 4 are arranged at a predetermined interval in one pinned layer 2, and thus two TMR elements are formed.

It is to be noted that, in FIG. 14, reference numeral 40 denotes the substrate on which the magnetic sensor is formed, reference symbols PAD denote the pads for extracting output signals of the magnetic detection elements included in each of the magnetic detectors 21a to 24a and 25b. In addition, a magnetic flux concentrator member 30 at which the magnetic detectors 21a to 24a and 25b are not provided is arranged on each of both ends of the direction in which a line of the plural magnetic flux concentrator members 30 arranged in parallel to each other extends. The output signal of each of the magnetic detectors 21a to 24a and 25b is input to the calculator 50. The calculator 50 is configured to perform a predetermined calculation processing based on the output signals to calculate the magnetic field in the direction of the second axis perpendicular to the first axis that is the direction of the sensitivity axes of the magnetic detectors, and the magnetic field in the direction of the third axis perpendicular to the first axis and the second axis.

Each of the magnetic detectors 21a to 24a, and 25b and the magnetic flux concentrator member 30 are formed so as to satisfy the following conditions in plan view. That is, when e21 refers to a distance between one end of the magnetic flux concentrator member 30 in the longitudinal direction and the end portion of each free layer 4 located adjacent to the one end, and similarly, when e21 refers to a distance between the other end of the magnetic flux concentrator member 30 in the longitudinal direction and the end portion of each free layer 4 located adjacent to the other end, the distance e21 is preferably equal to or larger than 0 µm and equal to or smaller than 30 µm, is more preferably equal to or larger than 5 µm and equal to or smaller than 20 µm, and is further preferably equal to or larger than 10 µm and equal to or smaller than 15 µm. The distance e21, for example, may be 0 µm, 5 µm, 10 µm, 15 µm, 20 µm, 25 µm, or 30 µm.

A length of the magnetic flux concentrator member 30 in the lateral direction, that is, a width e22 is preferably equal to or larger than 5 µm and equal to or smaller than 30 µm, is more preferably equal to or larger than 8 µm and equal to or smaller than 12 µm, and is further preferably 10 µm. The width e22, for example, may be 5 µm, 6 µm, 7 µm, 8 µm, 9 µm, 10 µm, 11 µm, 12 µm, 15 µm, 20 µm, 25 µm, or 30 µm. In addition, the length of the magnetic flux concentrator member 30 in the longitudinal direction may be, for example, 320 µm.

A distance e23 between the magnetic flux concentrator members 30 is preferably equal to or larger than 10 µm and equal to or smaller than 100 µm, is more preferably equal to or larger than 20 µm and equal to or smaller than 50 µm, and is further preferably equal to or larger than 25 µm and equal to or smaller than 32 µm. The distance e23, for example, may be 10 µm, 15 µm, 20 µm, 25 µm, 30 µm, 32 µm, 35 µm, 40 µm, 45 µm, 50 µm, 55 µm, 60 µm, or 100 µm.

As illustrated in FIG. 15B, in the magnetic flux concentrator member 30, a distance e24 between an end portion of each of the magnetic detectors 21a to 24a on the free layer 4 side and an end portion of the free layer 4 on the magnetic flux concentrator member 30 side is preferably equal to or larger than 0 µm and equal to or smaller than 10 µm, and is further preferably equal to or larger than 1 µm and equal to or smaller than 2 µm. The distance e24, for example, may be 0 µm, 0.5 µm, 1 µm, 1.5 µm, 2 µm, or 10 µm.

A distance e25 between the two free layers 4 arranged in the same pinned layer 2 and a distance e26 between the free layers 4 that are arranged in the two pinned layers 2, respectively, are the same, for example 8 µm.

Similarly to the first modification, when the magnetic flux concentrator member 30 and the magnetic detectors 21a to 24a, 25b are formed as one repeated pattern, the magnetic detectors 21a to 24a, and 25b included in one repeated pattern are connected to the magnetic detectors 21a to 24a, and 25b in another repeated pattern, respectively, via wiring in series with each other. The number of the magnetic detection elements connected in series is the same as that of the first modification.

Fourth Embodiment

Next, a fourth embodiment of the present invention will be described below.

Figures 16A, 16B:
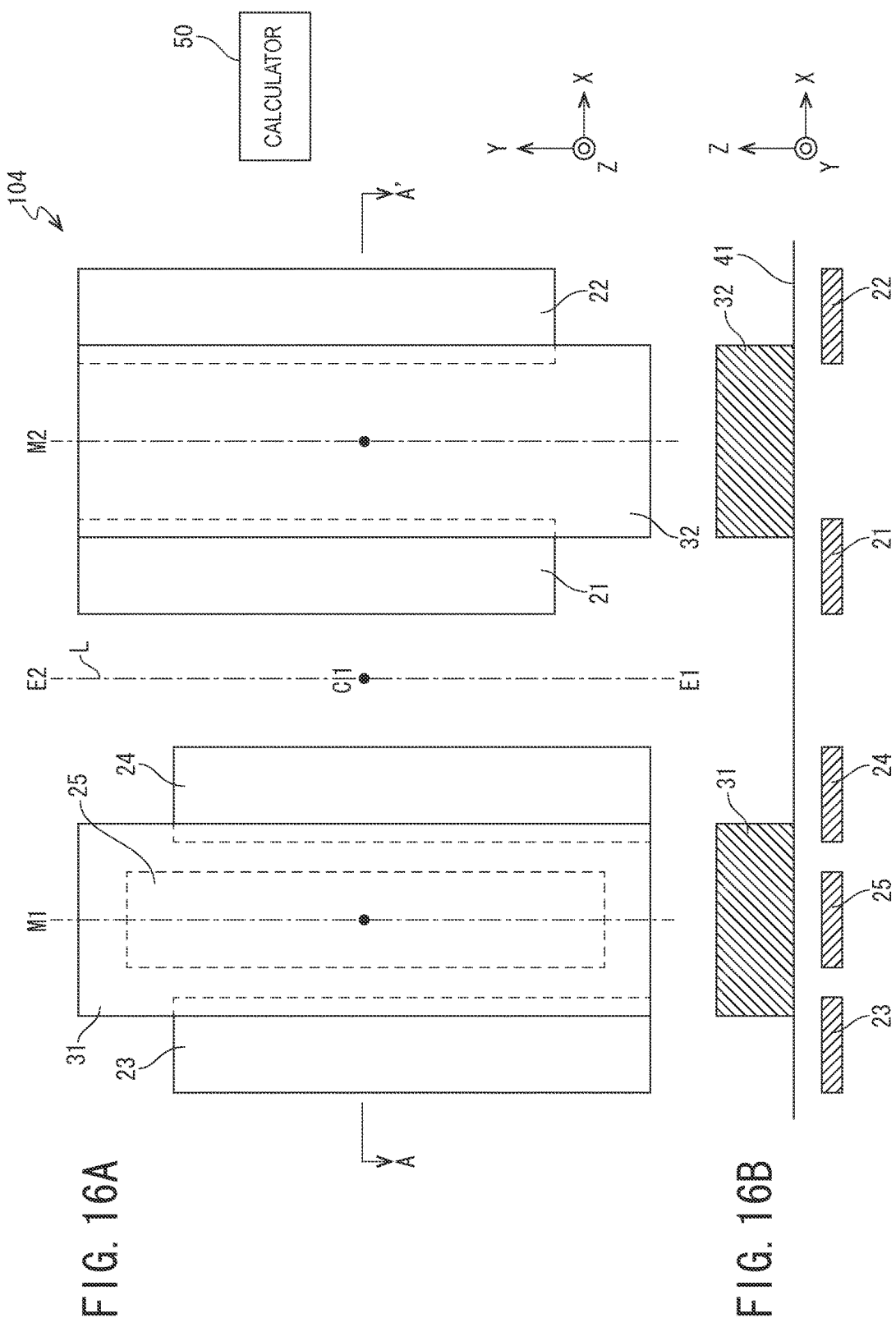
FIGS. 16A and 16B are configuration diagrams illustrating an example of a fourth embodiment of the present invention.

FIGS. 16A and 16B are configuration diagrams illustrating an example of a magnetic sensor 104 in a fourth embodiment of the present invention.

FIG. 16A is a schematic plan view (the substrate is not illustrated) of the magnetic sensor 104, and FIG. 16B is a schematic sectional view taken along line A-A' of FIG. 16A. In the drawings, reference numerals 21 to 25 denote the first to fifth magnetic detectors, reference numeral 31 denotes a first magnetic flux concentrator member, reference numeral 32 denotes a second magnetic flux concentrator member, the reference numeral 41 denotes the substrate surface. In FIGS. 16A and 16B, the first to fifth magnetic detectors 21 to 25 are formed in the substrate such as a semiconductor substrate, for example, in parallel to the substrate surface 41. The first magnetic flux concentrator member 31 and the second magnetic flux concentrator member 32 are formed on the semiconductor substrate. That is to say, as illustrated in FIG. 16B, the third and fourth magnetic detectors 23 and 24 are arranged below the first magnetic flux concentrator member 31, and the first and second magnetic detectors 21 and 22 are arranged below the second magnetic flux concentrator member 32. These first to fifth magnetic detectors 21 to 25 and the first and second magnetic flux concentrator members 31 and 32 form a detection unit, and output signals of the first to fifth magnetic detectors 21 to 25 are input to the calculator 50. The calculator 50 is configured to perform a predetermined calculation processing to calculate the magnetic field in the direction of the second axis perpendicular to the first axis that is the direction of the sensitivity axes of the magnetic detectors, and the magnetic field in the direction of the third axis perpendicular to the first axis and the second axis.

In the magnetic sensor 104 in the fourth embodiment, the first and second magnetic flux concentrator members 31 and 32 have the same shape. The first and second magnetic flux concentrator members 31 and 32 may have a rectangular shape in plan view, and in FIGS. 16A and 16B, may have a long narrow rectangular plate shape in plan view, for example.

The first to fifth magnetic detectors 21 to 25 have the same shape that is a long narrow and thin rectangular plate shape in plan view. The thicknesses, widths, and lengths of the first to fifth magnetic detectors 21 to 25 are shorter than those of the first and second magnetic flux concentrator members 31 and 32, respectively.

The third and fourth magnetic detectors 23 and 24 are arranged, in plan view, adjacent to edge portions on both sides of the first magnetic flux concentrator member 31 to sandwich the first magnetic flux concentrator member such that an edge portion on the left side of the first magnetic flux concentrator member 31 extending in the longitudinal direction thereof overlaps with only an edge portion on the right side of the third magnetic detector 23 extending in the longitudinal direction thereof, in FIGS. 16A and 16B. Similarly, the third and fourth magnetic detectors are arranged such that an edge portion on the right side of the first magnetic flux concentrator member 31 extending in the longitudinal direction thereof overlaps with only an edge portion on the left side of the fourth magnetic detector 24 extending in the longitudinal direction thereof in plan view.

In addition, when one end of each of the first and second magnetic flux concentrator members 31 and 32 in the longitudinal direction thereof is referred to as an E1 side and the other end is referred to as an E2 side, the third and fourth magnetic detectors 23 and 24 are arranged such that an end portion of the first magnetic flux concentrator member 31 on the E1 side in the longitudinal direction thereof coincides with end portions of the third and fourth magnetic detectors in plan view. That is, in plan view, the third and fourth magnetic detectors 23 and 24 are not arranged at edge portions on the both sides of the end portion of the first magnetic flux concentrator member 31 on the E2 side in the longitudinal direction thereof.

The first and second magnetic detectors 21 and 22 are arranged, in plan view, adjacent to edge portions on both sides of the second magnetic flux concentrator member 32 to sandwich the second magnetic flux concentrator member, such that an edge portion on the left side of the second magnetic flux concentrator member 32 extending in the longitudinal direction thereof overlaps with only an edge portion on the right side of the first magnetic detector 21 extending in the longitudinal direction thereof. Similarly, the first and second magnetic detectors are arranged such that an edge portion on the right side of the second magnetic flux concentrator member 32 extending in the longitudinal direction thereof overlaps with only an edge portion on the left side of the second magnetic detector 22 extending in the longitudinal direction thereof in plan view.

In addition, the first and second magnetic detectors 21 and 22 are arranged such that an end portion of the second magnetic flux concentrator member 32 on the E2 side in the longitudinal direction thereof coincides with end portions of the first and second magnetic detectors in the longitudinal directions thereof in plan view. That is, in plan view, the first and second magnetic detectors 21 and 22 are not arranged at edge portions on the both sides of the end portion of the second magnetic flux concentrator member 32 on the E1 side in the longitudinal direction thereof.

Furthermore, in plan view of the substrate, the third and fourth magnetic detectors 23 and 24 are arranged at axisymmetric positions with respect to a center line M1 of the first magnetic flux concentrator member 31 in the longitudinal direction thereof, and in plan view of the substrate, the first and second magnetic detectors 21 and 22 are arranged at axisymmetric positions with respect to a center line M2 of the second magnetic flux concentrator member 32 in the longitudinal direction thereof. It is to be noted that, as described above, the center line means, in a case of the first magnetic flux concentrator member 31 for example, a line passing through a center point of the first magnetic flux concentrator member 31 (a center both of in length and in width in plan view) and being parallel to the longitudinal direction or the lateral direction thereof. The center line in the longitudinal direction means a center line passing through the center point and extending in the longitudinal direction. The center line in the lateral direction means a center line passing through the center point and extending in the lateral direction.

In addition, in plan view of the substrate, a member including the first magnetic flux concentrator member 31 and the third and fourth magnetic detectors 23 and 24, and a member including the second magnetic flux concentrator member 32 and the first and second magnetic detectors 21 and 22 are arranged to be point-symmetric with respect to a point C1.

As illustrated in the cross-sectional view in FIG. 16B, the fifth magnetic detector 25 is arranged in the same plane on which the third and fourth magnetic detectors 23 and 24 are formed and between the third and fourth magnetic detectors 23 and 24, such that a center point of the magnetic flux concentrator member 31 coincides with a center point of the fifth magnetic detector 25. That is, the fifth magnetic detector 25 completely overlaps with the first magnetic flux concentrator member 31 in plan view.

A magnetic detection method in three-axis directions by using the magnetic sensor 104 of the fourth embodiment in a case in which the magnetic field B is applied will be described below.

It is to be noted that the first axis is referred to as the X axis, the second axis is referred to as the Y axis, and the third axis is referred to as the Z axis, for convenience' sake. GMR elements are used as the first to fifth magnetic detectors 21 to 25.

R0 refers to the resistances of the first to fifth magnetic detectors 21 to 25 when no magnetic field is applied thereto.

A magnetization direction of the pinned layer is set to the X-axis direction and the magnetization easy axis of the free layer is set to the Y-axis direction so as to set all of the sensitivity axes of the first to fifth magnetic detectors 21 to 25 to the X-axis direction. That is, the resistances change depending on the X-axis component of the magnetic field applied to each of the first to fifth magnetic detectors 21 to 25.

$\alpha$ refers to the sensitivity of the resistance change when the magnetic field is applied in the direction of the sensitivity axis. That is, the resistance R of the magnetic detector becomes $R=R0+\alpha B1$, when the magnetic field B1 is applied in the direction of the sensitivity axis of the magnetic detector.

Herein, resistances (R1 to R5) of the respective elements (the magnetic detectors 21 to 25) are calculated based on change amounts of currents by driving the respective GMT elements as the magnetic detectors 21 to 25 at the constant voltage or the constant current. For the purpose of simplifying the description, a calculation principle based on the resistance will be described below, however, the magnetic field of each of the three axes can be calculated based on the output signal (current or voltage) itself in an actual magnetic sensor.

By vector-resolving the input magnetic field B into components of the X axis, the Y axis and the Z axis, $B=Bx+By+Bz$ is obtained.

As illustrated in FIG. 17A, the magnetic field Bx of the X-axis component is concentrated by the first and second magnetic flux concentrator members 31 and 32 at the conversion coefficient a. Because of the symmetry of an arrangement of the first and second magnetic flux concentrator members 31 and 32 and the first to fourth magnetic detectors 21 to 24, the magnetic field Bx of the X-axis component is input to all of the first to fourth magnetic detectors 21 to 24 as aBx in the positive direction. On the other hand, since the fifth magnetic detector 25 is completely covered (overlapped) with the first magnetic flux concentrator member 31, the magnetic field in the X-axis direction is not input thereto.

It is to be noted that an upper portion of FIG. 17A is a schematic plan view and a lower portion is a schematic sectional view.

As illustrated in FIG. 17B, the magnetic field By of the Y-axis component is concentrated by the first and second magnetic flux concentrator members 31 and 32. The magnetic field acts on end portions on the E2 side of the first and second magnetic detectors 21 and 22, and end portions on the E1 side of the third and fourth magnetic detectors 23 and 24 obliquely with respect to the Y axis. Therefore, the magnetic field By is converted to the X-axis direction at the conversion coefficient b, and then is input to the first to fourth magnetic detectors 21 to 24. The magnitude of all of the input magnetic fields are the same because of the symmetry of the arrangement of the first and second magnetic flux concentrator members 31 and 32 and the first to fourth magnetic detectors 21 to 24.

Since the sensitivity axis of each of the first to fourth magnetic detectors 21 to 24 is set to the X-axis direction, bBy is input to the first and fourth magnetic detectors 21 and 24 in the negative direction and bBy is input to the second and third magnetic detectors 22 and 23 in the positive direction. On the other hand, since the fifth magnetic detector 25 is completely covered with the first magnetic flux concentrator member 31, the converted magnetic field in the X-axis direction is not input thereto.

As illustrated in a schematic sectional view in FIG. 17C, the magnetic field Bz of the Z-axis component is concentrated by the first and second magnetic flux concentrator members 31 and 32. Since the magnetic field acts on the first to fourth magnetic detectors 21 to 24 obliquely with respect to the Z axis, the magnetic field is converted at the conversion coefficient c to the X-axis direction, and then is input to the first to fourth magnetic detectors 21 to 24. The magnitude of all of the input magnetic fields are the same because of the symmetry of the arrangement of the first and second magnetic flux concentrator members 31 and 32 and the first to fourth magnetic detectors 21 to 24. cBz is input to the first and third magnetic detectors 21 and 23 in the positive direction and cBz is input to the second and fourth magnetic detectors 22 and 24 in the negative direction. On the other hand, since the fifth magnetic detector 25 is completely covered (overlapped) with the first magnetic flux concentrator member 31, the converted magnetic field in the X-axis direction is not input thereto.

Based on the above, the resistances R1 to R5 of the first to fifth magnetic detectors 21 to 25 when the magnetic field B is applied are represented by following expressions (1-4) to (5-4).

$$R1 = \Delta \times (aBx - bBy + cBz) + R0 \quad (1\text{-}4)$$

$$R2 = \Delta \times (aBx + bBy - cBz) + R0 \quad (2\text{-}4)$$

$$R3 = \Delta \times (aBx + bBy + cBz) + R0 \quad (3\text{-}4)$$

$$R4 = \Delta \times (aBx - bBy - cBz) + R0 \quad (4\text{-}4)$$

$$R5 = R0 \quad (5\text{-}4)$$

Herein, as represented by expression (6-4), the resistance depending on only the magnetic field Bz of the Z-axis component is calculated from "expression (3-4)−expression (2-4)".

$$R3 - R2 = 2\alpha c Bz \quad (6\text{-}4)$$

The same applies to "expression (1-4)−expression (4-4)".

Furthermore, as represented by expression (7-4), the resistance depending on only the magnetic field By of the Y-axis component is calculated from "expression (3-4)−expression (1-4)".

$$R3 - R1 = 2\alpha b By \quad (7\text{-}4)$$

The same applies to "expression (2-4)−expression (4-4)".

Furthermore, the resistance depending on only the magnetic field Bx of the X-axis component is calculated from "expression (1-4)+expression (2-4)−2×expression (5-4)".

$$R1 + R2 - 2 \times R5 = 2\alpha a Bx \quad (8\text{-}4)$$

The same applies to "expression (3-4)+expression (4-4)−2×expression (5-4)".

Based on expressions (6-4) to (8-4), it turns out that the resistance depending on only each of the X-axis component, the Y-axis component and the Z-axis component can be calculated by using the magnetic sensor 104 of the fourth embodiment. Therefore, the magnetic field in each axis direction of the X-axis, Y-axis, and Z-axis components can be independently detected based on the resistances each of which depends on only each of the X-axis component, the Y-axis component and the Z-axis component.

Then, as understood from the calculation described above, it is possible to achieve the detection with a simple circuit configuration. This configuration eliminates the need for signal amplification processing for detecting the magnetic field with high accuracy or complicated signal processing. Thus, it is possible to obtain a small magnetic sensor capable of detecting the magnetic fields in the directions of the three orthogonal axes on an identical substrate without causing an increase in consumption current or upsizing.

It is to be noted that the resistance depending on only each of the X-axis component, the Y-axis component and the Z-axis component may be calculated from expression (6-4), expression (7-4) and expression (8-4). The resistance depending on only the magnetic field Bz of the Z-axis component, for example, may be calculated from both of a value calculated from "R3−R2" in accordance with expression (6-4) and a value calculated from "R1−R4" in accordance with "expression (1-4)−expression (4-4), by calculating an average of both of these values, for example. The same applies to the magnetic field Bx of the X-axis component and the magnetic field By of the Y-axis component.

Fifth Embodiment

Next, a fifth embodiment of the present invention will be described below.

FIGS. 18A and 18B are configuration diagrams illustrating an example of a magnetic sensor 105 in a fifth embodiment of the present invention. It is to be noted that FIG. 18A is a schematic plan view (the substrate is not illustrated) of the magnetic sensor 105, and FIG. 18B is a schematic sectional view taken along line A-A' of FIG. 18A.

The magnetic sensor 105 in the fifth embodiment is different from the magnetic sensor 104 in the fourth embodiment in that the magnetic sensor 105 further includes a sixth magnetic detector 26 and that the sixth magnetic detector 26 is covered with the second magnetic flux concentrator member 32.

That is to say, as illustrated in FIGS. 18A and 18B, the sixth magnetic detector 26 has the same shape as those of the first to fifth magnetic detector 21 to 25, and is arranged such that a center point of the sixth magnetic detector 26 coincides with a center point of the second magnetic flux concentrator member 32 in plan view. In addition, the sixth magnetic detector 26 is arranged in the same plane on which the first and second magnetic detectors 21 and 22 are formed and arranged between the first magnetic detector 21 and the second magnetic detector 22.

Then, in plan view of the substrate, a member including the first magnetic flux concentrator member 31 and the third, fourth, and fifth magnetic detectors 23, 24, and 25 and a member including the second magnetic flux concentrator member 32 and the first, second, and sixth magnetic detectors 21, 22, and 26 are arranged to be point-symmetric with respect to a point C1.

Then, the output signals of the first to sixth magnetic detectors 21 to 26 are input to the calculator 50. The calculator 50 is configured to perform a predetermined calculation processing to calculate the magnetic field in the direction of the second axis perpendicular to the first axis that is the direction of the sensitivity axes of the magnetic detectors, and the magnetic field in the direction of the third axis perpendicular to the first axis and the second axis.

Since it is provided with the six magnetic detector 26, a sum of the resistance R5=R0 of the fifth magnetic detector 25 and a resistance R6=R0 of the sixth magnetic detector 26 only have to be calculated instead of doubling R5 in expression (8-4) described above. That is to say, the fifth embodiment is preferable since a multiplication circuit is unnecessary and the magnetic sensor can be smaller.

It is to be noted that, in the fourth and fifth embodiments, there is described a case where the third and fourth magnetic detectors 23 and 24 are arranged such that, in plan view, the end portions on the E1 side of the third and fourth magnetic detectors in the longitudinal direction thereof coincide with the end portion on the E1 side of the first magnetic flux concentrator member 31 in the longitudinal direction thereof, and the first and second magnetic detectors 21 and 22 are arranged such that the end portions on the E2 side of the first and second magnetic detectors in the longitudinal direction thereof coincide with the end portion on the E2 side of the second magnetic flux concentrator member 32 in the longitudinal direction thereof, however the present invention is not limited thereto.

For example, in plan view, the third and fourth magnetic detectors 23 and 24 may be located outside in some degree with respect to the first magnetic flux concentrator member 31 illustrated in FIGS. 16A and 16B in the longitudinal direction thereof, or conversely, the third and fourth magnetic detectors 23 and 24 may be located inside in some degree with respect to the first magnetic flux concentrator member 31 in the longitudinal direction thereof. The same applies to the relative relationship between the second magnetic flux concentrator member 32 and the first and second magnetic detectors 21 and 22.

In addition, the lengths of the first and second magnetic flux concentrator members 31 and 32 in the longitudinal direction thereof may be equal to the lengths of the magnetic detectors 21 to 24 in the longitudinal direction thereof. In a case where the lengths of the first and second magnetic flux concentrator members 31 and 32 in the longitudinal direction thereof are equal to the lengths of the first to fourth magnetic detectors 21 to 24 in the longitudinal direction thereof, the first to fourth magnetic detectors may be arranged such that the center lines of the magnetic flux concentrator members in their lateral direction do not overlap with the center lines of the magnetic detectors in their lateral direction in plan view.

The point is a positional relationship capable of inputting the magnetic field in the Y-axis direction converted to the X-axis direction into only one end side of the first to fourth magnetic detectors 21 to 24 in the longitudinal direction thereof.

Similarly, the third magnetic detector 23 and the fourth magnetic detector 24 do not have to overlap with the first magnetic flux concentrator member 31 in plan view, or conversely, may overlap more widely than the area illustrated in FIGS. 16A and 16B. The same applies to the relative relationship between the second magnetic flux concentrator member 32 and the first and second magnetic detectors 21 and 22. A positional relationship between the first magnetic flux concentrator member 31 and the third and fourth magnetic detectors 23 and 24, and a positional relationship between the second magnetic flux concentrator member 32 and the first and second magnetic detectors 21 and 22 only have to be a positional relationship capable of detecting the magnetic field in the Y-axis direction and the magnetic field in the Z-axis direction converted to the X-axis direction.

That is, the first magnetic flux concentrator member 31 and the second magnetic flux concentrator member 32 may be axisymmetric with respect to a line (line L) parallel to one side of the first magnetic flux concentrator member 31 in plan view. The third and fourth magnetic detectors 23 and 24 may be arranged so as to be close to the two corners of the four corners of the first magnetic flux concentrator member 31, respectively, such that each of these magnetic detectors is close to only each one of these two corners. The third and fourth magnetic detectors 23 and 24 and the first and second magnetic detectors 21 and 22 may be point-symmetric in plan view. In this configuration, end portions of the first to fourth magnetic detectors 21 to 24 in a first direction may or may not coincide with an end portion of the first or second magnetic flux concentrator member 31 or 32 in the first direction. The end portions of the first to fourth magnetic detectors in the first direction may be arranged inside or outside in some degree with respect to the end portion of the first or second magnetic flux concentrator member 31 or 32. That is to say, each of the first to fourth magnetic detectors 21 to 24 only has to be arranged at a location including an area where a direction of input magnetic field lines is changed by the first or second magnetic flux concentrator members 31 or 32.

In more detail, when it is assumed that a direction in which the above described parallel line (line L) extends is the first direction, the third magnetic detector 23 and the fourth magnetic detector 24 are axisymmetric with respect to a line (center line M1) in the first direction passing through the center point of the first magnetic flux concentrator member 31 in plan view, and the third and fourth magnetic detectors 23 and 24 and the first and second magnetic detectors 21 and 22 may be point-symmetric with respect to a midpoint (point C1) of a line connecting center points of the first and second magnetic flux concentrator members 31 and 32 in plan view.

It is to be noted that, as described above, the end portions of the first to fourth magnetic detectors 21 to 24 in the first direction do not have to coincide with the end portions of the first or second magnetic flux concentrator members 31 or 32 in the first direction in plan view. The end portions of the first to fourth magnetic detectors in the first direction may be deviated inside in some degree.

Sixth Embodiment

Next, a sixth embodiment of the present invention will be described below.

FIG. 19 is a schematic plan view (the substrate is not illustrated) illustrating an example of a magnetic sensor 106 in a sixth embodiment of the present invention. In the drawings, reference numerals 21 to 25 denote the first to fifth magnetic detectors, reference numeral 31 denotes the first magnetic flux concentrator member, reference numeral 32 denotes the second magnetic flux concentrator member. In FIG. 19, the first to fifth magnetic detectors 21 to 25 are provided in the substrate such as a semiconductor substrate, for example, in parallel to the substrate surface 41. The first magnetic flux concentrator member 31 and the second magnetic flux concentrator member 32 are formed on the semiconductor substrate. That is to say, the first and third magnetic detectors 21 and 23 are arranged below the first magnetic flux concentrator member 31, and the second and fourth magnetic detectors 22 and 24 are arranged below the second magnetic flux concentrator member 32, in plan view.

These first to fifth magnetic detectors 21 to 25 and the first and second magnetic flux concentrator members 31 and 32 form a detection unit, and output signals of the first to fifth magnetic detectors 21 to 25 are input to the calculator 50. The calculator 50 is configured to perform a predetermined calculation processing to calculate the magnetic field in the direction of the second axis perpendicular to the first axis that is the direction of the sensitivity axes of the magnetic detectors, and the magnetic field in the direction of the third axis perpendicular to the first axis and the second axis.

In the magnetic sensor 106 in the sixth embodiment, the first and second magnetic flux concentrator members 31 and 32 have the same shape. The first and second magnetic flux concentrator members 31 and 32 may have a rectangular shape in plan view, and in FIG. 19, may have a long narrow rectangular plate shape in plan view, for example.

The first to fifth magnetic detectors 21 to 25 have the same shape that is a long narrow and thin rectangular plate shape in plan view. The thicknesses, widths, and lengths of the first to fifth magnetic detectors 21 to 25 are shorter than those of the first and second magnetic flux concentrator members 31 and 32, respectively.

The lengths of the first and third magnetic detectors 21 and 23 in the longitudinal directions thereof are shorter than the half of the length of the first magnetic flux concentrator member 31. Then, when one end side of each of the first and second magnetic flux concentrator members 31 and 32 in the longitudinal direction thereof is referred to as the E1 side and the other end side is referred to as the E2 side, the first and third magnetic detectors 21 and 23 are arranged at the edge portion on the left side of the first magnetic flux concentrator members 31 extending in the longitudinal direction thereof such that the edge portion on the left side of the first magnetic flux concentrator members 31 extending in the longitudinal direction thereof overlaps with only edge portions on the right side of the first and third magnetic detectors 21 and 23 extending in the longitudinal direction thereof, in plan view. Furthermore, the first and third magnetic detectors 21 and 23 are arranged such that, in plan view, an end portion on the E2 side of the first magnetic flux concentrator member 31 in the longitudinal direction thereof coincides with an end portion on the E1 side of the first magnetic detector, and that an end portion on the E1 side of the first magnetic flux concentrator member 31 in the longitudinal direction thereof coincides with an end portion on the E1 side of the third magnetic detector, and that there is an interval between the first the magnetic detector 21 and the third magnetic detector 23.

Then, the first the magnetic detector 21 and the third magnetic detector 23 are arranged such that, in plan view of the substrate, they are axisymmetric with respect to a center line M3 passing through the center point of the first magnetic flux concentrator member 31 and being parallel to the lateral direction thereof.

Similarly, the lengths of the second and fourth magnetic detectors 22 and 24 in the longitudinal directions thereof are shorter than the half of the length of the second magnetic flux concentrator member 32 in the longitudinal direction thereof, in plan view. Then, the second and fourth magnetic detectors 22 and 24 are arranged at the edge portion on the right side of the second magnetic flux concentrator member 32 extending in the longitudinal direction thereof such that the edge portion on the right side of the second magnetic flux concentrator member 32 extending in the longitudinal direction thereof overlaps with only edge portions on the left side of the second and fourth magnetic detectors 22 and 24 extending in the longitudinal direction thereof, in plan view. Furthermore, the second and fourth magnetic detectors 22 and 24 are arranged such that, in plan view, an end portion on the E2 side of the second magnetic flux concentrator member 32 in the longitudinal direction thereof coincides with an end portion on the E2 side of the second magnetic detector, and that an end portion on the E1 side of the second magnetic flux concentrator member 32 in the longitudinal direction thereof coincides with an end portion on the E1 side of the fourth magnetic detector, and that there is an interval between the second the magnetic detector 22 and the fourth magnetic detector 24.

Then, the second the magnetic detector 22 and the fourth magnetic detector 24 are arranged such that, in plan view of the substrate, they are axisymmetric with respect to a center line M4 passing through a center point of the second magnetic flux concentrator member 32 and being parallel to the lateral direction thereof.

Furthermore, in plan view of the substrate, a member including the first magnetic flux concentrator member 31 and the first and third magnetic detectors 21 and 23 and a member including the second magnetic flux concentrator member 32 and the second and fourth magnetic detectors 22 and 24 are arranged to be axisymmetric with respect to the line L.

As illustrated in FIG. 19, the fifth magnetic detector 25 is arranged below the first magnetic flux concentrator member 31 such that the center point of the first magnetic flux concentrator member 31 coincides with the center point of the fifth magnetic detector 25 in plan view. Furthermore, the fifth magnetic detector 25 is completely covered (overlapped) with the first magnetic flux concentrator member 31 in plan view.

A magnetic detection method in three-axis directions by using the magnetic sensor 106 of the sixth embodiment in a case in which the magnetic field B is applied will be described below.

In the magnetic sensor 106, the magnetic field Bx of the X-axis component is concentrated by the first and second magnetic flux concentrator members 31 and 32 at the conversion coefficient a. Because of the symmetry of the arrangement of the first and second magnetic flux concentrator members 31 and 32 and the first to fourth magnetic detectors 21 to 24, the magnetic field Bx of the X-axis component is input to all of the first to fourth magnetic detectors 21 to 24 as aBx in the positive direction.

On the other hand, since the fifth magnetic detector 25 is completely covered (overlapped) with the first magnetic flux concentrator member 31 in plan view, the magnetic field in the X-axis direction is not input thereto, similarly to the fourth embodiment.

Since the magnetic field By of the Y-axis component is concentrated by the first and second magnetic flux concentrator members 31 and 32, the magnetic field acts on the end portion on the E2 side of the first magnetic detector 21, the end portion on the E2 side of the second magnetic detector 22, the end portion on the E1 side of the third magnetic detector 23, and the end portion on the E1 side of the fourth magnetic detector 24 obliquely with respect to the Y axis. Therefore, the magnetic field By is converted to the X-axis direction at the conversion coefficient b, and then is input to the first to fourth magnetic detectors 21 to 24. The magnitude of all of the magnetic fields input to the first to fourth magnetic detectors 21 to 24 are the same because of the symmetry of the arrangement of the first and second magnetic flux concentrator members 31 and 32 and the first to fourth magnetic detectors 21 to 24. That is to say, since the sensitivity axis of each of the first to fourth magnetic detectors 21 to 24 is set to the X-axis direction, bBy is input to the second and third magnetic detectors 22 and 23 in the positive direction and bBy is input to the first and fourth magnetic detectors 21 and 24 in the negative direction.

On the other hand, since the fifth magnetic detector 25 is completely covered (overlapped) with the first magnetic flux concentrator member 31 in plan view, the converted magnetic field in the X-axis direction is not input thereto, similarly to the fourth embodiment.

The magnetic field Bz of the Z-axis component is concentrated by the first and second magnetic flux concentrator members 31 and 32. Since the magnetic field acts on the first to fourth magnetic detectors 21 to 24 obliquely with respect to the Z axis, the magnetic field is converted at the conversion coefficient c to the X-axis direction, and then is input to the first to fourth magnetic detectors 21 to 24. The magnitude of all of the input magnetic fields are the same because of the symmetry of the arrangement of the first and second magnetic flux concentrator members 31 and 32 and the first to fourth magnetic detectors 21 to 24. $cB_z$ is input to the first and third magnetic detectors 21 and 23 in the positive direction and $cB_z$ is input to the second and fourth magnetic detectors 22 and 24 in the negative direction. On the other hand, since the fifth magnetic detector 25 is completely covered (overlapped) with the first magnetic flux concentrator member 31 in plan view, the converted magnetic field in the X-axis direction is not input thereto.

Based on the above, the resistances R1 to R5 of the first to fifth magnetic detectors 21 to 25 when the magnetic field B is applied are represented by following expressions (1-6) to (5-6).

$$R1 = \Delta \times (aBx - bBy + cBz) + R0 \qquad (1\text{-}6)$$

$$R2 = \Delta \times (aBx + bBy - cBz) + R0 \qquad (2\text{-}6)$$

$$R3 = \alpha \times (aBx + bBy + cBz) + R0 \qquad (3\text{-}6)$$

$$R4 = \alpha \times (aBx - bBy - cBz) + R0 \qquad (4\text{-}6)$$

$$R5 = R0 \qquad (5\text{-}6)$$

Herein, as represented by expression (6-6), the resistance depending on only the magnetic field Bz of the Z-axis component is calculated from "expression (3-6)−expression (2-6)".

$$R3 - R2 = 2\alpha c B z \qquad (6\text{-}6)$$

The same applies to "expression (1-6)−expression (4-6)".

Furthermore, as represented by expression (7-6), the resistance depending on only the magnetic field By of the Y-axis component is calculated from "expression (3-6)−expression (1-6)".

$$R3 - R1 = 2\alpha b B y \qquad (7\text{-}6)$$

The same applies to "expression (2-6)−expression (4-6)".

Furthermore, as represented by expression (8-6), the resistance depending on only the magnetic field Bx of the X-axis component is calculated from "expression (3-6)+expression (4-6)−2×expression (5-6)".

$$R3 + R4 - 2 \times R5 = 2\alpha a B x \qquad (8\text{-}6)$$

The same applies to "expression (1-6)+expression (2-6)−2×expression (5-6)"

Based on expressions (6-6) to (8-6), the resistance depending on only each of the X-axis component, the Y-axis component, and the Z-axis component can be calculated by using the magnetic sensor 106 of the sixth embodiment. Therefore, the magnetic field in each axis direction of the X-axis, Y-axis, and Z-axis components can be independently detected based on the resistances each of which depends on only each of the X-axis component, the Y-axis component, and the Z-axis component.

Thus, also in this case, it is possible to achieve the detection with a simple circuit configuration. This configuration eliminates the need for signal amplification processing for detecting the magnetic field with high accuracy or complicated signal processing. Therefore, it is possible to obtain a small magnetic sensor capable of detecting the magnetic fields in the directions of the three orthogonal axes on an identical substrate without causing an increase in consumption current or upsizing.

It is to be noted that, also in the sixth embodiment, the resistance depending on only each of the X-axis component, the Y-axis component and the Z-axis component may be calculated from expression (6-6), expression (7-6) and expression (8-6). The resistance depending on only the magnetic field Bz of the Z-axis component, for example, may be calculated from both of a value calculated from a resistance "R3−R2" in accordance with expression (6-6) and a value calculated from a resistance "R1−R4" in accordance with "expression (1-6)−expression (4-6), by calculating an average of both of these values, for example. The same applies to the magnetic field Bx of the X-axis component and the magnetic field By of the Y-axis component.

In addition, also in the sixth embodiment, the one end portion of each of the first and second magnetic flux concentrator members 31 and 32 do not have to coincide with the one end portion of one of the first to fourth magnetic detectors 21 to 24 in plan view. The end portions of the first to fourth magnetic detectors may be deviated outside in some degree in the longitudinal directions of the first and second magnetic flux concentrator members 31 and 32, or conversely, may be deviated inside in some degree. Similarly, the first and second magnetic flux concentrator members 31 and 32 and the first to fourth magnetic detectors 21 to 24 do not have to overlap with each other in plan view, or may overlap with each other more widely than FIG. 19.

Similarly, also in the sixth embodiment, a positional relationship between the first magnetic flux concentrator member 31 and the first and third magnetic detectors 21 and 23, and a positional relationship between the second magnetic flux concentrator member 32 and the second and fourth magnetic detectors 22 and 24 only have to be a positional relationship capable of detecting the magnetic field in the Y-axis direction and the magnetic field in the Z-axis direction converted to the X-axis direction.

In addition, in the sixth embodiment, there is described as illustrated in FIG. 19, a case where the first and third magnetic detectors 21 and 23 are arranged at the edge portion on the left side of the first magnetic flux concentrator member 31 extending in the longitudinal direction thereof, and the second and fourth magnetic detectors 22 and 24 are arranged at the edge portion on the right side of the second magnetic flux concentrator member 32 extending in the longitudinal direction thereof. Conversely, the first and third magnetic detectors 21 and 23 may be arranged at the edge portion on the right side of the first magnetic flux concentrator member 31 extending in the longitudinal direction thereof, and the second and fourth magnetic detectors 22 and 24 may be arranged at the edge portion on the left side of the second magnetic flux concentrator member 32 extending in the longitudinal direction thereof.

That is to say, in the sixth embodiment, the first magnetic flux concentrator member 31 and the second magnetic flux concentrator member 32 may be axisymmetric with respect to the line (line L) parallel to one side of the first magnetic flux concentrator member 31 in plan view, and the first and third magnetic detectors 21 and 23 may be arranged so as to be close to the two corners of the four corners of the first magnetic flux concentrator member 31, respectively, such that each of these magnetic detectors is close to only each one of these two corners. The first and third magnetic detectors 21 and 23 and the second and fourth magnetic detectors 22 and 24 may be axisymmetric in plan view. In this configuration, the end portions of the first to fourth magnetic detectors 21 to 24 in the first direction may coincide with the end portion of the first or second magnetic flux concentrator member 31 or 32 in the first direction. The end portions of the first to fourth magnetic detectors in the first direction may be arranged inside or outside in some degree with respect to the end portion of the first or second magnetic flux concentrator member 31, 32. That is to say, each of the first to fourth magnetic detectors 21 to 24 only has to be arranged at a location including an area where the direction of the input magnetic field lines is changed by the first or second magnetic flux concentrator member 31 or 32.

In more detail, the first magnetic detector 21 and the third magnetic detector 23 may be arranged at a predetermined interval to be axisymmetric with respect to a line (M3) in the second direction passing through the center point of the first magnetic flux concentrator member 31 in plan view, and the first and third magnetic detectors 21 and 23 and the second and fourth magnetic detectors 22 and 24 may be axisymmetric with respect to the parallel line (line L) described above, in plan view.

It is to be noted that, as described above, the end portions of the first to fourth magnetic detectors 21 to 24 in the first direction may not coincide with the end portion of the first or second magnetic flux concentrator member 31 or 32 in the first direction in plan view. The end portions of the first to fourth magnetic detectors may be deviated inside in some degree.

In addition, the sixth embodiment is also provided with the six magnetic detector below the second magnetic flux concentrator member 32 to obtain the same operation and effect as those of the fifth embodiment.

Seventh Embodiment

Next, a seventh embodiment of the present invention will be described below.

Figure 20:
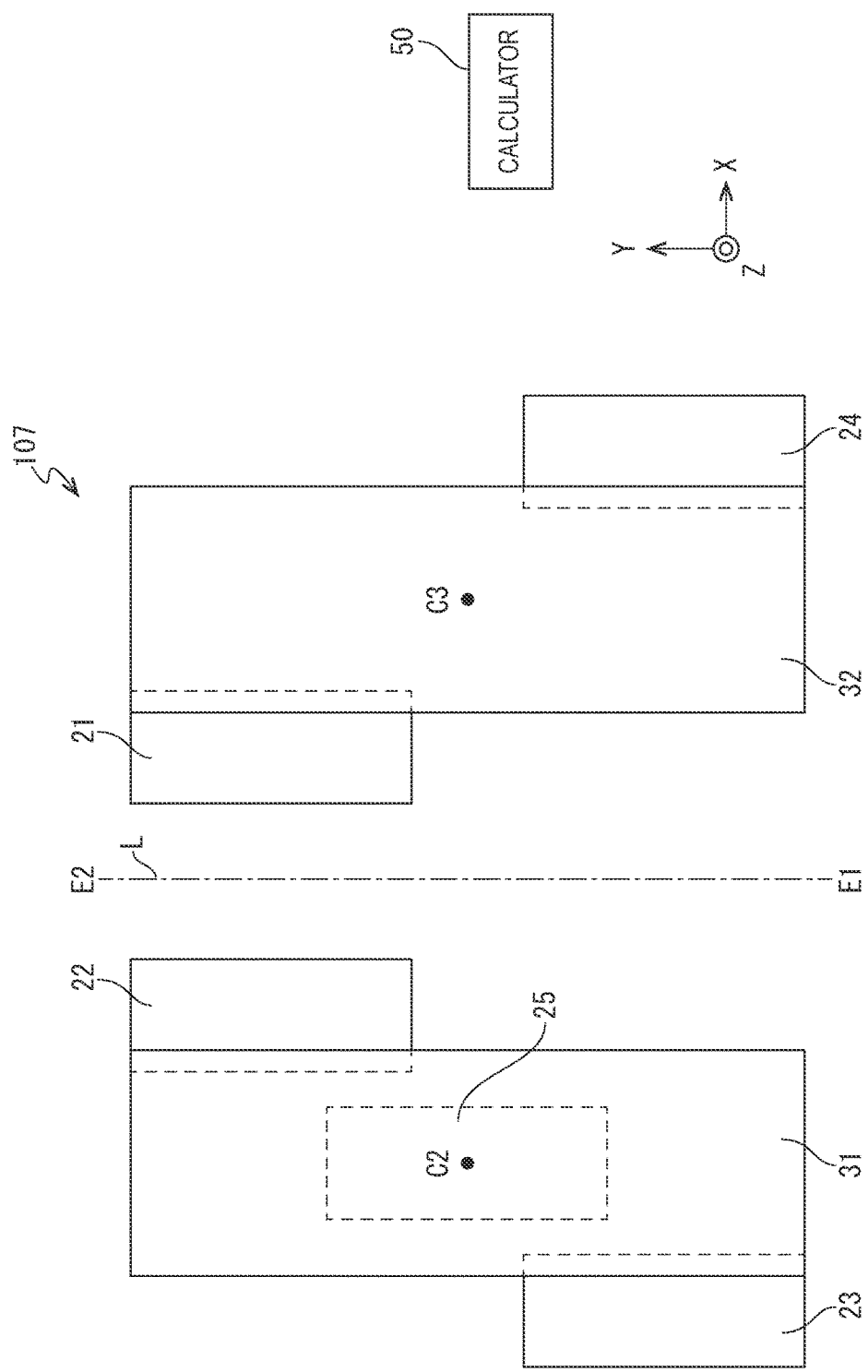
FIG. 20 is a configuration diagram illustrating an example of a seventh embodiment of the present invention.

FIG. 20 is a schematic plan view (the substrate is not illustrated) illustrating an example of a magnetic sensor 107 of the seventh embodiment of the present invention. In the drawings, reference numerals 21 to 25 denote the first to fifth magnetic detectors, reference numeral 31 denotes the first magnetic flux concentrator member, reference numeral 32 denotes the second magnetic flux concentrator member. In FIG. 20, the first to fifth magnetic detectors 21 to 25 are formed in a semiconductor substrate or the like, for example, in parallel to the substrate surface. The first magnetic flux concentrator member 31 and the second magnetic flux concentrator member 32 are formed on the semiconductor substrate via a protective layer, an adhesion layer, and the like. These first to fifth magnetic detectors 21 to 25 and the first and second magnetic flux concentrator members 31 and 32 form a detection unit, and output signals of the first to fifth magnetic detectors 21 to 25 are input to the calculator 50. The calculator 50 is configured to perform a predetermined calculation processing to calculate the magnetic field in the direction of the second axis perpendicular to the first axis that is the direction of the sensitivity axes of the magnetic detectors, and the magnetic field in the direction of the third axis perpendicular to the first axis and the second axis.

In the magnetic sensor 107 in the seventh embodiment, the first and second magnetic flux concentrator members 31 and 32 have the same shape. The first and second magnetic flux concentrator members 31 and 32 may have a rectangular shape in plan view, and in FIG. 20, may have a long narrow rectangular plate shape in plan view, for example.

The first to fifth magnetic detectors 21 to 25 have the same shape that is a long narrow and thin rectangular plate shape in plan view. The thicknesses, widths, and lengths of the first to fifth magnetic detectors 21 to 25 are shorter than those of the first and second magnetic flux concentrator members 31 and 32, respectively.

The lengths of the second and third magnetic detectors 22 and 23 in the longitudinal directions thereof are shorter than the half of the length of the first magnetic flux concentrator member 31. Then, when one end side of each of the first and second magnetic flux concentrator members 31 and 32 is referred to as the E1 side and the other end side is referred to as the E2 side, the third magnetic detector 23 is arranged at the edge portion on the left side of the first magnetic flux concentrator members 31 extending in the longitudinal direction thereof, such that the end portion on the E1 side of the first magnetic flux concentrator member 31 in the longitudinal direction thereof coincides with the end portion on the E1 side of the third magnetic detector 23 in the longitudinal direction thereof, and such that the edge portion on the left side of the first magnetic flux concentrator members 31 extending in the longitudinal direction thereof overlaps with only the edge portion on the right side of the third magnetic detectors 23 extending in the longitudinal direction thereof, in plan view.

Then, the second magnetic detector 22 is arranged at the edge portion on the right side of the first magnetic flux concentrator members 31 extending in the longitudinal direction thereof, such that the end portion on the E1 side of the first magnetic flux concentrator member 31 in the longitudinal direction thereof coincides with the end portion on the E1 side of the second magnetic detector 22 in the longitudinal direction thereof, and such that the edge portion on the right side of the first magnetic flux concentrator members 31 extending in the longitudinal direction thereof overlaps with only the edge portion on the left side of the second magnetic detectors 22 extending in the longitudinal direction thereof, in plan view.

On the other hand, the lengths of the first and fourth magnetic detectors 21 and 24 in the longitudinal directions thereof are shorter than the half of the length of the second magnetic flux concentrator member 32. Then, the first magnetic detector 21 is arranged at the edge portion on the left side of the second magnetic flux concentrator member 32 extending in the longitudinal direction thereof in plan view, such that an end portion on the E2 side of the second magnetic flux concentrator member 32 in the longitudinal direction thereof coincides with an end portion on the E1 side of the first magnetic detector 21, and such that the edge portion on the left side of the second magnetic flux concentrator member 32 extending in the longitudinal direction thereof overlaps with only the edge portion on the right side of the first magnetic detector 21 extending in the longitudinal direction thereof, in plan view.

Similarly, the fourth magnetic detector 24 is arranged at the edge portion on the right side of the second magnetic flux concentrator member 32 extending in the longitudinal direction thereof, such that the end portion on the E1 side of the second magnetic flux concentrator member 32 in the longitudinal direction thereof coincides with the end portion on the E1 side of the fourth magnetic detector 24, and such that the edge portion on the right side of the second magnetic flux concentrator member 32 extending in the longitudinal direction thereof overlaps with only the edge portion on the left side of the fourth magnetic detectors 24 extending in the longitudinal direction thereof, in plan view.

Then, the second magnetic detector 22 and the third magnetic detector 23 are arranged to be point-symmetric with respect to the center point C2 of the first magnetic flux concentrator member 31 in plan view of the substrate, and the first magnetic detector 21 and the fourth magnetic detector 24 are arranged to be point-symmetric with respect to a center point C3 of the second magnetic flux concentrator member 32 in plan view of the substrate.

Furthermore, in plan view of the substrate, a member including the first magnetic flux concentrator member 31 and the second and third magnetic detectors 22 and 23 and a member including the second magnetic flux concentrator member 32 and the first and fourth magnetic detectors 21 and 24 are arranged to be axisymmetric with respect to the line L.

As illustrated in FIG. 20, the fifth magnetic detector 25 is arranged below the first magnetic flux concentrator member 31 such that the center point of the first magnetic flux concentrator member 31 coincides with the center point of the fifth magnetic detector 25 in plan view. Furthermore, the fifth magnetic detector 25 is completely covered (overlapped) with the first magnetic flux concentrator member 31 in plan view.

A magnetic detection method in three-axis directions by using the magnetic sensor 107 of the seventh embodiment in a case in which the magnetic field B is applied will be described below.

In the magnetic sensor 107, the magnetic field Bx of the X-axis component is concentrated by the first and second magnetic flux concentrator members 31 and 32 at the conversion coefficient a. Because of the symmetry of the arrangement of the first and second magnetic flux concentrator members 31 and 32 and the first to fourth magnetic detectors 21 to 24, the magnetic field Bx of the X-axis component is input to all of the first to fourth magnetic detectors 21 to 24 as aBx in the positive direction. On the other hand, since the fifth magnetic detector 25 is completely covered with the first magnetic flux concentrator member 31 in plan view, the magnetic field in the X-axis direction is not input thereto, similarly to the fourth embodiment.

Since the magnetic field By of the Y-axis component is concentrated by the first and second magnetic flux concentrator members 31 and 32, the magnetic field acts on the end portions on the E1 side of the third and fourth magnetic detectors 23 and 24, and the end portions on the E2 side of the first and second magnetic detectors 21 and 22 obliquely with respect to the Y axis. Therefore, the magnetic field By is converted to the X-axis direction at the conversion coefficient b, and then is input to the first to fourth magnetic detectors 21 to 24. The magnitude of all of the input magnetic fields are the same because of the symmetry of the arrangement of the first and second magnetic flux concentrator members 31 and 32 and the first to fourth magnetic detectors 21 to 24. Since the sensitivity axis of each of the first to fourth magnetic detectors 21 to 24 is set to the X-axis direction, bBy is input to the second and third magnetic detectors 22 and 23 in the positive direction and bBy is input to the first and fourth magnetic detectors 21 and 24 in the negative direction. On the other hand, since the fifth magnetic detector 25 is completely covered (overlapped) with the first magnetic flux concentrator member 31 in plan view, the converted magnetic field in the X-axis direction is not input thereto.

The magnetic field Bz of the Z-axis component is concentrated by the first and second magnetic flux concentrator members 31 and 32. Since the magnetic field acts on the first to fourth magnetic detectors 21 to 24 obliquely with respect to the Z axis, the magnetic field is converted at the conversion coefficient c to the X-axis direction, and then is input to the first to fourth magnetic detectors 21 to 24. The magnitude of all of the input magnetic fields are the same because of the symmetry of the arrangement of the first and second magnetic flux concentrator members 31 and 32 and the first to fourth magnetic detectors 21 to 24. cBz is input to the first and third magnetic detectors 21 and 23 in the positive direction and cBz is input to the second and fourth magnetic detectors 22 and 24 in the negative direction.

On the other hand, since the fifth magnetic detector 25 is completely covered (overlapped) with the first magnetic flux concentrator member 31 in plan view, the converted magnetic field in the X-axis direction is not input thereto.

Based on the above, the resistances R1 to R5 of the first to fifth magnetic detectors 21 to 25 when the magnetic field B is applied are represented by following expressions (1-7) to (5-7).

$$R1 = \Delta \times (aBx - bBy + cBz) + R0 \quad (1\text{-}7)$$

$$R2 = \Delta \times (aBx + bBy - cBz) + R0 \quad (2\text{-}7)$$

$$R3 = \Delta \times (aBx + bBy + cBz) + R0 \quad (3\text{-}7)$$

$$R4 = \Delta \times (aBx - bBy - cBz) + R0 \quad (4\text{-}7)$$

$$R5 = R0 \quad (5\text{-}7)$$

Herein, as represented by expression (6-7), the resistance depending on only the magnetic field Bz of the Z-axis component is calculated from "expression (3-7)–expression (2-7)".

$$R3 - R2 = 2\alpha cBz \quad (6\text{-}7)$$

The same applies to "expression (1-7)–expression (4-7)".

Furthermore, as represented by expression (7-7), the resistance depending on only the magnetic field By of the Y-axis component is calculated from "expression (3-7)–expression (1-7)".

$$R3 - R1 = 2\alpha bBy \quad (7\text{-}7)$$

The same applies to "expression (2-7)–expression (4-7)".

Furthermore, as represented by expression (8-7), the resistance depending on only the magnetic field Bx of the X-axis component is calculated from "expression (3-7)+expression (4-7)–2×expression (5-7)".

$$R3 + R4 - 2 \times R5 = 2\alpha aBx \quad (8\text{-}7)$$

The same applies to "expression (1-7)+expression (2-7)–2×expression (5-7)"

Based on expressions (6-7) to (8-7), it turns out that the resistance depending on only each of the X-axis component, the Y-axis component, and the Z-axis component can be calculated by using the magnetic sensor 107 of the seventh embodiment. Therefore, the magnetic field in each axis direction of the X-axis, Y-axis, and Z-axis components can be independently detected based on the resistances each of which depends on only each of the X-axis component, the Y-axis component and the Z-axis component.

Thus, also in this case, it is possible to achieve the detection with a simple circuit configuration. This configuration eliminates the need for signal amplification processing for detecting the magnetic field with high accuracy and complicated signal processing. Therefore, it is possible to obtain a small magnetic sensor capable of detecting the magnetic fields in the directions of the three orthogonal axes on an identical substrate without causing an increase in consumption current or upsizing.

It is to be noted that, also in the seventh embodiment, the resistance depending on only each of the X-axis component, the Y-axis component and the Z-axis component may be calculated from expression (6-7), expression (7-7) and expression (8-7). The resistance depending on only the magnetic field Bz of the Z-axis component, for example, may be calculated from both of a value calculated from a resistance "R3−R2" in accordance with expression (6-7) and a value calculated from "R1−R4" in accordance with "expression (1-7)−expression (4-7), by calculating an average of both of these values, for example. The same applies to the magnetic field Bx of the X-axis component and the magnetic field By of the Y-axis component.

In addition, also in the seventh embodiment, the one end portion of each of the first and second magnetic flux concentrator members 31 and 32 do not have to coincide with the one end portion of one of the first to fourth magnetic detectors 21 to 24 in plan view. The end portions of the first to fourth magnetic detectors may be deviated outside in some degree in the longitudinal directions of the first and second magnetic flux concentrator members 31 and 32, or conversely, may be deviated inside in some degree. Similarly, the first and second magnetic flux concentrator members 31 and 32 and the first to fourth magnetic detectors 21 to 24 do not have to overlap with each other in plan view, or may overlap with each other more widely than FIG. 20.

In FIG. 20, the lengths of the first to fourth magnetic detectors 21 to 24 in the longitudinal directions thereof are shorter than the half of the lengths of the first and second magnetic flux concentrator members 31 and 32 in the longitudinal directions thereof, however the present invention is not limited thereto. The lengths of the first to fourth magnetic detectors in the longitudinal directions thereof only have to be shorter than the lengths of the first and second magnetic flux concentrator members 31 and 32 in the longitudinal directions thereof.

Also in the seventh embodiment, a positional relationship between the first magnetic flux concentrator member 31 and the second and third magnetic detectors 22 and 23, and a positional relationship between the second magnetic flux concentrator member 32 and the first and fourth magnetic detectors 21 and 24 only have to be a positional relationship capable of detecting the magnetic field in the Y-axis direction and the magnetic field in the Z-axis direction converted to the X-axis direction.

In addition, the positional relationship of the first to fourth magnetic detectors 21 to 24 with respect to the first and second magnetic flux concentrator members 31 and 32 may be inverted such that, in plan view, the third magnetic detector 23 may be arranged at the edge portion on the right side of the first magnetic flux concentrator member 31 extending in the longitudinal direction thereof, the second magnetic detector 22 may be arranged at the edge portion on the left side of the first magnetic flux concentrator member, the first magnetic detector 21 may be arranged at the edge portion on the right side of the second magnetic flux concentrator member 32 extending in the longitudinal direction thereof, and the fourth magnetic detector 24 may be arranged at the edge portion on the left side of the second magnetic flux concentrator member.

That is, in the seventh embodiment, the first magnetic flux concentrator member 31 and the second magnetic flux concentrator member 32 may be axisymmetric with respect to the line (line L) parallel to one side of the first magnetic flux concentrator member 31 in plan view, and the second and third magnetic detectors 22 and 23 may be arranged so as to be close to the two corners of the four corners of the first magnetic flux concentrator member 31, respectively, such that each of these magnetic detectors is close to only each one of these two corners. The second and third magnetic detectors 22 and 23 and the first and fourth magnetic detectors 21 and 24 may be axisymmetric in plan view. In this configuration, when it is assume that a direction in which the parallel line (line L) described above extends is the first direction, the end portions of the first to fourth magnetic detectors 21 to 24 in the first direction may coincide with the end portion of the first or second magnetic flux concentrator member 31 or 32 in the first direction. The end portions of the first to fourth magnetic detectors in the first direction may be arranged inside or outside in some degree with respect to the end portion of the first or second magnetic flux concentrator member 31 or 32. That is to say, each of the first to fourth magnetic detectors 21 to 24 only has to be arranged at a location including an area where the direction of the input magnetic field lines is changed by the first or second magnetic flux concentrator members 31 or 32.

In more detail, the second magnetic detector 22 and the third magnetic detector 23 may be arranged to be point-symmetric with respect to the center point of the first magnetic flux concentrator member 31 in plan view, and the second and third magnetic detectors 22 and 23 and the first and fourth magnetic detectors 21 and 24 may be axisymmetric with respect to the parallel line (line L) described above, in plan view.

It is to be noted that the seventh embodiment is also provided with the six magnetic detector below the second magnetic flux concentrator member 32 to obtain the same operation and effect as those of the sixth embodiment.

In addition, in the fourth to seventh embodiments described above, the lengths, the widths, and the thicknesses of the first and second magnetic flux concentrator members 31 and 32, and the first to sixth magnetic detectors 21 to 26 and a relative location thereamong may be set to values at which sufficient three-axis components can be obtained, depending on the characteristics of the magnetic flux concentrator member and the magnetic detectors, and a desired accuracy of the magnetic sensor.

In addition, in the fourth to seventh embodiments described above, the shapes of the first to sixth magnetic detectors 21 to 26 are not limited to rectangular shapes in plan view, but are preferably rectangular shapes in plan view in the light of improvement of the detection accuracy, and the lines in the longitudinal directions of the first to sixth magnetic detectors 21 to 26 passing through the center points thereof are preferably parallel to the lines in the longitudinal directions of the first and second magnetic flux concentrator members 31 and 32 passing through the center points thereof.

In addition, in the fourth to seventh embodiments described above, in the light of improvement of the detection accuracy, a portion of each of the first to fourth magnetic detectors 21 to 24 preferably overlaps with the edge portion of each of the first and second magnetic flux concentrator members 31 and 32 in plan view of the substrate.

In addition, in the light of easy detection of the magnetic field of each axis, it is preferable in the fourth to seventh embodiments described above that the line perpendicular to the direction extending in the longitudinal directions of the first to fifth magnetic detectors 21 to 25 passing through the center points thereof, that is, a line parallel to the substrate surface extending in the lateral direction be the first axis, without being limited thereto. In this case, the lines passing through center points in the longitudinal directions of the first to fifth magnetic detectors 21 to 25, respectively, are the second axis, and the direction perpendicular to the first to fifth magnetic detectors 21 to 25 is the third axis, in plan view of the substrate surface.

In addition, according to the fourth to seventh embodiments described above, it is possible to detect the magnetic field of each axis even when all of the sensitivity axes of the magnetic detectors are set to the same direction, all of the sensitivity axes of the magnetic detectors are preferably set to the same direction in the light of easy manufacturing process and uniformity of the characteristics among the magnetic detectors.

In addition, in the fourth to seventh embodiments described above, the first to fifth magnet detectors 21 to 25 or the sixth magnetic detector 26 may be arranged above the first and second magnetic flux concentrator members 31 and 32.

In addition, in the fourth to seventh embodiments described above, the fifth magnetic detector 25 may not necessarily be arranged to coincide with the center point of the magnetic flux concentrator member 31, and may be deviated from the center point in some degree. Similarly, the sixth magnetic detector 26 may not necessarily be arranged to coincide with the center point of the magnetic flux concentrator member 32, and may be deviated from the center point in some degree.

Next, fourth and fifth modifications of the fourth to seventh embodiments will be described.

It is to be noted that a case where TMR elements are used as magnetic detection elements in magnetic sensors in the modifications is described, however, magnetoresistance effect elements or GMR elements can be applied as the magnetic detection elements as described above.

(Fourth Modification)

Figure 21:
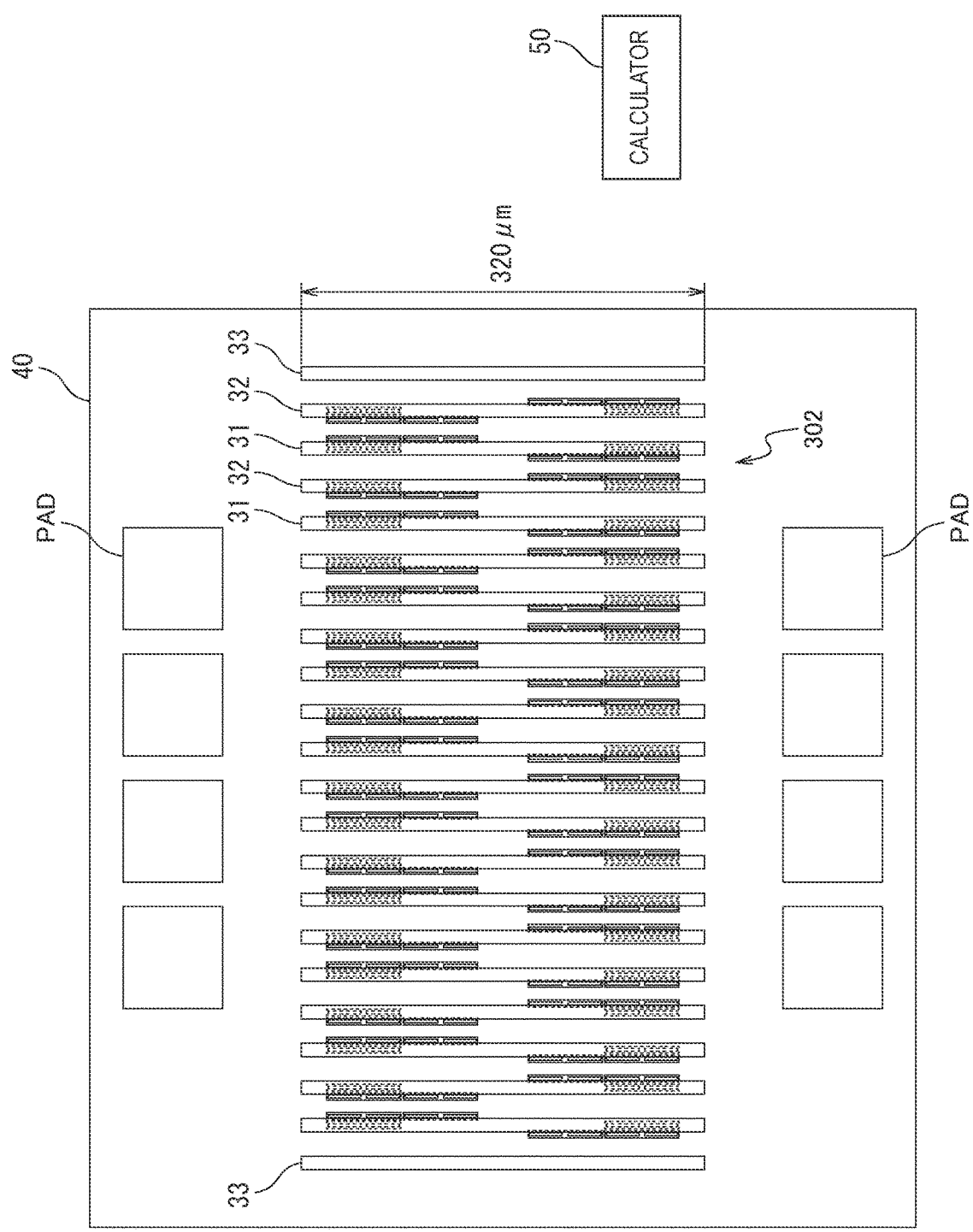
FIG. 21 is a configuration diagram illustrating a fourth modification.
Figure 22A:
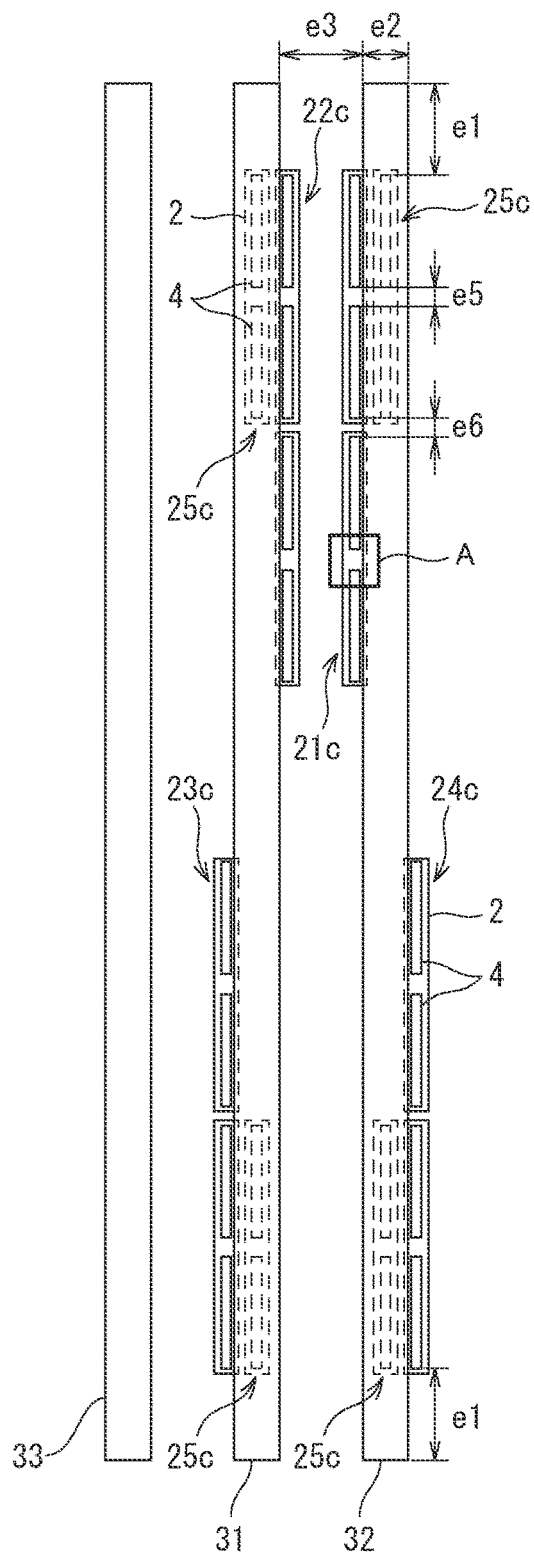
FIGS. 22A and 22B are enlarged views of a portion of FIG. 21.

FIG. 21 is a view illustrating a whole configuration of a magnetic sensor in the fourth modification. FIG. 22A is an enlarged view of a portion of FIG. 21 and FIG. 22B is an enlarged view of a portion A of FIG. 22A.

Figure 22B:
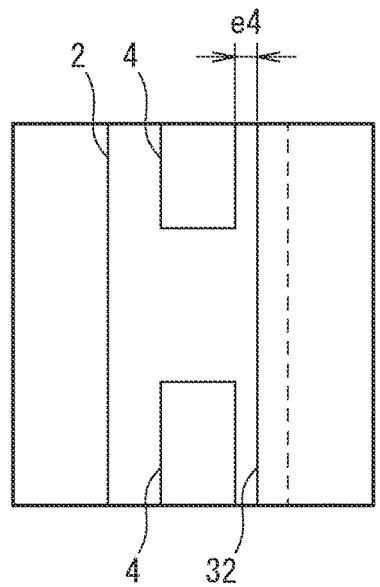

As illustrated in FIG. 21, and FIGS. 22A and 22B, the magnetic sensor in the fourth modification is obtained by modifying the magnetic sensor 107 in the seventh embodiment illustrated in FIG. 20 such that each of the magnetic detectors 21 to 24 includes plural magnetic detection elements, and furthermore, magnetic detectors are provided at positions overlapping with the magnetic flux concentrator members 31 and 32, respectively.

That is, in the magnetic sensor in the fourth modification, as illustrated in FIG. 21, and FIGS. 22A and 22B, the magnetic flux concentrator members 31 and the magnetic flux concentrator members 32 are arranged in parallel to each other to make a pair. The magnetic sensor includes a magnetic flux concentrator unit 302 in which plural pairs of the magnetic flux concentrator member 31 and the magnetic flux concentrator member 32 are arranged in parallel to one another. The magnetic flux concentrator members 31 and the magnetic flux concentrator members 32 are arranged at equal intervals. Furthermore, the magnetic sensor includes magnetic detectors 21c to 24c corresponding the magnetic detectors 21 to 24 of the magnetic sensor 107 illustrated in FIG. 20, and magnetic detectors 25c acting equivalently to the magnetic detector 25 in FIG. 20. Each of the magnetic detectors 25c is arranged at each of both ends of each of the magnetic flux concentrator members 31 and 32 in plan view. The magnetic detectors 21c to 24c are arranged on the right edge side or left edge side of an end portion on the E1 side or the E2 side of the magnetic flux concentrator members 31 and 32.

Each of the magnetic detectors 21c to 24c includes plural (four, for example) TMR elements as the magnetic detection elements. In each of the magnetic detectors 21c to 24c, two pinned layers 2 are arranged in the longitudinal direction of the magnetic flux concentrator members 31 and 32 at a predetermined interval, and two free layers 4 are arranged in the longitudinal direction of the magnetic flux concentrator members 31 and 32 at a predetermined interval in each of the two pinned layers 2, and thus the four TMR elements are arranged in the longitudinal direction of the magnetic flux concentrator members 31 and 32 at predetermined intervals.

The magnetic detector 25c includes two TMR elements, each serving as a magnetic detection element, one pinned layer 2 is arranged in the longitudinal direction of the magnetic flux concentrator members 31 and 32 and two free layers 4 are arranged in the longitudinal direction of the magnetic flux concentrator members 31 and 32 at a predetermined interval in the pinned layer 2, and thus the two TMR elements are arranged in the longitudinal direction of the magnetic flux concentrator members 31 and 32 at the predetermined interval.

It is to be noted that, in FIG. 21, reference numeral 40 denotes the substrate on which the magnetic sensor is formed, reference symbols PAD denote the pads for extracting output signals of the magnetic detection elements included in each of the magnetic detectors 21c to 25c. Four pads PAD are provided on each of the both end sides in the longitudinal direction of the magnetic flux concentrator members 31 and 32. Therefore, eight pads are provided in total. In addition, a magnetic flux concentrator member 33 on which the magnetic detectors 21c to 25c are not provided is arranged on each of both ends of the direction in which a line of the plural pairs of the magnetic flux concentrator members 31 and 32 arranged in parallel to each other extends. Then, the output signal of each of the magnetic detectors 21c to 25c is input to the calculator 50 via the pad PAD. The calculator 50 is configured to perform a predetermined calculation processing based on the output signals to calculate the magnetic field in the direction of the second axis perpendicular to the first axis that is the direction of the sensitivity axes of the magnetic detectors, and the magnetic field in the direction of the third axis perpendicular to the first axis and the second axis.

Each of the magnetic detectors 21c to 25c and the magnetic flux concentrator members 31 and 32 are formed so as to satisfy the following conditions in plan view. That is, when e1 refers to a distance between one end of each of the magnetic flux concentrator members 31 and 32 in the longitudinal direction thereof and the end portion of each free layer 4 located adjacent to the one end, and similarly, when e1 refers to a distance between the other end of each of the magnetic flux concentrator members 31 and 32 in the longitudinal direction thereof and the end portion of each free layer 4 located adjacent to the other end, the distance e1 is preferably equal to or larger than 0 μm and equal to or smaller than 30 μm, is more preferably equal to or larger than 5 μm and equal to or smaller than 20 μm, and is further preferably equal to or larger than 10 μm and equal to or smaller than 20 μm. The distance e1, for example, may be 0 μm, 5 μm, 10 μm, 15 μm, 20 μm, 25 μm, or 30 μm.

A length of each of the magnetic flux concentrator members 31 and 32 in the lateral direction, that is, a width e2 is preferably equal to or larger than 5 μm and equal to or smaller than 30 μm, is more preferably equal to or larger than 8 μm and equal to or smaller than 12 μm, and is further preferably 10 μm. The width e2, for example, may be 5 μm, 6 μm, 7 μm, 8 μm, 9 μm, 10 μm, 11 μm, 12 μm, 15 μm, 20 μm, 25 μm, or 30 μm. In addition, the length of each of the magnetic flux concentrator members 31, 32, and 33 in the longitudinal direction may be, for example, 320 μm.

A distance e3 between the magnetic flux concentrator members 31 and 32 is preferably equal to or larger than 10 µm and equal to or smaller than 100 µm, is more preferable equal to or larger than 20 µm and equal to or smaller than 50 µm, and is further preferably equal to or larger than 20 µm and equal to or smaller than 32 µm. The distance e3, for example, may be 20 µm, 25 µm, 32 µm, 40 µm, 45 µm, 50 µm, 60 µm, or 100 µm.

As illustrated in FIG. 22B, in the magnetic flux concentrator members 31 and 32, a distance e4 between the end portion of each of the magnetic detectors 21c to 24c on the free layer 4 side and the end portion of the free layer 4 on a magnetic flux concentrator member 31, 32 side is preferably equal to or larger than 0 µm and equal to or smaller than 10 µm, and is further preferably equal to or larger than 1 µm and equal to or smaller than 2 µm. The distance e4, for example, may be 0 µm, 0.5 µm, 1 µm, 1.5 µm, 2 µm, or 10 µm.

A distance e5 between the two free layers 4 arranged in the same pinned layer 2 in each of the magnetic detectors 21c to 24c and a distance e6 between the free layers 4 that are arranged in the two pinned layers 2, respectively, are the same, for example, 8 µm.

With respect to the magnetic detectors 25c, the distance e5 between the two free layers 4 arranged in the same pinned layer 2 and the distance e6 between the free layers 4 that are arranged in the two pinned layers 2, respectively, preferably have the similar values to the differences e5 and e6 of the magnetic detectors 21c to 24c. The difference e5 and the difference e6 of the magnetic detectors 25c may be different therefrom. The difference e6 of the magnetic detectors 25c may have the same value as the difference e6 of the magnetic detectors 21c to 24c, or may be 154 µm or 188 µm.

When the magnetic flux concentrator members 31 and 32 and the magnetic detectors 21c to 25c are formed as one repeated pattern, the magnetic detector 21c included in one repeated pattern is connected to the magnetic detector 21c in another repeated pattern via wiring in series with each other. That is, a magnetic detection element included in the magnetic detector 21c in the one repeated pattern is connected to a magnetic detection element included in the magnetic detector 21c in the other repeated pattern in series with each other. However, all of the magnetic detectors 21c included in the repeated patterns do not have to be connected in series with each other, and some magnetic detectors 21c are not needed to be connected with another magnetic detector 21c.

The number of the magnetic detection elements connected in series is preferably equal to or larger than eight and equal to or smaller than 100, and is further preferably equal to or larger than 24 and equal to or smaller than 80. The number of the magnetic detection elements connected in series, for example, may be 16, 20, 24, 28, 32, 36, 40, 44, 48, 52, 56, or 80.

Similarly to the magnetic detector 21c, the magnetic detectors 22c to 25c are connected with the magnetic detectors 22c to 25c included in another repeated pattern in series with each other, respectively.

(Fifth Modification)

Figure 23:
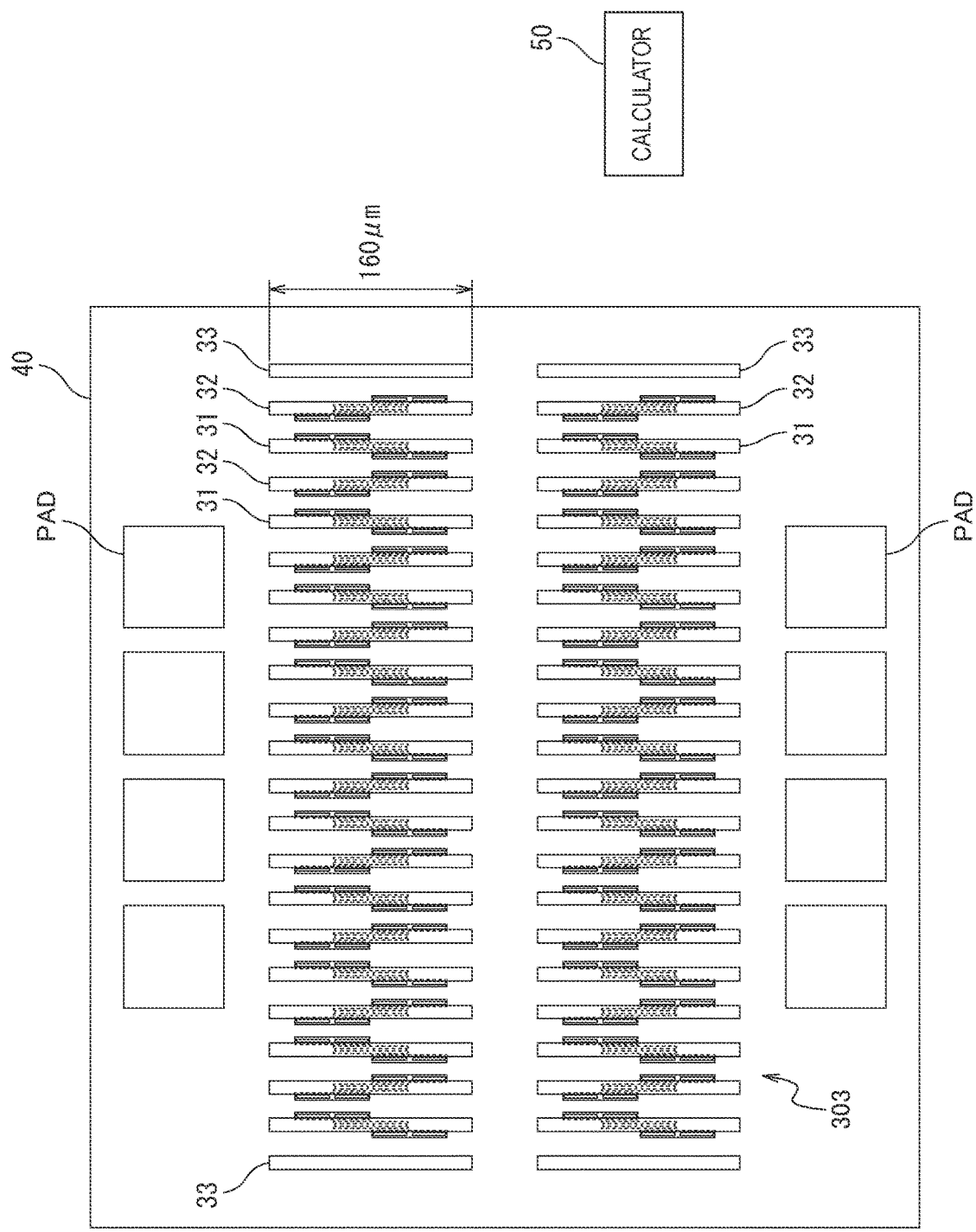
FIG. 23 is a configuration diagram illustrating a fifth modification.
Figure 24A:
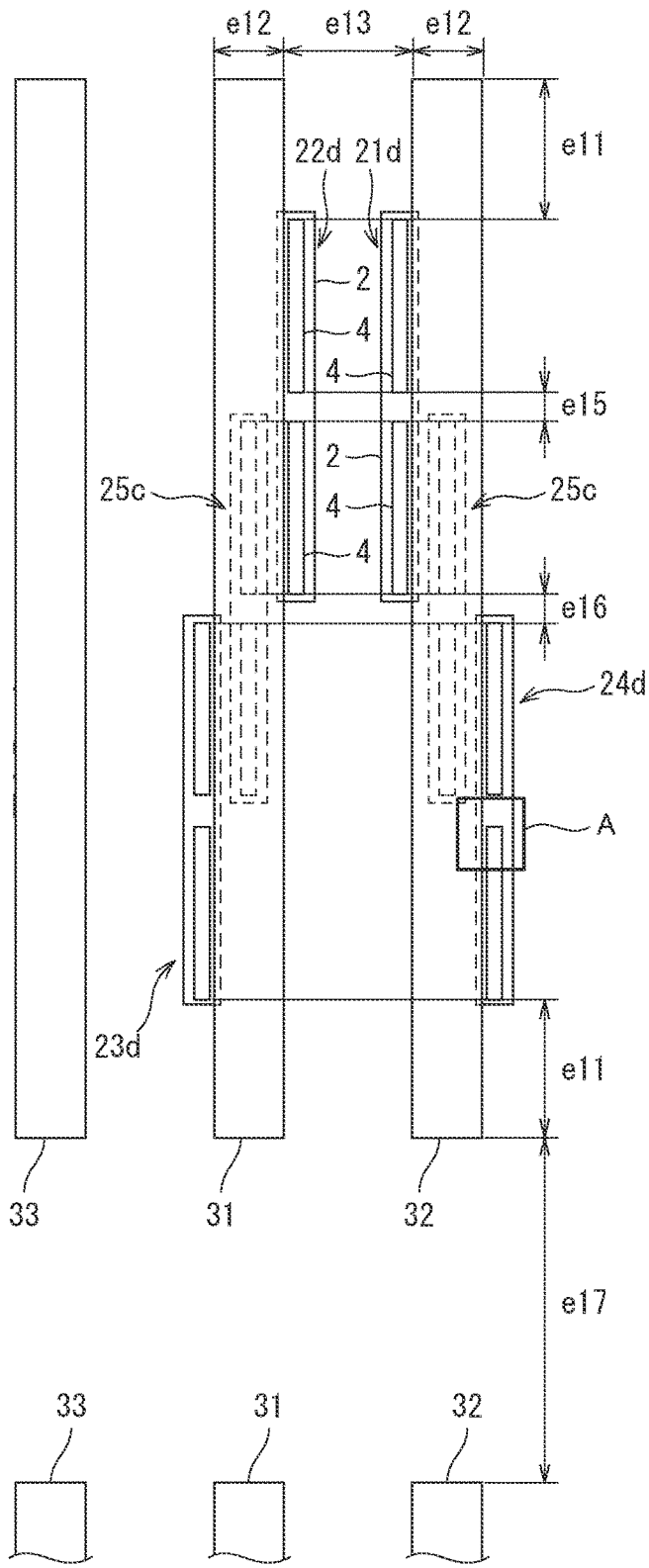
FIGS. 24A and 24B are enlarged views of a portion of FIG. 23.
Figure 24B:
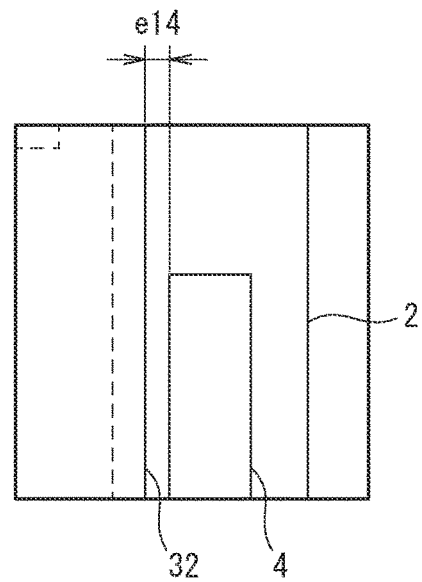

FIG. 23 is a view illustrating a whole configuration of a magnetic sensor in the fifth modification. FIG. 24A is an enlarged view of a portion of FIG. 23 and FIG. 24B is an enlarged view of a portion A of FIG. 24A.

In the magnetic sensor in the fifth modification, two magnetic sensors 107 in the seventh embodiment illustrated in FIG. 20 are arranged on the same line in the longitudinal directions of the magnetic flux concentrator members 31 and 32 and plural magnetic sensors 107 are arranged in parallel to each other in the lateral directions of the magnetic flux concentrator members. As illustrated in FIG. 23, and FIGS. 24A and 24B, the magnetic sensor in the fifth modification includes a magnetic flux concentrator unit 303 in which two magnetic flux concentrator members 31 and two magnetic flux concentrator members 32 are arranged in the longitudinal directions of the magnetic flux concentrator members 31 and 32, and plural magnetic flux concentrator members 31 and plural magnetic flux concentrator members 32 are arranged in parallel to each other in the lateral directions thereof. The magnetic flux concentrator members 31 and 32 are arranged at equal intervals. Furthermore, each of the magnetic flux concentrator members 31 and 32 includes the magnetic sensor including magnetic detectors 21d to 24d corresponding the magnetic detectors 21 to 24 of the magnetic sensor 107 illustrated in FIG. 20, and magnetic detectors 25c acting equivalently to the magnetic detector 25 in FIG. 20. Each of the magnetic detectors 25c is arranged at a center portion of each of the magnetic flux concentrator members 31 and 32 in the longitudinal directions thereof in plan view.

Each of the magnetic detectors 21d to 24d and 25c includes two TMR elements as the magnetic detection elements. In each of the magnetic detectors 21d to 24d and 25c, a pinned layer 2 is arranged in the longitudinal direction of the magnetic flux concentrator members 31 and 32 and two free layers 4 are arranged in the longitudinal direction of the magnetic flux concentrator members 31 and 32 at a predetermined interval in the pinned layer 2, and thus the two TMR elements are arranged in the longitudinal direction of the magnetic flux concentrator members 31 and 32 at the predetermined interval.

It is to be noted that reference numeral 40 denotes the substrate on which the magnetic sensor is formed, reference symbols PAD denote the pads for extracting output signals of the magnetic detection elements. Four pads PAD are provided on each of the both end sides in the longitudinal direction of the magnetic flux concentrator members 31 and 32. Therefore, eight pads are provided in total. In addition, a magnetic flux concentrator member 33 on which the magnetic detectors 21d to 24d, and 25c are not provided is arranged on each of both ends of the direction in which a line of the plural pairs of the magnetic flux concentrator members 31 and 32 arranged in parallel to each other extends.

Then, the output signal of each of the magnetic detectors 21d to 24d and 25c is input to the calculator 50 via the pad PAD. The calculator 50 is configured to perform a predetermined calculation processing based on the output signals to calculate the magnetic field in the direction of the second axis perpendicular to the first axis that is the direction of the sensitivity axes of the magnetic detectors, and the magnetic field in the direction of the third axis perpendicular to the first axis and the second axis.

Each of the magnetic detectors 21d to 24d and 25c and the magnetic flux concentrator members 31 and 32 are formed so as to satisfy the following conditions in plan view. That is, when e11 refers to a distance between one end of each of the magnetic flux concentrator members 31 and 32 in the longitudinal direction thereof and the end portion of each free layer 4 located adjacent to the one end, and similarly, when e11 refers to a distance between the other end of each of the magnetic flux concentrator members 31 and 32 in the longitudinal direction thereof and the end portion of each free layer 4 located adjacent to the other end, the distance e11 is preferably equal to or larger than 0 µm and equal to or smaller than 30 µm, is more preferably equal to or larger than 5 µm and equal to or smaller than 25 µm, and is further preferably equal to or larger than 15 µm and equal to or smaller than 20 µm. The distance e11, for example, may be 0 µm, 5 µm, 10 µm, 15 µm, 20 µm, 25 µm, 26 µm, 27 µm, 28 µm, 29 µm, or 30 µm.

A length of each of the magnetic flux concentrator members 31 and 32 in the lateral direction, that is, a width e12 is preferably equal to or larger than 5 µm and equal to or smaller than 30 µm, is more preferably equal to or larger than 8 µm and equal to or smaller than 12 µm, and is further preferably 10 µm. The width e12, for example, may be 5 µm, 6 µm, 7 µm, 8 µm, 9 µm, 10 µm, 11 µm, 12 µm, 15 µm, 20 µm, 25 µm, or 30 µm. In addition, the length of each of the magnetic flux concentrator members 31, 32, and 33 in the longitudinal direction may be, for example, 160 µm.

A distance e13 between the magnetic flux concentrator members 31 and 32 is preferably equal to or larger than 10 µm and equal to or smaller than 100 µm, is more preferably equal to or larger than 20 µm and equal to or smaller than 50 µm, and is further preferably equal to or larger than 20 µm and equal to or smaller than 32 µm. The distance e13, for example, may be 10 µm, 20 µm, 25 µm, 32 µm, 40 µm, 50 µm, 60 µm, or 100 µm.

As illustrated in FIG. 24B, in the magnetic flux concentrator members 31 and 32, a distance e14 between an end portion of each of the magnetic detectors 21d to 24d on the free layer 4 side and an end portion of the free layer 4 on the magnetic flux concentrator member 31, 32 side is preferably equal to or larger than 0 µm and equal to or smaller than 10 µm, and is further preferably 1 µm. The distance e14, for example, may be 0 µm, 0.5 µm, 1 µm, 1.5 µm, or 2 µm.

A distance e15 between the two free layers 4 arranged in the same pinned layer 2 of each of the magnetic detectors 21d to 24d, and a distance e16 between the free layers 4 each of which is arranged in each of pinned layers 2 of different magnetic detectors arranged to overlap with the same magnetic flux concentrator member, are the same, for example, 8 µm.

Regarding the magnetic detector 25c, a distance between the two free layers 4 arranged in the same pinned layer 2 and a distance between the free layers 4 that are arranged in the two pinned layers 2, respectively, may have the similar values to the distances e15 and e16 in the magnetic detectors 21a to 24a, or may be different values therefrom, such as 154 µm, 188 µm, or the like.

A distance e17 between the two magnetic flux concentrator members 31 arranged on the same line in the longitudinal direction thereof, between the two magnetic flux concentrator members 32 arranged on the same line in the longitudinal direction thereof, or between the two magnetic flux concentrator members 33 arranged on the same line in the longitudinal direction thereof is preferably equal to or larger than 10 µm and equal to or smaller than 100 µm, and is further preferably equal to or larger than 20 µm and equal to or smaller than 50 µm. The distance e17, for example, may be 10 µm, 20 µm, 50 µm, 80 µm, or 100 µm.

When the magnetic flux concentrator members 31 and 32 and the magnetic detectors 21d to 24d and 25c are formed as one repeated pattern, the magnetic detector 21d included in one repeated pattern is connected to the magnetic detector 21d in another repeated pattern via wiring in series with each other. That is, a magnetic detection element included in the magnetic detector 21d in the one repeated pattern is connected to a magnetic detection element included in the magnetic detector 21d in the other repeated pattern in series with each other. However, all of the magnetic detectors 21d included in the repeated patterns do not have to be connected in series with each other, and some magnetic detectors 21d are not needed to be connected with another magnetic detector 21d.

The number of the magnetic detection elements connected in series is preferably equal to or larger than eight and equal to or smaller than 100, and is further preferably equal to or larger than 24 and equal to or smaller than 80. The number of the magnetic detection elements connected in series, for example, may be 16, 20, 24, 28, 32, 36, 40, 44, 48, 52, 56, or 80.

Similarly to the magnetic detector 21d, the magnetic detectors 22d to 24d and 25c are connected with the magnetic detectors 22d to 24d and 25c included in another repeated pattern in series with each other, respectively.

Eighth Embodiment

Next, an eighth embodiment of the present invention will be described below.

First, a configuration as a premise of a magnetic sensor in the eighth embodiment will be described below.

Figure 25A:
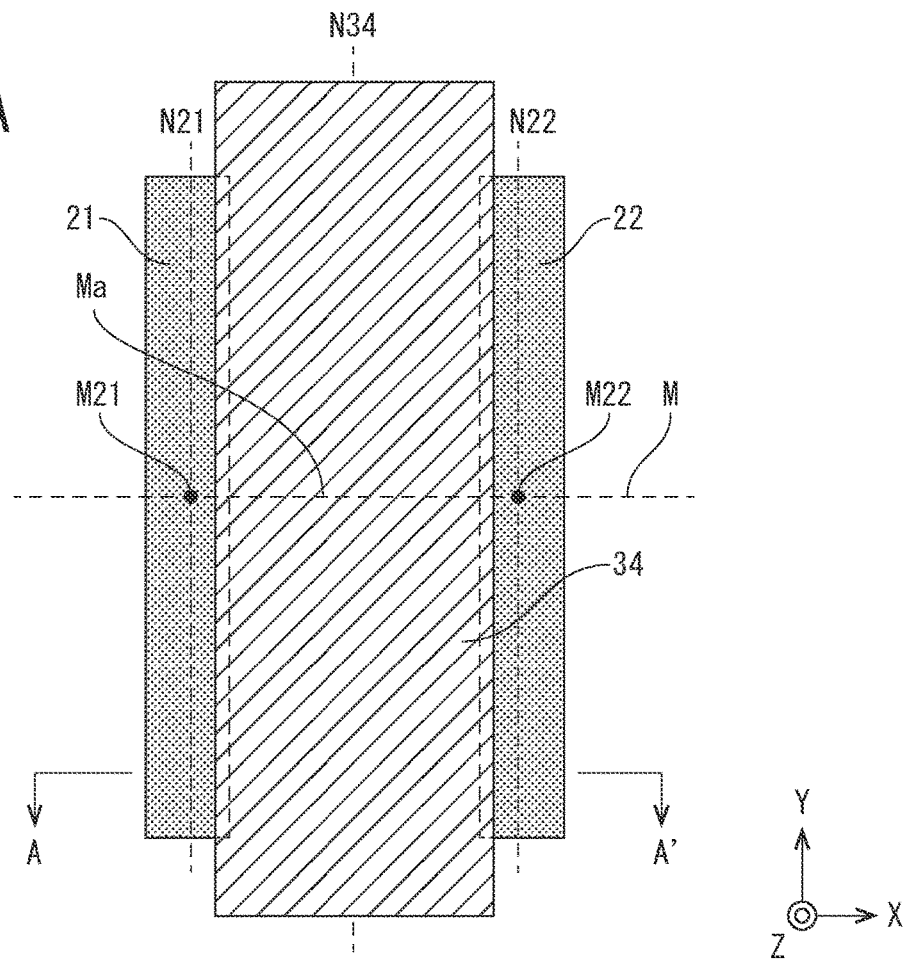
FIGS. 25A and 25B are configuration diagrams of a GMR sensor as a premise of an eighth embodiment of the present embodiment.
Figure 25B:
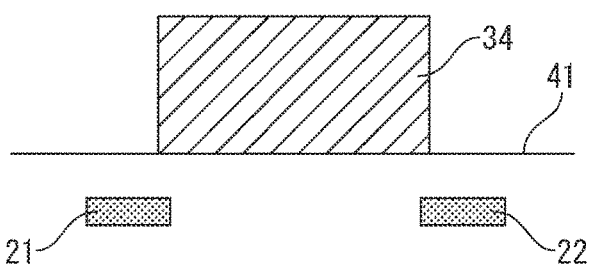

FIGS. 25A and 25B are configuration diagrams of a GMR sensor as the premise of the magnetic sensor according to the present invention. In the drawings, reference numerals 21 and 22 denote the first and second magnetic detectors (magnetosensitive unit), reference numeral 34 denotes a magnetic flux concentrator member, reference numeral 41 denotes the substrate surface, reference symbol M denotes a center line of each of the first and second magnetic detectors 21 and 22 and the magnetic flux concentrator member 34 in the lateral direction, reference symbols M21 and M22 denotes centers of the first and second magnetic detectors 21 and 22, reference symbol Ma denotes a virtual line connecting the centers M21 and M22 of the first and second magnetic detectors, reference symbols N21 and N22 denote center lines of first and second magnetic detectors 21 and 22 in the longitudinal direction, and reference symbol N34 is a center line of the magnetic flux concentrator member 34 in the longitudinal direction. It is to be noted that, as described above, the center line means in a case of the magnetic flux concentrator member 34 for example, a line passing through the center point of the fourth magnetic flux concentrator member 34 (a center both of in length and in width in plan view) and being parallel to the longitudinal direction or the lateral direction. The center line in the longitudinal direction means a center line passing through the center point and extending in the longitudinal direction. The center line in the lateral direction means a center line passing through the center point and extending in the lateral direction.

The magnetic sensor illustrated in FIG. 25 is a sensor for detecting a magnetic field in a direction perpendicular to the substrate surface 41 by using the first and second magnetic detectors 21 and 22 arranged in parallel to the substrate surface 41, and includes the first and second magnetic detectors 21 and 22 arranged in parallel to the substrate surface 41 and the rectangular magnetic flux concentrator member 34 arranged adjacent to the first and second magnetic detectors 21 and 22.

In addition, in plan view of the magnetic sensor, the center line M of the magnetic flux concentrator member 34 in the lateral direction is arranged to intersect with portions of the first and second magnetic detectors 21 and 22. The virtual line Ma connecting the centers M21 and M22 of the first and second magnetic detectors 21 and 22 is perpendicular to the center line N34 of the magnetic flux concentrator member 34 in the longitudinal direction, and the center line N34 of the magnetic flux concentrator member 34 in the longitudinal direction is sandwiched between the center lines N21 and N22 of the first and second magnetic detectors 21 and 22 in the longitudinal direction.

Such a configuration provides a magnetic sensor to output a magnetic field in an axis direction perpendicular to the substrate surface 41 based on a difference between output signals from the first and second magnetic detectors 21 and 22.

In this magnetic sensor, a magnetic field in the direction (Z axis) perpendicular to the substrate surface 41 of an incoming magnetic field is concentrated by the magnetic flux concentrator member 34 to be converted into a magnetic field in a sensitivity axis direction (X-axis direction) of the first magnetic detector 21 for the first magnetic detector 21 and a magnetic field in a direction (−X-axis direction) opposite to a sensitivity axis for the second magnetic detector 22. In addition, the same amount of the magnetic field in the sensitivity axis direction is input to each of the first and second magnetic detectors 21 and 22. The magnetic field in a direction (Y axis) parallel to the substrate surface 41 and perpendicular to the sensitivity axis direction are concentrated by the magnetic flux concentrator member 34, and thus are not input in the sensitivity axis direction of the first and second magnetic detectors 21 and 22 substantively.

Therefore, the difference between the outputs of the first magnetic detector 21 and the second magnetic detector 22 indicates a change in the magnetic field in the direction perpendicular to the substrate surface. Thus, it makes it possible to detect the magnetic field in the direction perpendicular to the substrate surface 41.

However, in such a magnetic sensor, a magnetic field in the sensitivity axis direction (X-axis direction) of the incoming magnetic field is also concentrated, and thus an S/N ratio of the difference between the outputs of the first magnetic detector 21 and the second magnetic detector 22 tends to be deteriorated. In addition, when the absolute value of the magnetic field in the sensitivity axis direction (X-axis direction) is large, only the magnetic field in the sensitivity axis direction (X-axis direction) may exceed a measuring range of the magnetosensitive unit. In such a case, it is difficult to detect the magnetic field in the direction perpendicular to the substrate surface 41 based on the difference between output signals from the first magnetic detector 21 and the second magnetic detector 22.

Therefore, in order to solve the problem mentioned above, a magnetic sensor according to the eight embodiment will be proposed as follows.

FIGS. 26A and 26B are configuration diagrams illustrating an example of a magnetic sensor 108 in the eight embodiment of the present invention.

FIG. 26A is a schematic plan view (the substrate is not illustrated) and FIG. 26B is a schematic sectional view taken along line A-A' of FIG. 26A. In the drawings, reference numerals 21 and 22 denote the first and second magnetic detectors, reference numeral 34 denotes the magnetic flux concentrator member, and reference numeral 41 denotes the substrate surface. In FIGS. 26A and 26B, the first and second magnetic detectors 21 and 22 are provided in the substrate such as a semiconductor substrate, for example. The magnetic flux concentrator member 34 is formed on the semiconductor substrate. That is to say, as illustrated in FIGS. 26A and 26B, the first and second magnetic detectors 21 and 22 are arranged below the magnetic flux concentrator member 34.

As illustrated in FIG. 26B, the cross sectional shape of the magnetic flux concentrator member 34 is an inverted taper shape. In FIG. 26B, reference numeral 34a denotes a base of the magnetic flux concentrator member 34, reference numeral 34b denotes an oblique side of the magnetic flux concentrator member 34 oblique to a vertical direction to the substrate surface 41, that is, an oblique side in the schematic sectional view in FIG. 26B, reference symbol θ denotes the angle (interior angle) between the base 34a and the oblique side 34b. It is to be noted that the cross sectional shape of the magnetic flux concentrator member will be described herein as a trapezoid having an axisymmetric inverted taper shape whose base angles are the same, however, it does not have to be axisymmetric.

The magnetic sensor 108 in the eighth embodiment is a sensor for detecting the magnetic field in a direction perpendicular to the substrate surface 41.

The magnetic sensor 108 includes a detection unit 108a including the first magnetic detector 21 and the second magnetic detector 22 arranged in parallel to the substrate surface 41 and the magnetic flux concentrator member 34 with a rectangular shape arranged adjacent to the first and second magnetic detectors 21 and 22. That is to say, the detection unit 108a includes the first and second magnetic detectors 21 and 22 formed in the substrate and the magnetic flux concentrator member 34 formed on the substrate. The first and second magnetic detectors 21 and 22 are provided in the substrate such as a semiconductor substrate, for example. The magnetic flux concentrator member 34 is formed on the semiconductor substrate. As illustrated in FIG. 26B, the first and second magnetic detectors 21 and 22 are formed below the magnetic flux concentrator member 34. It is to be noted that, as illustrated in FIG. 26B, the first and second magnetic detectors 21 and 22 are arranged closer to obtuse angle portions (i.e. closer to the base 34a) than to acute angle portions of the magnetic flux concentrator member 34 whose cross sectional shape is the inverted taper shape.

The magnetic flux concentrator member 34 may have a rectangular shape in plan view, and a cross sectional shape thereof taken along line A-A' may be the inverted taper shape. In FIG. 26A, the magnetic flux concentrator member has a long narrow rectangular plate shape in plan view, and in FIG. 26B, the cross sectional shape is the inverted taper shape.

The first and second magnetic detectors 21 and 22 have the same shape that is a long narrow and thin rectangular plate shape in plan view. In addition, the thicknesses, widths, and lengths of the first and second magnetic detectors 21 and 22 are preferably shorter than those of the magnetic flux concentrator member 34, respectively.

In addition, in the light of improvement the detection accuracy of the magnetic field in an axis direction perpendicular to the substrate surface 41, in plan view of the substrate surface 41, the magnetic flux concentrator member 34 preferably overlaps with portions of the first and second magnetic detectors 21 and 22.

That is to say, as illustrated in FIG. 26A, the first and second magnetic detectors 21 and 22 are arranged such that the edge portion on the right side of the first magnetic detector 21 extending in the longitudinal direction thereof overlaps with only the edge portion on the left side of the magnetic flux concentrator member 34 extending in the longitudinal direction thereof and the edge portion on the left side of the second magnetic detector 22 extending in the longitudinal direction thereof overlaps with only the edge portion on the right side of the magnetic flux concentrator member 34 extending in the longitudinal direction thereof, in plan view.

Furthermore, the first and second magnetic detectors 21 and 22 are arranged such that the center lines N21 and N22 thereof in the longitudinal directions are parallel to the center line N34 of the magnetic flux concentrator member 34 in the longitudinal direction, and the center lines M of the first and second magnetic detectors 21 and 22 in the lateral directions coincide with the center line M of the magnetic flux concentrator member 34 in the lateral direction.

That is to say, as illustrated in FIG. 26A, the first and second magnetic detectors 21 and 22 are arranged such that, in plan view, the center line M of the magnetic flux concentrator member 34 in the lateral direction intersects the portions of the first and second magnetic detectors 21 and 22, and the virtual line Ma connecting the centers M21 and M22 of the first and second magnetic detectors 21 and 22 is perpendicular to the center line N34 of the magnetic flux concentrator member 34 in the longitudinal direction.

In addition, in plan view, the center line N34 of the magnetic flux concentrator member 34 in the longitudinal direction is sandwiched between the center lines N21 and N22 of the first and second magnetic detectors 21 and 22 in the longitudinal direction. In a cross sectional view perpendicular to the substrate surface 41 and perpendicular to the center line N34 of the magnetic flux concentrator member 34 in the longitudinal direction, the cross sectional shape of the magnetic flux concentrator member 34 is the inverted taper shape, and the angle $\theta$ between the base 34a and the oblique side 34b is preferably larger than 90 degrees and equal to or smaller than 110 degrees.

The output signal of each of the first and second magnetic detectors 21 and 22 is input to the calculator 50. The calculator 50 is configured to perform a predetermined calculation processing based on the output signals to calculate the magnetic field in the axis direction perpendicular to the substrate surface 41 based on the difference between the output signals of the first and second magnetic detectors 21 and 22.

The substrate on which the magnetic flux concentrator member 34 is formed is not particularly limited, but may be a silicon substrate, a compound semiconductor substrate, a ceramic substrate, or the like. The substrate on which a circuit is formed can be used.

In addition, the first and second magnetic detectors 21 and 22 are not particularly limited as long as they are configured to output a signal depending on an input magnetic flux. In the light of easy detection of a magnetic field component of each axis, however, each magnetic detector is preferably a magnetoresistance effect element, and is more preferably a giant magnetoresistance effect element (GMR element) or a tunneling magnetoresistance effect element (TMR element) in the light of obtaining a high MR ratio. A known magnetoresistance effect element, a known GMR element, or a known TMR element can be used. Each of the first and second magnetic detectors 21 and 22 may be formed as a single element of any type of the magnetoresistance effect element, the GMR element, and the TMR element described above, or may be formed as plural elements of any type of them connected in series with each other. In the light of a consumption current and an output signal noise, the first and second magnetic detectors 21 and 22 may be formed as plural elements connected in series with each other.

In addition, in the light of an effective detection of the magnetic field in the axis direction perpendicular to the substrate surface 41, the sensitivity axes of the first and second magnetic detectors 21 and 22 are preferably set to be closest to an axis (X-axis) in the lateral direction of the magnetic flux concentrator member 34 in plan view of the magnetic sensor 108, out of an axis (Z-axis) perpendicular to the substrate surface 41, an axis (Y-axis) in the longitudinal direction of the magnetic flux concentrator member 34 in plan view of the magnetic sensor 108 and the axis (X-axis) in the lateral direction of the magnetic flux concentrator member 34 in plan view of the magnetic sensor 108.

In addition, the magnetic flux concentrator member 34 may have a rectangular shape in plan view of the substrate surface 41. In order to obtain the magnetic flux concentration effect, it is preferable that the magnetic flux concentrator member be made of magnetic material having soft magnetic characteristics. An example of material used for the magnetic flux concentrator member 34 may be NiFe, NiFeB, NiFeCo, CoFe, or the like, without being limited thereto. Other suitable material may be used depending on requested characteristics.

For high accuracy detection and a large measurement range of the magnetic field in the perpendicular direction, the angle $\theta$ between the base 34a of the magnetic flux concentrator member 34 and the oblique side 34b of the magnetic flux concentrator member 34 is preferably larger than 90 degrees and equal to or smaller than 110 degrees.

In this way, when the angle $\theta$ between the base 34a of the magnetic flux concentrator member 34 and the oblique side 34b of the magnetic flux concentrator member 34 is larger than 90 degrees and equal to or smaller than 110 degrees, it is possible to improve the detection accuracy of the magnetic field in the perpendicular direction and to enlarge the measurement range.

Next, a magnetic detection method in the direction perpendicular to the substrate surface 41 by using the magnetic sensor 108 of the eighth embodiment in a case in which the magnetic field B is applied will be described below.

Figure 27A:
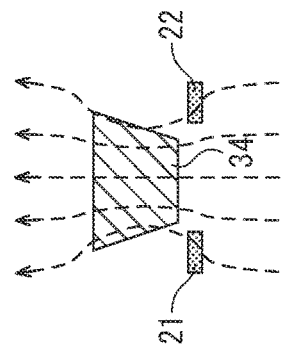
FIGS. 27A to 27D are schematic views illustrating magnetic fluxes of magnetic fields in the respective axes in the eighth embodiment.
Figure 27C:
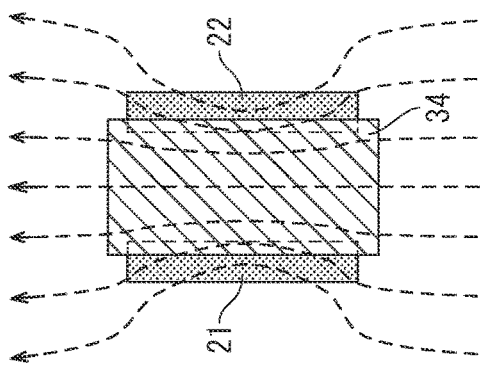
Figure 27B:
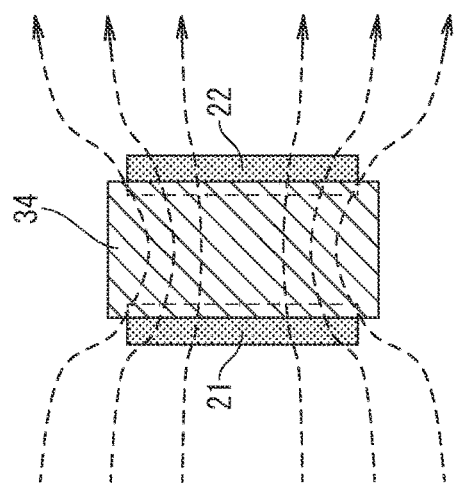
Figure 27D:
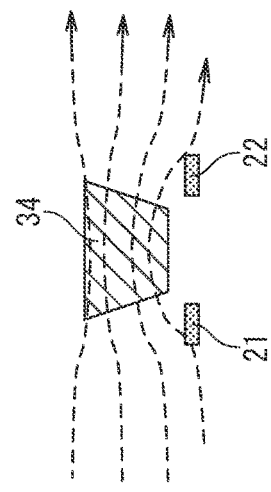

FIGS. 27A to 27D are schematic views illustrating magnetic fluxes of the magnetic fields in the respective axes in the magnetic sensor 108 illustrated in FIGS. 26A and 26B. FIG. 27A is a plain view illustrating the magnetic field Bx of the X-axis component, FIG. 27B is a cross-sectional view of FIG. 27A, FIG. 27C is a plain view illustrating the magnetic field By of the Y-axis component, and FIG. 27D is a cross-sectional view illustrating the magnetic field Bz of the Z-axis component.

It is to be noted that the axis in the in the lateral direction of the magnetic flux concentrator member 34 in plan view of the magnetic sensor 108 is referred to as the X axis, the axis in the longitudinal direction of the magnetic flux concentrator member 34 in plan view of the magnetic sensor 108 is referred to as the Y axis, and the axis perpendicular to the substrate surface 41 is referred to as the Z axis, for convenience' sake.

GMR elements are used as the first and second magnetic detectors 21 and 22. R0 refers to the resistances of the first and second magnetic detectors 21 and 22 when no magnetic field is applied thereto. A magnetization direction of the pinned layer is set to the X-axis direction and the magnetization easy axis of the free layer is set to the Y-axis direction so as to set all of the sensitivity axes of the first and second magnetic detectors 21 and 22 to the X-axis direction. That is, the resistances change depending on the X-axis component of the magnetic field applied to each of the first and second magnetic detectors 21 and 22. $\alpha$ refers to the sensitivity of the resistance change when the magnetic field is applied in the direction of the sensitivity axis. That is, the resistance R of each of the first and second magnetic detectors 21 and 22 becomes $R=R0+\alpha B1$, when the magnetic field B1 is applied in the direction of the sensitivity axis of each of the first and second magnetic detectors 21 and 22.

Herein, resistances (R1 and R2) of the respective elements (the first and second magnetic detectors 21 and 22) are calculated based on change amounts of currents by driving the respective elements (the first and second magnetic detectors 21 and 22) at the constant voltage or the constant current. For the purpose of simplifying the description, a calculation principle based on the resistance will be described below, however, the magnetic field of the Z axis can be calculated based on the output signal (current or voltage) itself in an actual magnetic sensor.

By resolving the magnetic field B into components of the X axis, the Y axis and the Z axis, B=Bx+By+Bz is obtained.

As illustrated in FIGS. 27A and 27B, the magnetic field Bx of the X-axis component is concentrated by the magnetic flux concentrator member 34 at the conversion coefficient a.

Herein, since the cross sectional shape of the magnetic flux concentrator member 34 is the inverted taper shape, most of the magnetic field Bx of the X-axis component is concentrated in the upper portion of the magnetic flux concentrator member 34, it is possible to decrease the magnetic field input to the magnetic detectors 21 and 22 arranged below the magnetic flux concentrator member 34. When it is assumed that the ratio between magnetic flux densities of the upper portion and the lower portion of the magnetic flux concentrator member 34 is b (0<b<1), the magnetic field Bx of the X-axis component is input to all of the first and second magnetic detectors 21 and 22 as abBx in the positive direction.

In addition, as illustrated in FIG. 27C, the magnetic field By of the Y-axis component is concentrated by the magnetic flux concentrator member 34 to be converted into the magnetic field in the X axis. Since the first and second magnetic detectors 21 and 22 are arranged such that the center lines N21 and N22 thereof in the lateral directions coincide with the center line N34 of the magnetic flux concentrator member 34 in the lateral direction, the magnetic field in the X-axis direction is canceled because of the symmetry.

As illustrated in FIG. 27D, the magnetic field Bz of the Z-axis component is concentrated by the magnetic flux concentrator member 34. Since the magnetic field acts on the first and second magnetic detectors 21 and 22 obliquely with respect to the Z axis, the magnetic field is converted at the conversion coefficient c to the X-axis direction, and then is input to the first and second magnetic detectors 21 and 22. cBz is input to the first magnetic detector 21 in the positive direction and cBz is input to the second magnetic detector 22 in the negative direction.

Based on the above, the resistances R1 and R2 of the first and second magnetic detectors 21 and 22 when the magnetic field B is applied are represented by following expressions (1-8) and (2-8).

$$R1=\Delta \times (abBx+cBz)+R0 \quad (1\text{-}8)$$

$$R2=\Delta \times (abBx-cBz)+R0 \quad (2\text{-}8)$$

Herein, as represented by expression (3-8), the resistance depending on only the magnetic field Bz of the Z-axis component is calculated from "expression (1-8)–expression (2-8)".

$$R1-R2=2\alpha cBz \quad (3\text{-}8)$$

Herein, as understood from the above calculation, the magnetic flux concentrator member 34 having the inverted taper shape makes it possible to decrease the influence of the magnetic field in the X direction on the first and second magnetic detectors 21 and 22. In this way, the influence of the external magnetic field is decreased, and thus the magnetic field in the direction perpendicular to the substrate surface 41 can be detected with high accuracy. In addition, in the light of magnetization saturation, the input of the magnetic field in the X direction to the magnetosensitive unit is decreased, and thus it is possible to obtain a magnetic sensor detecting a broad range of the magnetic field in the direction perpendicular to the substrate surface 41.

Ninth Embodiment

Next, a ninth embodiment of the present invention will be described below.

A magnetic sensor 109 in the ninth embodiment includes the first magnetic flux concentrator member 35 and the second magnetic flux concentrator member 36 for the first and second magnetic detectors 21 and 22, respectively, in comparison with the magnetic sensor 108 in the eighth embodiment illustrated in FIGS. 26A and 26B.

Figure 28A:
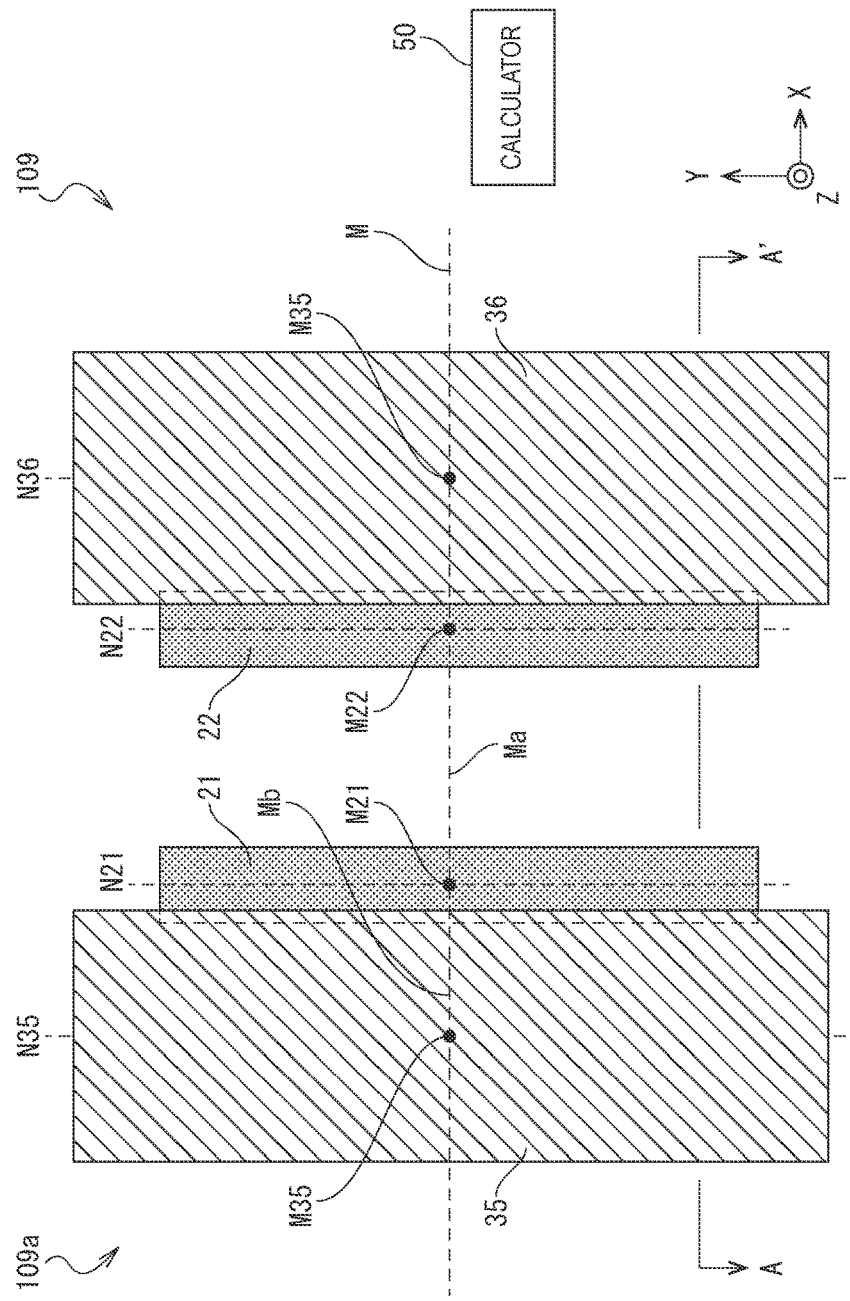
FIGS. 28A and 28B are configuration diagrams illustrating an example of a ninth embodiment of the present invention.
Figure 28B:
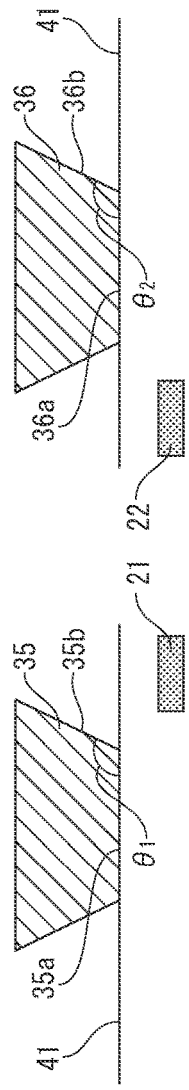

FIGS. 28A and 28B are schematic diagrams illustrating an example of the magnetic sensor 109 the ninth embodiment of the present invention.

FIG. 28A is a schematic plan view (the substrate is not illustrated) and FIG. 28B is a schematic sectional view taken along line A-A' of FIG. 28A. In the drawings, reference numeral 35 denotes a first magnetic flux concentrator member, and reference numeral 36 denotes a second magnetic flux concentrator member, reference numeral 35a denotes a base of the first magnetic flux concentrator member 35, reference numeral 36a denotes a base of the second magnetic flux concentrator member 36, reference symbols M35 and M36 denote centers of the first and second magnetic flux concentrator members 35 and 36, reference symbol Mb denotes a virtual straight line connecting the centers M35 and M36 of the first and second magnetic flux concentrator members 35 and 36, reference symbol N35 is a center line of the first magnetic flux concentrator member 35 in the longitudinal direction thereof, reference symbol N36 is a center line of the second magnetic flux concentrator member 36 in the longitudinal direction thereof, reference symbol θ1 is an angle (interior angle) between the base 35a of the first magnetic flux concentrator member 35 and an oblique side 35b of the first magnetic flux concentrator member 35 whose cross sectional shape is formed to be the inverted taper shape, and reference symbol θ2 is an angle (interior angle) between the base 36a of the second magnetic flux concentrator member 36 and an oblique side 36b of the second magnetic flux concentrator member 36 whose cross sectional shape is formed to be the inverted taper shape.

The output signal of each of the first and second magnetic detectors 21 and 22 is input to the calculator 50. The calculator 50 is configured to perform a predetermined calculation processing based on the output signals to calculate the magnetic field in the axis direction perpendicular to the substrate surface 41 based on the difference between the output signals of the first and second magnetic detectors 21 and 22.

It is to be noted that, in FIGS. 28A and 28B, the same reference numerals and reference symbols are assigned to the components having the same functions as those in FIGS. 26A and 26B.

The magnetic sensor 109 in the ninth embodiment is a magnetic sensor for detecting the magnetic field in a direction perpendicular to the substrate surface 41.

The magnetic sensor 109 includes a detection unit 109a including the first magnetic detector 21 and the second magnetic detector 22 arranged in parallel to the substrate surface 41, and the first magnetic flux concentrator member 35 with a rectangular shape and the second magnetic flux concentrator member 36 with a rectangular shape arranged adjacent to the first and second magnetic detectors 21 and 22, respectively. That is to say, the magnetic sensor 109 includes the first and second magnetic detectors 21 and 22 formed in the substrate and the first and second magnetic flux concentrator members 35 and 36 formed on the substrate.

In addition, the first and second magnetic detectors 21 and 22 are arranged such that, in plan view, the virtual straight line Mb connecting the centers M35 and M36 of the first and second magnetic flux concentrator members 35 and 36 intersects the portions of the first and second magnetic detectors 21 and 22, and the virtual line Ma connecting the centers M21 and M22 of the first and second magnetic detectors 21 and 22 is perpendicular to the center lines N35 and N36 of the first and second magnetic flux concentrator members 35 and 36 in the longitudinal direction.

In addition, the first and second magnetic detectors 21 and 22 are arranged at sides opposing to each other of the first and second magnetic flux concentrator members 35 and 36, respectively. The first and second magnetic detectors 21 and 22 are arranged such that the center lines N21 and N22 thereof in the longitudinal direction are sandwiched between the center lines N35 and N36 of the first and second magnetic flux concentrator members 35 and 36 in the longitudinal direction.

In addition, in a cross sectional view perpendicular to the substrate surface 41 and perpendicular to the center lines N35 and N36 of the first and second magnetic flux concentrator members 35 and 36 in the longitudinal direction, cross sectional shapes of the first and second magnetic flux concentrator members 35 and 36 are the inverted taper shapes, and the angles θ1 and θ2 between the bases 35a, 36a and the oblique sides 35b, 36b, respectively, are preferably larger than 90 degrees and equal to or smaller than 110 degrees.

In addition, in the light of improvement of the sensitivity of the magnetic field in the axis direction perpendicular to the substrate surface 41, in plan view of the substrate surface 41, the first and second magnetic flux concentrator members 35 and 36 preferably overlap with portions of the first and second magnetic detectors 21 and 22.

That is to say, as illustrated in FIG. 28A, the first and second magnetic detectors 21 and 22 are arranged such that the edge portion on the left side of the first magnetic detector 21 extending in the longitudinal direction thereof overlaps with only the edge portion on the right side of the first magnetic flux concentrator member 35 extending in the longitudinal direction thereof, and the edge portion on the right side of the second magnetic detector 22 extending in the longitudinal direction thereof overlaps with only the edge portion on the left side of the second magnetic flux concentrator member 36 extending in the longitudinal direction thereof. That is to say, the first and second magnetic detectors 21 and 22 are arranged between the first and second magnetic flux concentrator members 35 and 36, in plan view.

Furthermore, the first and second magnetic detectors 21 and 22 are arranged such that the center lines N21 and N22 thereof in the longitudinal directions and the center lines N35 and N36 of the first and second magnetic flux concentrator members 35 and 36 in the longitudinal direction are parallel to one another, and the centerlines M of the first and second magnetic detectors 21 and 22 in the lateral directions coincide with the center lines M of the first and second magnetic flux concentrator members 35 and 36 in the lateral direction. In addition, as illustrated in FIG. 27B, the first and second magnetic detectors 21 and 22 are arranged closer to obtuse angle portions (i.e. closer to the bases 35a and 36a) than to acute angle portions of the magnetic flux concentrator members 35 and 36, respectively, whose cross sectional shapes are the inverted taper shapes.

Figure 29A:
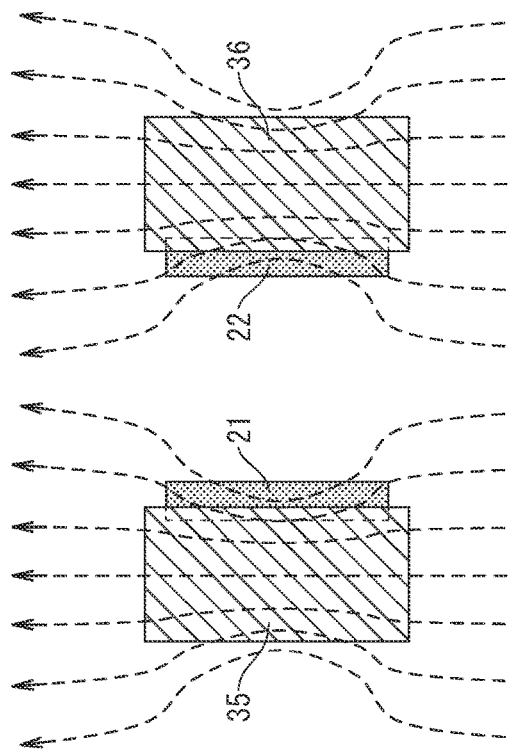
FIGS. 29A to 29D are schematic views illustrating magnetic fluxes of magnetic fields in the respective axes in the ninth embodiment.
Figure 29C:
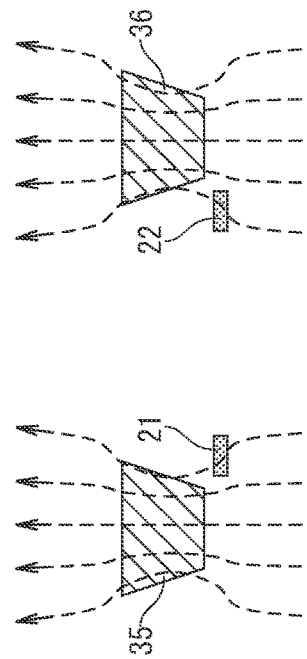
Figure 29B:
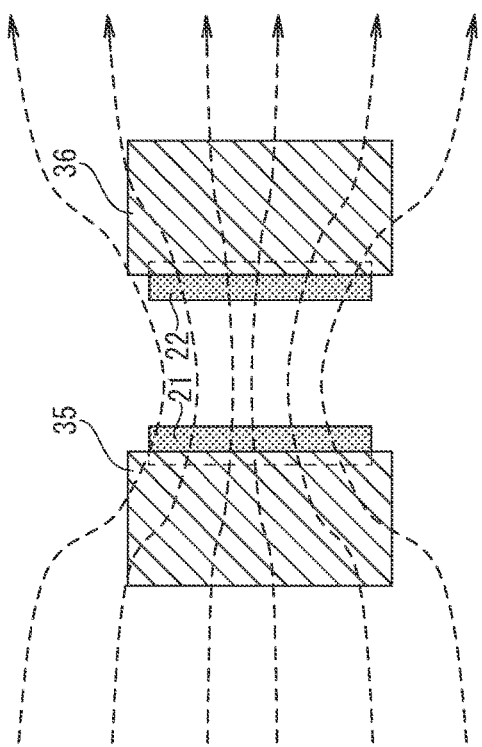
Figure 29D:
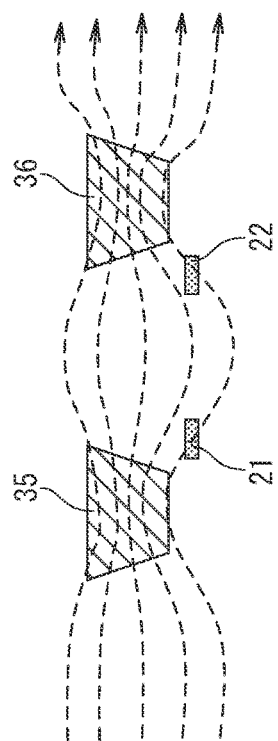

Such a configuration can output a signal depending on the magnetic field in the axis direction perpendicular to the substrate surface 41 based on the difference between the output signals from the first and second magnetic detectors 21 and 22. FIGS. 29A to 29D are schematic views illustrating magnetic fluxes of the magnetic fields in the respective axes in the magnetic sensor 109 illustrated in FIGS. 28A and 28B. FIG. 29A is a plain view illustrating the magnetic field Bx of the X-axis component, FIG. 29B is a cross-sectional view of FIG. 29A, FIG. 29C is a plain view illustrating the magnetic field By of the Y-axis component, and FIG. 29D is a cross-sectional view illustrating the magnetic field Bz of the Z-axis component.

By resolving the magnetic field B into components of the X axis, the Y axis and the Z axis, B=Bx+By+Bz is obtained.

As illustrated in FIG. 29A, the magnetic field Bx of the X-axis component is concentrated by the first and second magnetic flux concentrator members 35 and 36 at the conversion coefficient a. Herein, since the cross sectional shape of each of the first and second magnetic flux concentrator members 35 and 36 is the inverted taper shape, most of the magnetic field Bx of the X-axis component is concentrated in the upper portions of the first and second magnetic flux concentrator members 35 and 36, it is possible to decrease the magnetic field input to the magnetic detectors 21 and 22 arranged below the first and second magnetic flux concentrator members 35 and 36. When it is assumed that the ratio between magnetic flux densities of the upper portion and the lower portion of each of the first and second magnetic flux concentrator members 35 and 36 is b (0<b<1), the magnetic field Bx of the X-axis component is input to all of the first and second magnetic detectors 21 and 22 as abBx in the positive direction.

In addition, as illustrated in the schematic plan view (the substrate is not illustrated) in FIG. 29C, the magnetic field By of the Y-axis component is concentrated by the first and second magnetic flux concentrator members 35 and 36 to be converted into the magnetic field in the X axis. Since the first and second magnetic detectors 21 and 22 are arranged such that the center lines thereof in the lateral directions coincide with the centers line of the first and second magnetic flux concentrator members 35 and 36 in the lateral direction, the magnetic field of in the X-axis direction is canceled because of the symmetry.

In addition, as illustrated in the schematic cross-sectional view in FIG. 29D, the magnetic field Bz of the Z-axis component is concentrated by the first and second magnetic flux concentrator members 35 and 36. Since the magnetic field acts on the first and second magnetic detectors 21 and 22 obliquely with respect to the Z axis, the magnetic field is converted at the conversion coefficient c to the X-axis direction, and then is input to the first and second magnetic detectors 21 and 22. cBz is input to the first magnetic detector 21 in the negative direction and cBz is input to the second magnetic detector 22 in the positive direction.

Based on the above, the resistances R1 and R2 of the first and second magnetic detectors 21 and 22 when the magnetic field B is applied are represented by following expressions (1-9) and (2-9).

$$R1=\Delta\times(abBx-cBz)+R0 \quad (1\text{-}9)$$

$$R2=\Delta\times(abBx+cBz)+R0 \quad (2\text{-}9)$$

Herein, as represented by expression (3-9), the resistance depending on only the magnetic field Bz of the Z-axis component is calculated from "expression (2-9)−expression (1-9)".

$$R2-R1=2\alpha cBz \quad (3\text{-}9)$$

Herein, as understood from the above calculation, the first and second magnetic flux concentrator members 35 and 36 having the inverted taper shape makes it possible to decrease the influence of the magnetic field in the X direction on the magnetic detectors. In this way, the influence of the external magnetic field is decreased, and thus the magnetic field in the direction perpendicular to the substrate surface 41 can be detected with high accuracy. In addition, in the light of magnetization saturation, the input of the magnetic field in the X direction to the magnetic detector is decreased, and thus it is possible to obtain a magnetic sensor detecting a broad range of the magnetic field in the direction perpendicular to the substrate surface 41.

Tenth Embodiment

Next, a tenth embodiment of the present invention will be described below.

The magnetic sensor 110 in the tenth embodiment is different from the magnetic sensor 109 in the ninth embodiment illustrated in FIGS. 28A and 28B in that, while the first and second magnetic detectors 21 and 22 are arranged at the sides opposing to each other of the first and second magnetic flux concentrator members 35 and 36 in the magnetic sensor 109, in the magnetic sensor 110, the first and second magnetic detectors 21 and 22 are arranged at back sides of the first and second magnetic flux concentrator members 35 and 36, respectively, that is, a face of the magnetic flux concentrator member 35 on an opposite side to the magnetic flux concentrator member 36 and a face of the magnetic flux concentrator member 36 on an opposite side to the magnetic flux concentrator member 35.

FIGS. 30A and 30B are configuration diagrams illustrating an example of a magnetic sensor 110 in the tenth embodiment.

The same reference numerals and reference symbols are assigned to the same portions as those in the magnetic sensor 109 in the ninth embodiment illustrated in FIGS. 28A and 28B.

The magnetic sensor 110 is a magnetic sensor for detecting the magnetic field in a direction perpendicular to the substrate surface 41.

The magnetic sensor 110 includes a detection unit 110a including the first and second magnetic detectors 21 and 22 arranged in parallel to the substrate surface 41, and the first magnetic flux concentrator member 35 with the rectangular shape and the second magnetic flux concentrator member 36 with the rectangular shape arranged adjacent to the first and second magnetic detectors 21 and 22, respectively. The output signal of each of the first and second magnetic detectors 21 and 22 is input to the calculator 50. The calculator 50 is configured to perform a predetermined calculation processing based on the output signals to calculate the magnetic field in the axis direction perpendicular to the substrate surface 41 based on the difference between the output signals of the first and second magnetic detectors 21 and 22.

In addition, the first and second magnetic detectors 21 and 22 are arranged such that, in plan view, the virtual straight line Mb connecting the centers M35 and M36 of the first and second magnetic flux concentrator members 35 and 36 intersects the portions of the first and second magnetic detectors 21 and 22, and the virtual line Ma connecting the centers M21 and M22 of the first and second magnetic detectors 21 and 22 is perpendicular to the center lines N35 and N36 of the first and second magnetic flux concentrator members 35 and 36 in the longitudinal direction.

In addition, the first and second magnetic detectors 21 and 22 are arranged at the back sides of the first and second magnetic flux concentrator members 35 and 36, respectively. The first and second magnetic detectors 21 and 22 are arranged such that the center lines N35 and N36 of the first and second magnetic flux concentrator members 35 and 36 in the longitudinal direction are sandwiched between the center lines N21 and N22 of the first and second magnetic detectors 21 and 22 in the longitudinal direction.

In addition, in the cross sectional view perpendicular to the substrate surface 41 and perpendicular to the center lines N35 and N36 of the first and second magnetic flux concentrator members 35 and 36 in the longitudinal direction, the angles θ1 and θ2 in the first and second magnetic flux concentrator members 35 and 36, respectively, between the bases 35a, 36a and the oblique sides 35b, 36b are preferably larger than 90 degrees and equal to or smaller than 110 degrees.

In addition, in the light of improvement of the sensitivity of the magnetic field in the axis direction perpendicular to the substrate surface 41, in plan view of the substrate surface 41, the first and second magnetic flux concentrator members 35 and 36 preferably overlap with the portions of the first and second magnetic detectors 21 and 22.

That is to say, as illustrated in FIG. 30A, the first and second magnetic detectors 21 and 22 are arranged such that the edge portion on the right side of the first magnetic detector 21 extending in the longitudinal direction thereof overlaps with only the edge portion on the left side of the first magnetic flux concentrator member 35 extending in the longitudinal direction thereof, and the edge portion on the left side of the second magnetic detector 22 extending in the longitudinal direction thereof overlaps with only the edge portion on the right side of the second magnetic flux concentrator member 36 extending in the longitudinal direction thereof.

Furthermore, the first and second magnetic detectors 21 and 22 are arranged such that the center lines N21 and N22 thereof in the longitudinal directions and the center lines N35 and N36 of the first and second magnetic flux concentrator members 35 and 36 in the longitudinal direction are parallel to one another, and the centerlines M of the first and second magnetic detectors 21 and 22 in the lateral directions coincide with the center lines M of the first and second magnetic flux concentrator members 35 and 36 in the lateral direction. In addition, as illustrated in FIG. 30B, the first and second magnetic detectors 21 and 22 are arranged closer to the obtuse angle portions (i.e. closer to the bases 35a and 36b) than to the acute angle portions of the first and second magnetic flux concentrator members 35 and 36, respectively, whose cross sectional shapes are the inverted taper shapes.

In this way, it is possible to output the magnetic field in the axis direction perpendicular to the substrate surface 41 based on the difference between output signals from the first and second magnetic detectors 21 and 22.

Eleventh Embodiment

Next, an eleventh embodiment of the present invention will be described below.

Figure 32A:
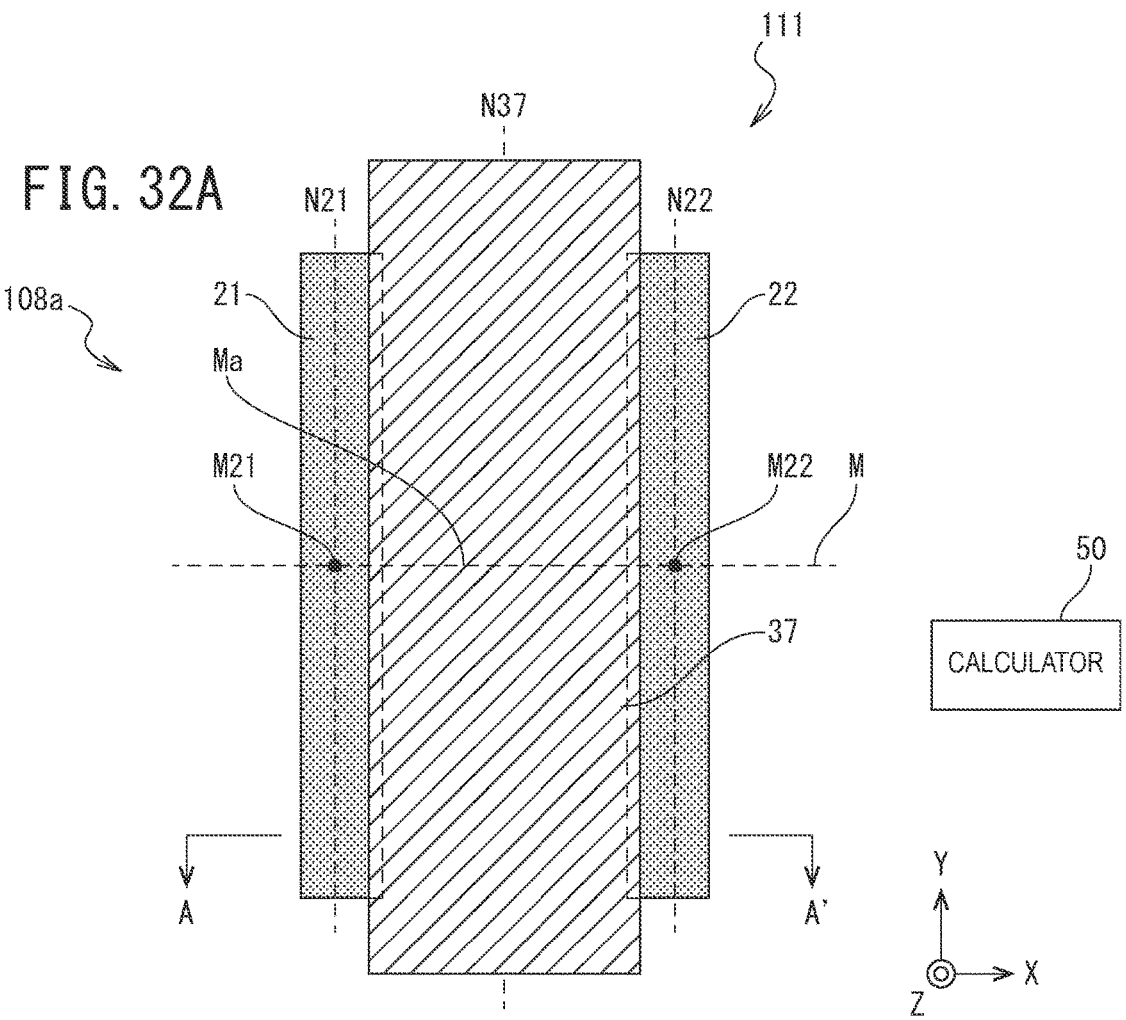
FIGS. 32A and 32B are configuration diagrams illustrating an example of an eleventh embodiment of the present invention.
Figure 32B:
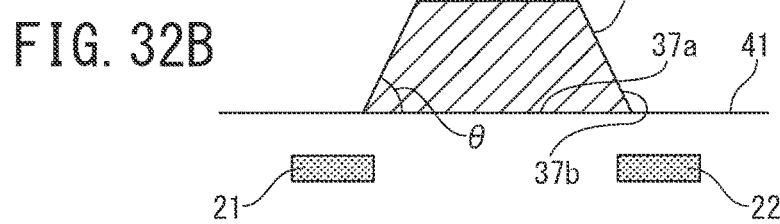

As illustrated in FIGS. 32A and 32B, a magnetic sensor 111 in the eleventh embodiment is different from the magnetic sensor 108 in the eighth embodiment illustrated in FIGS. 26A and 26B, in that the cross sectional shape of a magnetic flux concentrator member 37 is a forward tapered shape. That is to say, the cross sectional shape of the magnetic flux concentrator member 37 has an upper base shorter than a lower base. In plan view of the magnetic flux concentrator member 37, the upper base of the magnetic flux concentrator member 37 is completely included in the lower base of the magnetic flux concentrator member 37. The first and second magnetic detectors 21 and 22 are arranged closer to obtuse angle portions (i.e. closer to the upper base) than to acute angle portions of the magnetic flux concentrator member 37 whose cross sectional shape is the forward tapered shape. When reference numeral 37a denotes the lower base of the magnetic flux concentrator member 37 and reference numeral 37b denotes an oblique side of the magnetic flux concentrator member 37 oblique to a vertical direction to the substrate surface 41, the angle (interior angle) θ between the lower base 37a and the oblique side 37b is preferably equal to or larger than 70 degrees and smaller than 90 degrees. When the interior angle θ is equal to or larger than 70 degrees and smaller than 90 degrees, it is possible to improve the detection accuracy of the magnetic field in the perpendicular direction and to enlarge the measurement range. The cross sectional shape of the magnetic flux concentrator member does not have to be axisymmetric.

Twelfth Embodiment

Next, a twelfth embodiment of the present invention will be described below.

The magnetic sensor 112 in the twelfth embodiment is different from the magnetic sensor 109 in the ninth embodiment illustrated in FIGS. 28A and 28B, in that the cross sectional shapes of the first and second magnetic flux concentrator members 35 and 36 are the forward tapered shapes. The cross sectional shape of the magnetic flux concentrator member 35 has an upper base shorter than a lower base. In plan view of the magnetic flux concentrator member 35, the upper base of the magnetic flux concentrator member 35 is completely included in the lower base of the magnetic flux concentrator member 35. The same applies to the magnetic flux concentrator member 36.

The first and second magnetic detectors 21 and 22 are arranged closer to the obtuse angle portions (i.e. closer to the upper bases) than to the acute angle portions of the first and second magnetic flux concentrator members 35 and 36, respectively, whose cross sectional shapes are the forward tapered shapes. When reference numeral 35a denotes the lower base of the magnetic flux concentrator member 35 and reference numeral 35b denotes an oblique side of the magnetic flux concentrator member 35 oblique to a vertical direction to the substrate surface 41, the angle (interior angle) θ between the lower base 35a and the oblique side 35b is preferably equal to or larger than 70 degrees and smaller than 90 degrees. When reference numeral 36a denotes the lower base of the magnetic flux concentrator member 36 and reference numeral 36b denotes an oblique side of the magnetic flux concentrator member 36 oblique to the vertical direction to the substrate surface 41, the angle (interior angle) θ between the lower base 36a and the oblique side 36b is preferably equal to or larger than 70 degrees and smaller than 90 degrees.

When the interior angle θ is equal to or larger than 70 degrees and smaller than 90 degrees, it is possible to improve the detection accuracy of the magnetic field in the perpendicular direction and to enlarge the measurement range. The cross sectional shape of the magnetic flux concentrator member does not have to be axisymmetric.

Thirteenth Embodiment

Next, a thirteenth embodiment of the present invention will be described below.

The magnetic sensor 113 in the thirteenth embodiment is different from the magnetic sensor 110 in the tenth embodiment illustrated in FIGS. 30A and 30B, in that the cross sectional shapes of the first and second magnetic flux concentrator members 35 and 36 are the forward tapered shapes. The first and second magnetic detectors 21 and 22 are arranged closer to the obtuse angle portions (i.e. closer to the upper bases) than to the acute angle portions of the first and second magnetic flux concentrator members 35 and 36, respectively, whose cross sectional shapes are the forward tapered shapes. The cross sectional shape of the magnetic flux concentrator member 35 has the upper base shorter than the lower base. In plan view of the magnetic flux concentrator member 35, the upper base of the magnetic flux concentrator member 35 is completely included in the lower base of the magnetic flux concentrator member 35. The same applies to the magnetic flux concentrator member 36.

When reference numeral 35a denotes the lower base of the magnetic flux concentrator member 35 and reference numeral 35b denotes the oblique side of the magnetic flux concentrator member 35 oblique to the vertical direction to the substrate surface 41, the angle (interior angle) θ between the lower base 35a and the oblique side 35b is preferably equal to or larger than 70 degrees and smaller than 90 degrees. When reference numeral 36a denotes the lower base of the magnetic flux concentrator member 36 and reference numeral 36b denotes the oblique side of the magnetic flux concentrator member 36 oblique to the vertical direction to the substrate surface 41, the angle (interior angle) θ between the lower base 36a and the oblique side 36b is preferably equal to or larger than 70 degrees and smaller than 90 degrees.

When the interior angle is equal to or larger than 70 degrees and smaller than 90 degrees, it is possible to improve the detection accuracy of the magnetic field in the perpendicular direction and to enlarge the measurement range. The cross sectional shape of the magnetic flux concentrator member may not necessarily be axisymmetric.

Some aspects of the magnetic sensor in the eighth to thirteenth embodiments described above will be described below.

(Aspect 1)

A magnetic sensor including:

a detection unit including:

a magnetic flux concentrator member provided on or in a substrate; and a first magnetic detector and a second magnetic detector each of which is arranged adjacent to the magnetic flux concentrator member, and a calculator configured to calculate a magnetic field perpendicular to a plane of the substrate based on an output of the first magnetic detector and an output of the second magnetic detector, wherein the magnetic flux concentrator member is arranged between the first magnetic detector and the second magnetic detector in plan view of the detection unit, a shape of a side surface of the magnetic flux concentrator member is a forward tapered shape or an inverted taper shape in a cross sectional view perpendicular to a surface of the substrate and perpendicular to a longitudinal direction of the magnetic flux concentrator member, and the first magnetic detector and the second magnetic detector are arranged closer to an obtuse angle portion than to an acute angle portion of the magnetic flux concentrator member.

(Aspect 2)

The magnetic sensor according to the aspect 1, wherein an upper base of the magnetic flux concentrator member is longer than a lower base of the magnetic flux concentrator member in a cross sectional view of the magnetic flux concentrator member perpendicular to the surface of the substrate and perpendicular to the longitudinal direction of the magnetic flux concentrator member, and the upper base of the magnetic flux concentrator member completely covers the lower base of the magnetic flux concentrator member in plan view of the magnetic flux concentrator member.

(Aspect 3)

The magnetic sensor according to the aspect 1 or 2, wherein an angle between the lower base of the magnetic flux concentrator member and an oblique side of the magnetic flux concentrator member oblique to a vertical direction to the surface of the substrate is larger than 90 degrees and equal to or smaller than 110 degrees in the cross sectional view perpendicular to the surface of the substrate and perpendicular to the longitudinal direction of the magnetic flux concentrator member.

(Aspect 4)

The magnetic sensor according to the aspect 1, wherein an upper base of the magnetic flux concentrator member is shorter than a lower base of the magnetic flux concentrator member in a cross sectional view of the magnetic flux concentrator member perpendicular to the surface of the substrate and perpendicular to the longitudinal direction of the magnetic flux concentrator member, and the upper base of the magnetic flux concentrator member is completely included in the lower base of the magnetic flux concentrator member in plan view of the magnetic flux concentrator member.

(Aspect 5)

The magnetic sensor according to the aspect 1 or 2, wherein an angle between the lower base of the magnetic flux concentrator member and an oblique side of the magnetic flux concentrator member oblique to a vertical direction to the surface of the substrate is equal to or larger than 70 degrees and smaller than 90 degrees in the cross sectional view perpendicular to the surface of the substrate and perpendicular to the longitudinal direction of the magnetic flux concentrator member.

(Aspect 6)

The magnetic sensor according to any one of aspects 1 to 5, wherein the calculator is configured to calculate the magnetic field perpendicular to the plane of the substrate based on a difference between the output of the first magnetic detector and the output of the second magnetic detector.

(Aspect 7)

The magnetic sensor according to any one of aspects 1 to 6, wherein a center line of the magnetic flux concentrator member in a lateral direction is a line passing through a center point of the magnetic flux concentrator member and extending in the lateral direction of the magnetic flux concentrator member in plan view, a center line of the magnetic flux concentrator member in the longitudinal direction is a line passing through the center point of the magnetic flux concentrator member and extending in the longitudinal direction of the magnetic flux concentrator member in plan view, center lines of the first and second magnetic detectors in a lateral direction are lines passing through center points of the first and second magnetic detectors, respectively, and extending in the lateral direction of the first and second magnetic detectors in plan view, center lines of the first and second magnetic detectors in a longitudinal direction are lines passing through the center points of the first and second magnetic detectors, respectively, and extending in the longitudinal direction of the first and second magnetic detectors in plan view, the center line of the magnetic flux concentrator member in the lateral direction is arranged so as to intersect with portions of the first and second magnetic detectors in plan view of the detection unit, and a virtual line connecting the center points of the first and second magnetic detectors is perpendicular to the center line of the magnetic flux concentrator member in the longitudinal direction.

(Aspect 8)

The magnetic sensor according to the aspect 7, wherein the center line of the magnetic flux concentrator member in the longitudinal direction and the center lines of the first and second magnetic detectors in the longitudinal direction are arranged to be parallel to one another, and the center lines of the first and second magnetic detectors in the lateral direction and the center line of the magnetic flux concentrator member in the lateral direction are arranged so as to coincide with one another.

(Aspect 9)

The magnetic sensor according to any one of aspects 1 to 8, wherein the detection unit includes a first magnetic flux concentrator member arranged adjacent to the first magnetic detector and a second magnetic flux concentrator member arranged adjacent to the second magnetic detector, and the first magnetic detector and the second magnetic detector are arranged at sides opposing to each other of the first and second magnetic flux concentrator members, or at back sides of the first and second magnetic flux concentrator members.

(Aspect 10)

The magnetic sensor according to the aspect 9, wherein center lines of the first and second magnetic flux concentrator members in a lateral direction are lines passing through center points of the first and second magnetic flux concentrator members, respectively, and extending in the lateral direction of the first and second magnetic flux concentrator members in plan view, center lines of the first and second magnetic flux concentrator members in the longitudinal direction are lines passing through the center points of the first and second magnetic flux concentrator members, respectively, and extending in the longitudinal direction of the first and second magnetic flux concentrator members in plan view, center lines of the first and second magnetic detectors in a lateral direction are lines passing through center points of the first and second magnetic detectors, respectively, and extending in the lateral direction of the first and second magnetic detectors in plan view, center lines of the first and second magnetic detectors in a longitudinal direction are lines passing through the center points of the first and second magnetic detectors, respectively, and extending in the longitudinal direction of the first and second magnetic detectors in plan view, a virtual straight line connecting the center points of the first and second magnetic flux concentrator members are arranged so as to intersect with portions of the first and second magnetic detectors in plan view of the detection unit, and a virtual line connecting the center points of the first and second magnetic detectors is perpendicular to the center lines of the first and second magnetic flux concentrator members in the longitudinal direction.

(Aspect 11)

The magnetic sensor according to the aspect 10, wherein the center lines of the first and second magnetic detectors in the longitudinal direction are sandwiched between the center lines of the first and second magnetic flux concentrator members in the longitudinal direction.

(Aspect 12)

The magnetic sensor according to the aspect 10, wherein the center lines of the first and second magnetic flux concentrator members in the longitudinal direction in the longitudinal direction are sandwiched between the center lines of the first and second magnetic detectors.

(Aspect 13)

The magnetic sensor according to any one of aspects 1 to 12, wherein a sensitivity axis of the first and second magnetic detectors is set to be closest to an axis in a lateral direction of the magnetic flux concentrator member in plan view of the detection unit, out of an axis perpendicular to the surface of the substrate, an axis in the longitudinal direction of the magnetic flux concentrator member in plan view of the detection unit, and the axis in the lateral direction of the magnetic flux concentrator member in plan view of the detection unit.

(Aspect 14)

The magnetic sensor according to any one of aspects 1 to 13, wherein the magnetic flux concentrator member overlaps with portions of the first and second magnetic detectors in plan view of the plane of the substrate.

(Aspect 15)

The magnetic sensor according to the aspect 14, wherein an edge portion on a right side of the first magnetic detector extending in a longitudinal direction thereof is arranged so as to overlap with only an edge portion on a left side of the magnetic flux concentrator member extending in the longitudinal direction thereof, and an edge portion on a left side of the second magnetic detector extending in a longitudinal direction thereof is arranged so as to overlap with only an edge portion on a right side of the magnetic flux concentrator member extending in the longitudinal direction thereof.

(Aspect 16)

The magnetic sensor according to the aspect 14, wherein an edge portion on a left side of the first magnetic detector extending in a longitudinal direction thereof is arranged so as to overlap with only an edge portion on a right side of the first magnetic flux concentrator member extending in a longitudinal direction thereof, and an edge portion on a right side of the second magnetic detector extending in a longitudinal direction thereof is arranged so as to overlap with only an edge portion on a left side of the second magnetic flux concentrator member extending in a longitudinal direction thereof.

(Aspect 17)

The magnetic sensor according to the aspect 14, wherein an edge portion on a right side of the first magnetic detector extending in a longitudinal direction thereof is arranged so as to overlap with only an edge portion on a left side of the first magnetic flux concentrator member extending in a longitudinal direction thereof, and an edge portion on a left side of the second magnetic detector extending in a longitudinal direction thereof is arranged so as to overlap with only an edge portion on a right side of the second magnetic flux concentrator member extending in a longitudinal direction thereof.

(Aspect 18)

The magnetic sensor according to any one of aspects 10 to 17, wherein center lines of the first and second magnetic flux concentrator members in a lateral direction are lines passing through center points of the first and second magnetic flux concentrator members, respectively, and extending in the lateral direction of the first and second magnetic flux concentrator members in plan view, center lines of the first and second magnetic flux concentrator members in the longitudinal direction are lines passing through the center points of the first and second magnetic flux concentrator members, respectively, and extending in the longitudinal direction of the first and second magnetic flux concentrator members in plan view, center lines of the first and second magnetic detectors in the lateral direction are lines passing through center points of the first and second magnetic detectors, respectively, and extending in the lateral direction of the first and second magnetic detectors in plan view, center lines of the first and second magnetic detectors in the longitudinal direction are lines passing through the center points of the first and second magnetic detectors, respectively, and extending in the longitudinal direction of the first and second magnetic detectors in plan view, the center lines of the first and second magnetic detectors in the longitudinal direction and the center lines of the first and second magnetic flux concentrator members in the longitudinal direction are arranged to be parallel to one another, and the center lines of the first and second magnetic detectors in the lateral direction and the center lines of the first and second magnetic flux concentrator members in the lateral direction are arranged so as to coincide with to one another.

(Aspect 19)

The magnetic sensor according to any one of aspects 1 to 18, wherein the magnetic flux concentrator members has a rectangular shape or an ellipse shape in plan view of the plane of the substrate.

It is to be noted that, also in the first to seventh embodiments, the magnetic flux concentrator member may be formed such that the cross sectional shape thereof is the inverted taper shape or the forward tapered shape similarly to the eighth to thirteenth embodiments described above, and the first and second magnetic detectors 21 and 22 may be arranged at positions closer to the obtuse angle portions than to the acute angle portions of the first and second magnetic flux concentrator members 35 and 36, respectively. Such a configuration can also obtain the same operation and effect as those of the eighth to thirteenth embodiments.

In addition, in each of the embodiments, for example, in the first to third embodiments, there is described a case in which three or five magnetic detectors are provided for one magnetic flux concentrator member, however, the present invention is not limited thereto. A configuration illustrated in FIG. 31A, for example, in which five magnetic detectors are provided for one magnetic flux concentrator member is equivalent to a configuration illustrated in FIG. 31B in which the five magnetic detectors are provided for five magnetic flux concentrator members, respectively. Therefore, as illustrated in FIG. 31B, an individual magnetic flux concentrator member may be provided for each of the five magnetic detectors that are associated with one magnetic flux concentrator member illustrated in FIG. 31A, that is, the magnetic detector may be provided for each magnetic flux concentrator member such that the positional relations between the magnetic detectors and the magnetic flux concentrator members do not change, as illustrated in FIGS. 31A and 31B. Such a configuration can also obtain the same operation and effect as those of the embodiments described above. In addition, the number of the magnetic flux concentrator members does not have to be equal to the number of the magnetic sensors. For example, plural (such as two, three, or four) magnetic flux concentrator members may be provided and five magnetic detectors may be arranged at the plural magnetic flux concentrator members in a distributed manner. That is to say, one or more magnetic detectors may be provided at each of the plural magnetic flux concentrator members. Similarly, the plural magnetic flux concentrator members may be provided in the fourth to tenth embodiments, and one or more magnetic detectors may be arranged at each of the plural magnetic flux concentrator members in a distributed manner.

In addition, the magnetic flux concentrator member is rectangular in the second to thirteenth embodiments, however the magnetic flux concentrator member is not limited to a rectangular shape. The magnetic flux concentrator member may have a shape of curve as illustrated in FIG. 5, such as an ellipse or the like.

It is to be noted that the scope of the present invention is not limited by exemplary embodiments illustrated and described, any embodiments that have advantageous effects equivalent to those intended by the present invention fall within the scope of the present invention. Furthermore, the scope of the present invention can be defined by any desired combinations of particular ones among all the features disclosed.

INDUSTRIAL APPLICABILITY

According to one embodiment of the present invention, it is possible to obtain a small magnetic sensor capable of calculating the magnetic field in the direction of the second axis perpendicular to the first axis and the magnetic field in the direction of the third axis perpendicular to the first axis and the second axis, when the direction of the sensitive axis of the magnetic detector is the direction of the first axis.

The magnetic sensor and the magnetic detecting method according some embodiments of the present invention are suitable for a device required to independently detect three-axis components magnetic field.

REFERENCE SIGNS LIST 1 antiferromagnetic layer
2 pinned layer (fixed layer)
3 Cu layer (spacer layer)
4 free layer (free rotation layer)
11, 16 insulating film
12 free layer (free rotation layer)
13 conductive layer
14 pinned layer (fixed layer)
15 antiferromagnetic layer
21 to 26 first to sixth magnetic detectors
21a to 25a first to fifth magnetic detectors
21b to 25b first to fifth magnetic detectors
21c to 25c first to fifth magnetic detectors
21d to 24d first to fourth magnetic detectors
30, 30a, 30b magnetic flux concentrator member
31 to 36 magnetic flux concentrator member
35a, 36a base of magnetic flux concentrator member
35b, 36b oblique side of magnetic flux concentrator member
40 substrate
41 substrate surface
50 calculator
101 to 110 magnetic sensor
300 to 303 magnetic flux concentrator unit

The invention claimed is:

1. A magnetic sensor comprising:
a magnetic flux concentrator unit including one or more magnetic flux concentrator members provided on or in a substrate;
a first magnetic detector, a second magnetic detector, and a third magnetic detector, each of which is arranged adjacent to the one or more magnetic flux concentrator members and has a sensitivity axis in a direction of a common first axis parallel to a plane of the substrate; and
a calculator configured to calculate a magnetic field in a direction of a second axis parallel to the plane of the substrate and perpendicular to the first axis and a magnetic field in a direction of a third axis perpendicular to the plane of the substrate based on an output of the first magnetic detector, an output of the second magnetic detector, and an output of the third magnetic detector, the second axis and the third axis being common to the first, second, and third magnetic detectors,
wherein, a shape of each of the one or more magnetic flux concentrator members has a width in the direction of the first axis and a length in the direction of the second axis in plan view,
one of directions along the first axis is a positive direction of the first axis and the other direction is a negative direction of the first axis, and one of directions along the second axis is a positive direction of the second axis and the other direction is a negative direction of the second axis,
the first magnetic detector is arranged on a negative side of the first axis with respect to a closest magnetic flux concentrator member to the first magnetic detector out of the one or more magnetic flux concentrator members and on a positive side of the second axis with respect to a midpoint of the closest magnetic flux concentrator member to the first magnetic detector in a length direction, in plan view,
the second magnetic detector is arranged on a positive side of the first axis with respect to a closest magnetic flux concentrator member to the second magnetic detector out of the one or more magnetic flux concentrator members and on the positive side of the second axis with respect to a midpoint of the closest magnetic flux concentrator member to the second magnetic detector in the length direction, in plan view, the third magnetic detector is arranged on the negative side of the first axis with respect to a closest magnetic flux concentrator member to the third magnetic detector out of the one or more magnetic flux concentrator members and on a negative side of the second axis with respect to a midpoint of the closest magnetic flux concentrator member to the third magnetic detector in the length direction, in plan view, and the calculator is configured to calculate the magnetic field in the direction of the second axis based on the output of the first magnetic detector and the output of the third magnetic detector, and to calculate the magnetic field in the direction of the third axis based on the output of the second magnetic detector and the output of the third magnetic detector.

2. The magnetic sensor according to claim 1, wherein each of the one or more magnetic flux concentrator members has a rectangular shape or an ellipse shape in plan view, and has the length in the direction of the second axis longer than the width in the direction of the first axis.

3. The magnetic sensor according to claim 1, wherein the closest magnetic flux concentrator member to the first magnetic detector, the closest magnetic flux concentrator member to the second magnetic detector, and the closest magnetic flux concentrator member to the third magnetic detector are a common magnetic flux concentrator member.

4. The magnetic sensor according to claim 1, wherein the closest magnetic flux concentrator member to the first magnetic detector, the closest magnetic flux concentrator member to the second magnetic detector, and the closest magnetic flux concentrator member to the third magnetic detector are different from one another.

5. A magnetic sensor comprising:
    a magnetic flux concentrator unit including one or more magnetic flux concentrator members provided on or in a substrate;
    a first magnetic detector, a second magnetic detector, and a third magnetic detector, each of which is arranged adjacent to the one or more magnetic flux concentrator members and has a sensitivity axis in a direction of a first axis parallel to a plane of the substrate; and
    a calculator configured to calculate a magnetic field in a direction of a second axis parallel to the plane of the substrate and perpendicular to the first axis and a magnetic field in a direction of a third axis perpendicular to the plane of the substrate based on an output of the first magnetic detector, an output of the second magnetic detector, and an output of the third magnetic detector,
    wherein, a shape of each of the one or more magnetic flux concentrator members has a width in the direction of the first axis and a length in the direction of the second axis in plan view,
    one of directions along the first axis is a positive direction of the first axis and the other direction is a negative direction of the first axis, and one of directions along the second axis is a positive direction of the second axis and the other direction is a negative direction of the second axis,
    the first magnetic detector is arranged on a negative side of the first axis with respect to a closest magnetic flux concentrator member to the first magnetic detector out of the one or more magnetic flux concentrator members and on a positive side of the second axis with respect to a midpoint of the closest magnetic flux concentrator member to the first magnetic detector in a length direction, in plan view, the second magnetic detector is arranged on a positive side of the first axis with respect to a closest magnetic flux concentrator member to the second magnetic detector out of the one or more magnetic flux concentrator members and on the positive side of the second axis with respect to a midpoint of the closest magnetic flux concentrator member to the second magnetic detector in the length direction, in plan view, the third magnetic detector is arranged on the negative side of the first axis with respect to a closest magnetic flux concentrator member to the third magnetic detector out of the one or more magnetic flux concentrator members and on a negative side of the second axis with respect to a midpoint of the closest magnetic flux concentrator member to the third magnetic detector in the length direction, in plan view, and the calculator is configured to calculate the magnetic field in the direction of the second axis based on the output of the first magnetic detector and the output of the third magnetic detector, and to calculate the magnetic field in the direction of the third axis based on the output of the second magnetic detector and the output of the third magnetic detector, wherein the magnetic sensor further comprises a fifth magnetic detector whole of which overlaps with one of the one or more magnetic flux concentrator members in plan view of the substrate, and wherein the calculator is configured to calculate a magnetic field in the direction of the first axis based on the output of the first magnetic detector, the output of the second magnetic detector, and an output of the fifth magnetic detector.

6. The magnetic sensor according to claim 1, further comprising a fourth magnetic detector arranged adjacent to the one or more magnetic flux concentrator members and has a sensitivity axis in the direction of the first axis parallel to the plane of the substrate, wherein
    the fourth magnetic detector is arranged on the positive side of the first axis with respect to a closest magnetic flux concentrator member to the fourth magnetic detector out of the one or more magnetic flux concentrator members and on the negative side of the second axis with respect to a midpoint of the closest magnetic flux concentrator member to the fourth magnetic detector in the length direction, in plan view, and
    the calculator is configured to calculate the magnetic field in the direction of the second axis based on the output of the first magnetic detector and the output of the third magnetic detector, or based on the output of the second magnetic detector and an output of the fourth magnetic detector, and to calculate the magnetic field in the direction of the third axis based on the output of the second magnetic detector and the output of the third magnetic detector, or based on the output of the first magnetic detector and the output of the fourth magnetic detector.

7. The magnetic sensor according to claim 6, wherein
    the closest magnetic flux concentrator member to the first magnetic detector, the closest magnetic flux concentrator member to the second magnetic detector, the closest magnetic flux concentrator member to the third magnetic detector, and the closest magnetic flux concentrator member to the fourth magnetic detector are a common magnetic flux concentrator member, and
    the first to the fourth magnetic detectors are arranged to be point-symmetric and axisymmetric in plan view.

8. The magnetic sensor according to claim 6, wherein among four members of the closest magnetic flux concentrator member to the first magnetic detector, the closest magnetic flux concentrator member to the second magnetic detector, the closest magnetic flux concentrator member to the third magnetic detector, and the closest magnetic flux concentrator member to the fourth magnetic detector, two members are a first common magnetic flux concentrator member, and the other two members are a second common magnetic flux concentrator member.

9. The magnetic sensor according to claim 6, wherein the closest magnetic flux concentrator member to the first magnetic detector, the closest magnetic flux concentrator member to the second magnetic detector, the closest magnetic flux concentrator member to the third magnetic detector, and the closest magnetic flux concentrator member to the fourth magnetic detector are different from one another.

10. The magnetic sensor according to claim 6, wherein the first to the fourth magnetic detectors are arranged in the length direction of the one or more magnetic flux concentrator members and portions of the first to the fourth magnetic detectors overlap with the one or more magnetic flux concentrator members, in plan view of the substrate.

11. A magnetic sensor comprising:
a magnetic flux concentrator unit including one or more magnetic flux concentrator members provided on or in a substrate;
a first magnetic detector, a second magnetic detector, and a third magnetic detector, each of which is arranged adjacent to the one or more magnetic flux concentrator members and has a sensitivity axis in a direction of a first axis parallel to a plane of the substrate; and
a calculator configured to calculate a magnetic field in a direction of a second axis parallel to the plane of the substrate and perpendicular to the first axis and a magnetic field in a direction of a third axis perpendicular to the plane of the substrate based on an output of the first magnetic detector, an output of the second magnetic detector, and an output of the third magnetic detector,
wherein, a shape of each of the one or more magnetic flux concentrator members has a width in the direction of the first axis and a length in the direction of the second axis in plan view,
one of directions along the first axis is a positive direction of the first axis and the other direction is a negative direction of the first axis, and one of directions along the second axis is a positive direction of the second axis and the other direction is a negative direction of the second axis,
the first magnetic detector is arranged on a negative side of the first axis with respect to a closest magnetic flux concentrator member to the first magnetic detector out of the one or more magnetic flux concentrator members and on a positive side of the second axis with respect to a midpoint of the closest magnetic flux concentrator member to the first magnetic detector in a length direction, in plan view,
the second magnetic detector is arranged on a positive side of the first axis with respect to a closest magnetic flux concentrator member to the second magnetic detector out of the one or more magnetic flux concentrator members and on the positive side of the second axis with respect to a midpoint of the closest magnetic flux concentrator member to the second magnetic detector in the length direction, in plan view, the third magnetic detector is arranged on the negative side of the first axis with respect to a closest magnetic flux concentrator member to the third magnetic detector out of the one or more magnetic flux concentrator members and on a negative side of the second axis with respect to a midpoint of the closest magnetic flux concentrator member to the third magnetic detector in the length direction, in plan view, and
the calculator is configured to calculate the magnetic field in the direction of the second axis based on the output of the first magnetic detector and the output of the third magnetic detector, and to calculate the magnetic field in the direction of the third axis based on the output of the second magnetic detector and the output of the third magnetic detector,
wherein the magnetic sensor further comprises a fifth magnetic detector whole of which overlaps with one of the one or more magnetic flux concentrator members in plan view of the substrate, and
wherein the calculator is configured to calculate a magnetic field in the direction of the first axis based on the output of the first magnetic detector, the output of the second magnetic detector and an output of the fifth magnetic detector, or based on the output of the third magnetic detector, the output of the fourth magnetic detector, and the output of the fifth magnetic detector.

12. The magnetic sensor according to claim 11, wherein the first to the fifth magnetic detectors are magnetoresistance effect elements.

13. The magnetic sensor according to claim 1, wherein a shape of a side surface of each of the one or more magnetic flux concentrator members is a forward tapered shape or an inverted taper shape in a cross sectional view of the each of the one or more magnetic flux concentrator members perpendicular to the plane of the substrate and perpendicular to the length direction of the each of the one or more magnetic flux concentrator members, and
each of the first to the third magnetic detector is arranged closer to an obtuse angle portion than to an acute angle portion of any of the one or more magnetic flux concentrator members.

14. The magnetic sensor according to claim 13, wherein the shape of the side surface of each of the one or more magnetic flux concentrator members is the inverted taper shape in the cross sectional view of the each of the one or more magnetic flux concentrator members perpendicular to the plane of the substrate and perpendicular to the length direction of the each of the one or more magnetic flux concentrator members, and
an oblique side of the each of the one of more magnetic flux concentrator members oblique to a vertical direction to the surface of the substrate makes an angle larger than 90 degrees and equal to or smaller than 110 degrees.

15. The magnetic sensor according to claim 13, wherein the shape of the side surface of the each of the one or more magnetic flux concentrator members is the forward tapered shape in the cross sectional view of the each of the one or more magnetic flux concentrator members perpendicular to the plane of the substrate and perpendicular to the length direction of the each of the one or more magnetic flux concentrator members, and
an oblique side of the each of the one of more magnetic flux concentrator members oblique to a vertical direction to the surface of the substrate makes an angle equal to or larger than 70 degrees and smaller than 90 degrees.

* * * * *